US010050060B2

(12) United States Patent
Miyairi et al.

(10) Patent No.: US 10,050,060 B2
(45) Date of Patent: *Aug. 14, 2018

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventors: Hidekazu Miyairi, Kanagawa (JP); Yuichi Sato, Kanagawa (JP); Yuji Asano, Kanagawa (JP); Tetsunori Maruyama, Kanagawa (JP); Tatsuya Onuki, Kanagawa (JP); Shuhei Nagatsuka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/591,145

(22) Filed: May 10, 2017

(65) Prior Publication Data

US 2017/0243899 A1  Aug. 24, 2017

Related U.S. Application Data

(63) Continuation of application No. 15/072,076, filed on Mar. 16, 2016, now Pat. No. 9,653,479.

(30) Foreign Application Priority Data

Mar. 19, 2015 (JP) ................... 2015-055720
Apr. 15, 2015 (JP) ................... 2015-083272

(51) Int. Cl.
*H01L 27/12* (2006.01)
*H01L 29/78* (2006.01)
(Continued)

(52) U.S. Cl.
CPC .... *H01L 27/1225* (2013.01); *H01L 21/76807* (2013.01); *H01L 21/76826* (2013.01);
(Continued)

(58) Field of Classification Search
CPC ..... H01L 29/78; H01L 29/786; H01L 29/786; H01L 29/7869; H01L 29/78603;
(Continued)

(56) References Cited

U.S. PATENT DOCUMENTS 5,282,162 A   1/1994  Ochii
5,731,856 A   3/1998  Kim et al.
(Continued)

FOREIGN PATENT DOCUMENTS

EP    1737044 A    12/2006
EP    2226847 A     9/2010
(Continued)

OTHER PUBLICATIONS

Berthelot.A et al., "Highly Reliable TiN/ZrO2/TiN 3D Stacked Capacitors for 45 nm Embedded DRAM Technologies", Proceeding of 36th European Solid-State Device Research Conference 2006, Sep. 19, 2006, pp. 343-346.
(Continued)

*Primary Examiner* — Monica D Harrison
(74) *Attorney, Agent, or Firm* — Fish & Richardson P.C.

(57) ABSTRACT

To provide a semiconductor device with excellent electrical characteristics or a semiconductor device with stable electrical characteristics. A semiconductor device includes a first transistor, a second transistor, a first insulator, a second insulator, a first wiring, and a first plug. The first transistor includes silicon. The second transistor includes an oxide semiconductor. The first insulator is located over the first transistor. The second insulator is located over the first insulator. The second transistor is located over the second
(Continued)

insulator. The first wiring is located over the second insulator and the first plug. The first transistor and the second transistor are electrically connected to each other through the first wiring and the first plug. The first wiring has low hydrogen permeability. The hydrogen permeability of the second insulator is lower than the hydrogen permeability of the first insulator.

14 Claims, 69 Drawing Sheets

(51) Int. Cl.
  *H01L 23/48* (2006.01)
  *H01L 23/485* (2006.01)
  *H01L 23/522* (2006.01)
  *H01L 23/532* (2006.01)
  *H01L 27/06* (2006.01)
  *H01L 29/786* (2006.01)
  *H01L 21/768* (2006.01)
  *H01L 21/8258* (2006.01)

(52) U.S. Cl.
  CPC .. *H01L 21/76829* (2013.01); *H01L 21/76831* (2013.01); *H01L 21/8258* (2013.01); *H01L 23/481* (2013.01); *H01L 23/485* (2013.01); *H01L 23/5223* (2013.01); *H01L 23/53238* (2013.01); *H01L 23/53295* (2013.01); *H01L 27/0688* (2013.01); *H01L 27/124* (2013.01); *H01L 29/7869* (2013.01); *H01L 29/78603* (2013.01)

(58) Field of Classification Search
  CPC ... H01L 27/06; H01L 27/068; H01L 27/0688; H01L 27/12; H01L 27/124; H01L 27/122; H01L 27/1225; H01L 23/48; H01L 23/481; H01L 23/485; H01L 23/52; H01L 23/522; H01L 23/5223; H01L 23/53; H01L 23/532; H01L 23/5323; H01L 23/53238; H01L 23/5329; H01L 23/53295; H01L 21/76; H01L 21/768; H01L 21/768; H01L 21/76807; H01L 21/7682; H01L 21/76826; H01L 21/76829; H01L 21/76831; H01L 21/82; H01L 21/825; H01L 21/8258
  USPC .......................................................... 257/43
  See application file for complete search history.

(56) References Cited

U.S. PATENT DOCUMENTS

| | | |
|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,093,136 B2 | 1/2012 | Endo et al. |
| 8,158,975 B2 | 4/2012 | Akimoto |
| 8,183,630 B2 | 5/2012 | Batude et al. |
| 8,264,083 B2 | 9/2012 | Nawata et al. |
| 8,314,637 B2 | 11/2012 | Kato et al. |
| 8,389,417 B2 | 3/2013 | Yamazaki et al. |
| 8,415,731 B2 | 4/2013 | Yamazaki et al. |
| 8,432,187 B2 | 4/2013 | Kato et al. |
| 8,502,216 B2 | 8/2013 | Akimoto et al. |
| 8,519,990 B2 | 8/2013 | Yamazaki et al. |
| 8,541,266 B2 | 9/2013 | Yamazaki |
| 8,547,771 B2 | 10/2013 | Koyama |
| 8,575,985 B2 | 11/2013 | Ohmaru et al. |
| 8,659,957 B2 | 2/2014 | Sekine |
| 8,709,922 B2 | 4/2014 | Koezuka et al. |
| 8,753,928 B2 | 6/2014 | Yamazaki et al. |
| 8,773,906 B2 | 7/2014 | Ohmaru |
| 8,785,258 B2 | 7/2014 | Yamazaki |
| 8,809,853 B2 | 8/2014 | Saito et al. |
| 8,828,794 B2 | 9/2014 | Yamazaki et al. |
| 8,837,203 B2 | 9/2014 | Shionoiri et al. |
| 8,878,173 B2 | 11/2014 | Yamazaki |
| 8,901,554 B2 | 12/2014 | Sasagawa et al. |
| 8,937,304 B2 | 1/2015 | Fujita et al. |
| 8,941,958 B2 | 1/2015 | Tomatsu |
| 8,956,912 B2 | 2/2015 | Yamazaki |
| 8,969,182 B2 | 3/2015 | Koezuka et al. |
| 9,048,321 B2 | 6/2015 | Kurata et al. |
| 9,111,795 B2 | 8/2015 | Ieda et al. |
| 9,112,036 B2 | 8/2015 | Koezuka et al. |
| 9,136,297 B2 | 9/2015 | Kurokawa |
| 9,252,279 B2 | 2/2016 | Watanabe et al. |
| 9,287,405 B2 | 3/2016 | Sasagawa et al. |
| 9,385,238 B2 | 7/2016 | Yamazaki |
| 9,502,572 B2 | 11/2016 | Yamazaki |
| 9,653,479 B2 * | 5/2017 | Miyairi ............... H01L 27/1207 |
| 9,728,559 B2 | 8/2017 | Miyairi et al. |
| 9,831,238 B2 | 11/2017 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |

(56) References Cited

U.S. PATENT DOCUMENTS

| | | |
|---|---|---|
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0294822 A1 | 12/2009 | Batude et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0227143 A1 | 9/2011 | Lee et al. |
| 2011/0248270 A1 | 10/2011 | Fukumoto et al. |
| 2012/0170355 A1 | 7/2012 | Ohmaru et al. |
| 2012/0258575 A1 | 10/2012 | Sato et al. |
| 2012/0293202 A1 | 11/2012 | Nishijima et al. |
| 2013/0020570 A1 | 1/2013 | Yamazaki |
| 2013/0048977 A1 | 2/2013 | Watanabe et al. |
| 2013/0069132 A1 | 3/2013 | Atsumi et al. |
| 2013/0140569 A1 | 6/2013 | Yoneda et al. |
| 2013/0193433 A1 | 8/2013 | Yamazaki |
| 2013/0234131 A1 | 9/2013 | Tanaka et al. |
| 2013/0270552 A1 | 10/2013 | Yamazaki et al. |
| 2013/0299818 A1 | 11/2013 | Tanaka |
| 2013/0320330 A1 | 12/2013 | Yamazaki |
| 2014/0004656 A1 | 1/2014 | Sasagawa et al. |
| 2014/0048802 A1 | 2/2014 | Ohmaru et al. |
| 2014/0325249 A1 | 10/2014 | Toyotaka |
| 2014/0326992 A1 | 11/2014 | Hondo et al. |
| 2014/0326994 A1 | 11/2014 | Tanaka |
| 2014/0332800 A1 | 11/2014 | Hanaoka |
| 2015/0108470 A1 | 4/2015 | Yamazaki et al. |
| 2015/0187823 A1 | 7/2015 | Miyairi et al. |
| 2015/0214256 A1 | 7/2015 | Miyairi |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 05-275613 A | 10/1993 |
| JP | 05-347360 A | 12/1993 |
| JP | 08-264794 A | 10/1996 |
| JP | 11-505377 | 5/1999 |
| JP | 2000-012686 A | 1/2000 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-200640 A | 7/2004 |
| JP | 2004-273614 A | 9/2004 |
| JP | 2004-273732 A | 9/2004 |
| JP | 2005-109063 A | 4/2005 |
| JP | 2007-096055 A | 4/2007 |
| JP | 2010-056227 A | 3/2010 |
| JP | 2010-062378 A | 3/2010 |
| JP | 2012-257187 A | 12/2012 |
| JP | 2013-110360 A | 6/2013 |
| JP | 2014-187378 A | 10/2014 |
| WO | WO-2004/114391 | 12/2004 |

OTHER PUBLICATIONS

Coates.D et al., "Optical Studies of the Amorphous Liquid-Cholesteric Liquid Crystal Transition: The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review A), May 1, 1984, vol. 29, No. 5, pp. 2957-5959.

Kimizuka.N. et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using Cg-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "Rfcpus on Glass and Plastic Substrates Fabricated by TFT Transfer Technology", IEDM 05: Technical Digest of International Electron Devices Meeting, Dec. 5, 2005, pp. 1067-1069.

(56) References Cited

OTHER PUBLICATIONS

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Takahashi.M et al., "Theoretical Analysis of Igzo Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display with Driver Circuit Using Amorphous In—Ga—Zn—Oxide TFTs", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission. AMOLED Display on Plastic Film and Its Bending Properties", SID Digest '09 : SID International Symposium Digest of Technical Papers, May 31, 2009, pp. 983-985.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, vol. 40, pp. 184-187.

Ohara.H et al., "21.3:4.0 in. QVGA AMOLED Display Using In—Ga—Zn—Oxide TFTs with a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor". Philosophical Magazine, 2001, vol. 81, No. 5, pp. 501-515.

Janotti.A et al., "Oxygen Vacancies in ZnO", Appl. Phys. Lett. (Applied Physics Letters) , 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

(56) References Cited

OTHER PUBLICATIONS

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

* cited by examiner

FIG. 46A
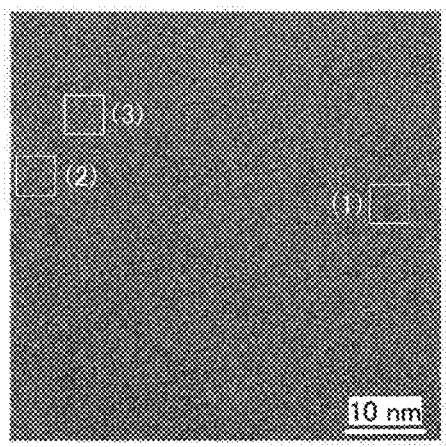
FIG. 46B    FIG. 46C    FIG. 46D
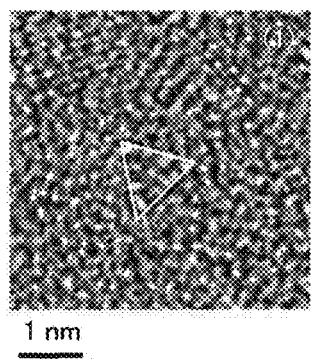 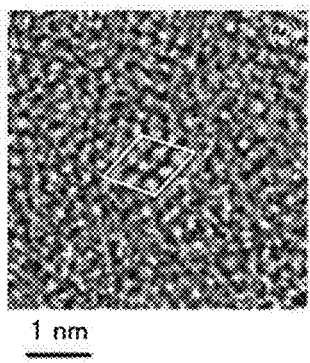 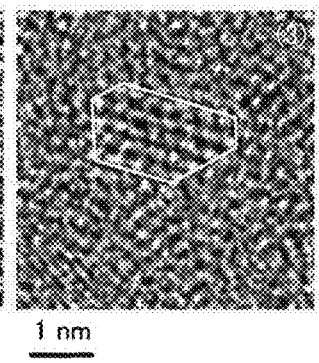

US 10,050,060 B2

SEMICONDUCTOR DEVICE AND ELECTRONIC DEVICE

CROSS-REFERENCE TO RELATED APPLICATIONS

This application is a continuation of U.S. application Ser. No. 15/072,076, filed Mar. 16, 2016, now allowed, which claims the benefit of foreign priority applications filed in Japan as Serial No. 2015-055720 on Mar. 19, 2015, and Serial No. 2015-083272 on Apr. 15, 2015, all of which are incorporated by reference.

BACKGROUND OF THE INVENTION

1. Field of the Invention

The present invention relates to an object, a method, or a manufacturing method. Further, the present invention relates to a process, a machine, manufacture, or a composition of matter. In particular, the present invention relates to, for example, an electrode, a device, a semiconductor, a semiconductor device, a display device, a light-emitting device, a lighting device, a power storage device, a mirror image device, a memory device, or a processor. The present invention relates to a method for manufacturing an electrode, a semiconductor, a semiconductor device, a display device, a light-emitting device, a lighting device, a power storage device, a mirror image device, a memory device, or a processor. The present invention relates to a method for driving an electrode, a semiconductor device, a display device, a light-emitting device, a lighting device, a power storage device, a mirror image device, a memory device, or a processor.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

2. Description of the Related Art

A technique in which a transistor is formed using a semiconductor material has attracted attention. The transistor is applied to a wide range of electronic devices such as an integrated circuit (IC) or an image display device (also simply referred to as a display device). As semiconductor materials applicable to the transistor, silicon-based semiconductor materials have been widely used, but oxide semiconductors have been attracting attention as alternative materials.

In recent years, demand for integrated circuits in which semiconductor elements such as miniaturized transistors are integrated with high density has risen with increased performance and reductions in the size and weight of electronic devices.

A transistor including an oxide semiconductor is known to have an extremely low leakage current in an off state. For example, a low-power-consumption CPU utilizing a characteristic of low leakage current of the transistor including an oxide semiconductor is disclosed (see Patent Document 1).

REFERENCE

Patent Document

[Patent Document 1] Japanese Published Patent Application No. 2012-257187

SUMMARY OF THE INVENTION

An object of one embodiment of the present invention is to provide a semiconductor device with excellent electrical characteristics. Another object of one embodiment of the present invention is to provide a semiconductor device with stable electrical characteristics. Another object of one embodiment of the present invention is to provide a method for embedding a conductor in an insulator. Another object of one embodiment of the present invention is to provide a miniaturized semiconductor device. Another object of one embodiment of the present invention is to provide a highly reliable semiconductor device. Another object of one embodiment of the present invention is to provide semiconductor devices with a high yield.

Another object of one embodiment of the present invention is to provide a method for manufacturing a miniaturized semiconductor device. Another object of one embodiment of the present invention is to provide a method for manufacturing a highly reliable device. Another object of one embodiment of the present invention is to provide a method for manufacturing devices with a high yield.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first transistor, a second transistor, a first insulator, a second insulator, a first wiring, and a first plug. The first transistor includes silicon. The second transistor includes an oxide semiconductor. The first insulator is located over the first transistor. The second insulator is located over the first insulator. The second transistor is located over the second insulator. The first wiring is located over the second insulator and the first plug. The first transistor and the second transistor are electrically connected to each other through the first wiring and the first plug. The first wiring has low hydrogen permeability. The hydrogen permeability of the second insulator is lower than the hydrogen permeability of the first insulator.

Another embodiment of the present invention is a semiconductor device including a first transistor, a second transistor, a first insulator, a second insulator, a first wiring, and a first plug. The first transistor includes silicon. The second transistor includes an oxide semiconductor. The first insulator is located over the first transistor. The second insulator is located over the first insulator. The second transistor is located over the second insulator. The first wiring is located over the second insulator and the first plug. The first transistor and the second transistor are electrically connected to each other through the first wiring and the first plug. The first wiring and the first plug have low hydrogen permeability. The hydrogen permeability of the second insulator is lower than the hydrogen permeability of the first insulator.

In the above embodiment, the first wiring preferably includes tantalum nitride. In the above embodiment, the first plug preferably includes tantalum nitride. In the above embodiment, at least one of the first wiring and the first plug preferably has low copper permeability.

In the above embodiment, at least one of the first wiring and the first plug preferably has a structure in which tantalum nitride and tantalum are stacked or a structure in which titanium nitride and tantalum are stacked.

In the above embodiment, the second insulator preferably includes at least one of aluminum oxide and hafnium oxide.

One embodiment of the present invention is an electronic device including at least one of the semiconductor devices according to the above-described embodiments.

One embodiment of the present invention can provide a semiconductor device with excellent electrical characteristics. One embodiment of the present invention can provide a semiconductor device with stable electrical characteristics. One embodiment of the present invention can provide a method for embedding a conductor in an insulator. One embodiment of the present invention can provide a miniaturized semiconductor device. One embodiment of the present invention can provide a highly reliable semiconductor device. One embodiment of the present invention can provide semiconductor devices with a high yield.

One embodiment of the present invention can provide a method for manufacturing a miniaturized semiconductor device. One embodiment of the present invention can provide a method for manufacturing a highly reliable device. One embodiment of the present invention can provide a method for manufacturing devices with a high yield.

Note that the description of these effects does not disturb the existence of other effects. One embodiment of the present invention does not necessarily have all the effects described above. Other effects will be apparent from and can be derived from the description of the specification, the drawings, the claims, and the like.

BRIEF DESCRIPTION OF THE DRAWINGS

FIGS. 46A to 46D are Cs-corrected high-resolution TEM images of a plane of a CAAC-OS.

DETAILED DESCRIPTION OF THE INVENTION

Figure 1:
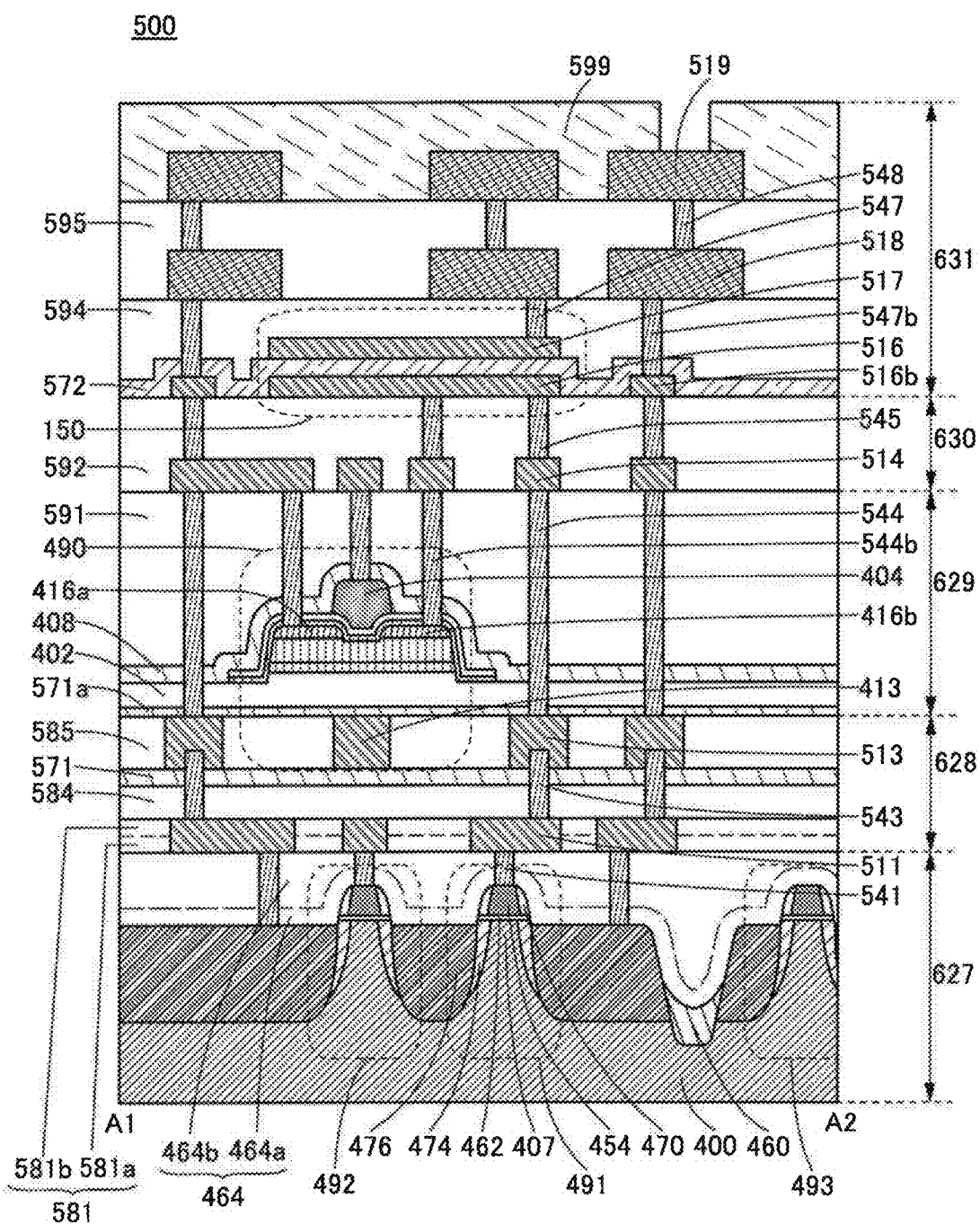
FIG. 1 is a cross-sectional view illustrating an example of a semiconductor device of one embodiment of the present invention.

Embodiments of the present invention will be described in detail with reference to the drawings. However, the present invention is not limited to the following description, and it is easily understood by those skilled in the art that modes and details disclosed herein can be modified in various ways. Furthermore, the present invention is not construed as being limited to description of the following embodiments. In describing structures of the invention with reference to the drawings, common reference numerals are used for the same portions in different drawings. Note that the same hatched pattern is applied to similar parts, and the similar parts are not especially denoted by reference numerals in some cases. In the case where the description of a component denoted by a different reference numeral is referred to, the description of the thickness, the composition, the structure, the shape, or the like of the component can be used as appropriate.

Note that the size, the thickness of films (layers), or regions in drawings is sometimes exaggerated for simplicity.

A voltage usually refers to a potential difference between a given potential and a reference potential (e.g., a source potential or a ground potential (GND)). A voltage can be referred to as a potential and vice versa. In general, a potential (a voltage) is a relative value and is determined depending on the difference relative to a reference potential. Therefore, even a "ground potential" is not necessarily 0 V. For example, in some cases, a "ground potential" is the lowest potential in a circuit. In other cases, a "ground potential" is a moderate potential in a circuit. In those cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 13 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes character- istics of the semiconductor include oxygen, Group 1 elements except hydrogen, Group 2 elements, Group 13 elements, and Group 15 elements.

Note that in this specification, the description "A has a shape such that an end portion extends beyond an end portion of B" may indicate, for example, the case where at least one of end portions of A is positioned on an outer side than at least one of end portions of B in a plan view or a cross-sectional view. Thus, the description "A has a shape such that an end portion extends beyond an end portion of B" can be read as the description "one end portion of A is positioned on an outer side than one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

In this specification, a term "semiconductor" can be referred to as an "oxide semiconductor." As the semiconductor, a Group 14 semiconductor such as silicon or germanium; a compound semiconductor such as silicon carbide, germanium silicide, gallium arsenide, indium phosphide, zinc selenide; or cadmium sulfide; or an organic semiconductor can be used.

In this specification, a device may refer to, for example, a semiconductor device, a display device, a light-emitting device, a lighting device, a power storage device, a mirror image device, a memory device, an electro-optical device, and the like.

(Embodiment 1)

In this embodiment, an example of a semiconductor device of one embodiment of the present invention is described.

[Semiconductor Device]

Figure 2:
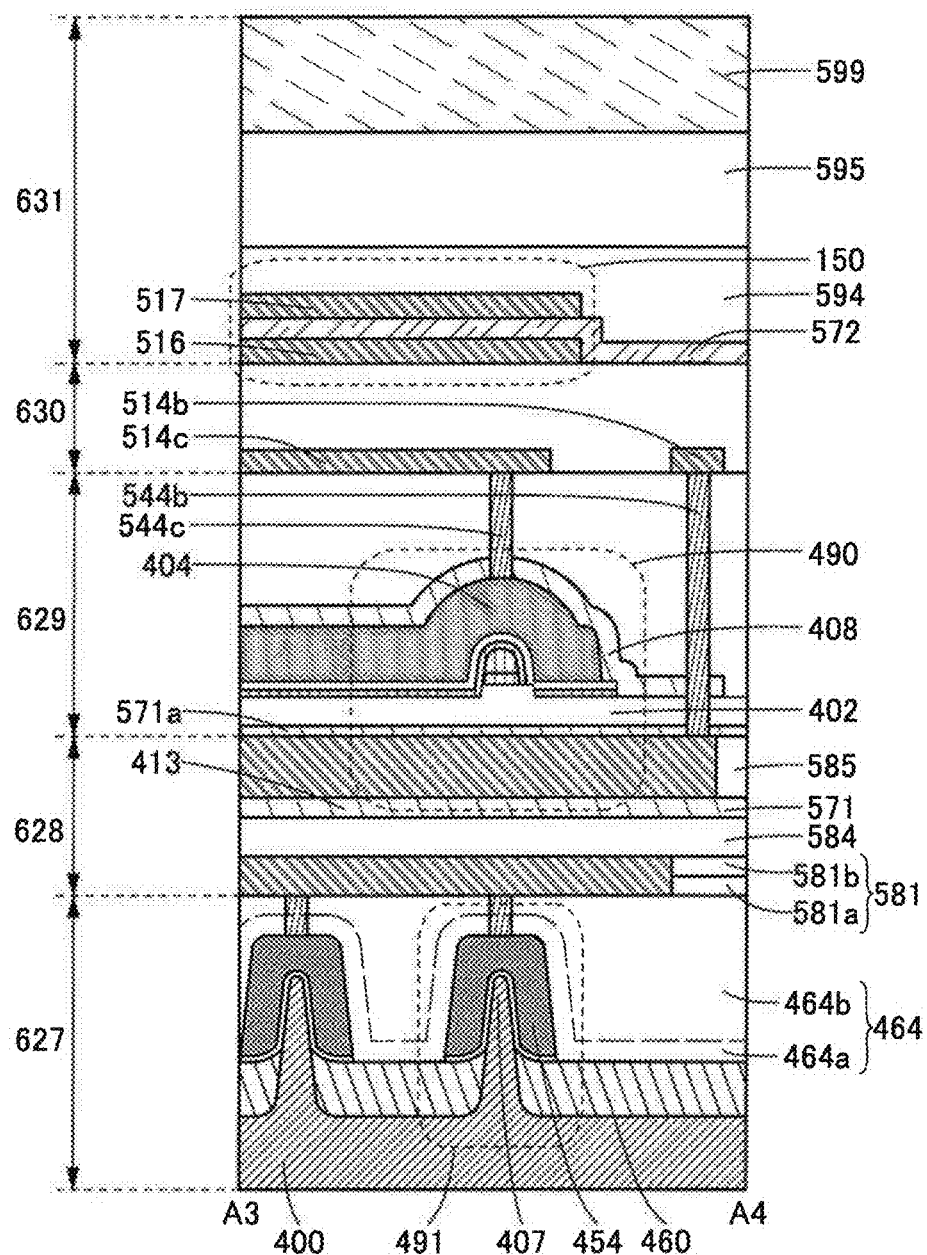
FIG. 2 is a cross-sectional view illustrating an example of a semiconductor device of one embodiment of the present invention.

FIG. 1 illustrates an example of a cross-sectional view of a semiconductor device 500. FIG. 2 illustrates an example of a cross section substantially perpendicular to the A1-A2 direction shown in FIG. 1. The semiconductor device 500 shown in FIG. 1 includes five layers, i.e., layers 627 to 631. The layer 627 includes transistors 491 to 493. The layer 629 includes a transistor 490.

<Layer 627>

The layer 627 includes a substrate 400, the transistors 491 to 493 over the substrate 400, an insulator 464 over the transistor 491 and the like, and plugs such as a plug 541. The plug 541 or the like is connected to, for example, a gate electrode, a source electrode, a drain electrode, or the like of the transistor 491 or the like. The plug 541 is preferably formed to be embedded in the insulator 464.

The details of the transistors 491 to 493 will be described later.

The insulator 464 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 464 can be formed by a sputtering method, a CVD method (including a thermal CVD method, an MOCVD method, a PECVD method, and the like), an MBE method, an ALD method, a PLD method, or the like. In particular, it is preferable that the insulator be formed by a CVD method, further preferably a plasma CVD method because coverage can be further improved. It is preferable to use a thermal CVD method, an MOCVD method, or an ALD method in order to reduce plasma damage.

Alternatively, the insulator 464 can be formed using silicon carbonitride, silicon oxycarbide, or the like. Further alternatively, undoped silicate glass (USG), boron phosphorus silicate glass (BPSG), borosilicate glass (BSG), or the like can be used. USG, BPSG, and the like may be formed by an atmospheric pressure CVD method. Alternatively, hydrogen silsesquioxane (HSQ) or the like may be applied by a coating method.

The insulator 464 may have a single-layer structure or a stacked-layer structure of a plurality of materials.

In FIG. 1, the insulator 464 is formed of two layers, i.e., an insulator 464a and an insulator 464b over the insulator 464a.

The insulator 464a is preferably formed over a region 476, a conductor 454, and the like of the transistor 491 with high adhesion or high coverage.

As an example of the insulator 464a, silicon nitride formed by a CVD method can be used. Here, the insulator 464a preferably contains hydrogen in some cases. When the insulator 464a contains hydrogen, a defect or the like in the substrate 400 is reduced and the characteristics of the transistor 491 and the like are improved in some cases. For example, in the case where the substrate 400 is formed using a material containing silicon, a defect such as a dangling bond in the silicon can be terminated by hydrogen.

The parasitic capacitance formed between a conductor under the insulator 464a, such as the conductor 454, and a conductor over the insulator 464b, such as a conductor 511, is preferably small. Thus, the insulator 464b preferably has a low dielectric constant. The dielectric constant of the insulator 464b is preferably lower than that of an insulator 462. The dielectric constant of the insulator 464b is preferably lower than that of the insulator 464a. For example, the relative dielectric constant of the insulator 464b is preferably lower than 4, more preferably lower than 3. For example, the relative dielectric constant of the insulator 464b is preferably 0.7 times or less that of the insulator 464a, more preferably 0.6 times or less that of the insulator 464a.

Here, for example, silicon nitride and USG can be used as the insulator 464a and the insulator 464b, respectively.

When the insulator 464a, an insulator 581a, and the like are formed using a material with low copper permeability, such as silicon nitride or silicon carbonitride, the diffusion of copper into a layer under the insulator 464a or the like and a layer over the insulator 581a or the like can be suppressed when copper is included in the conductor 511 or the like.

Figure 3A:
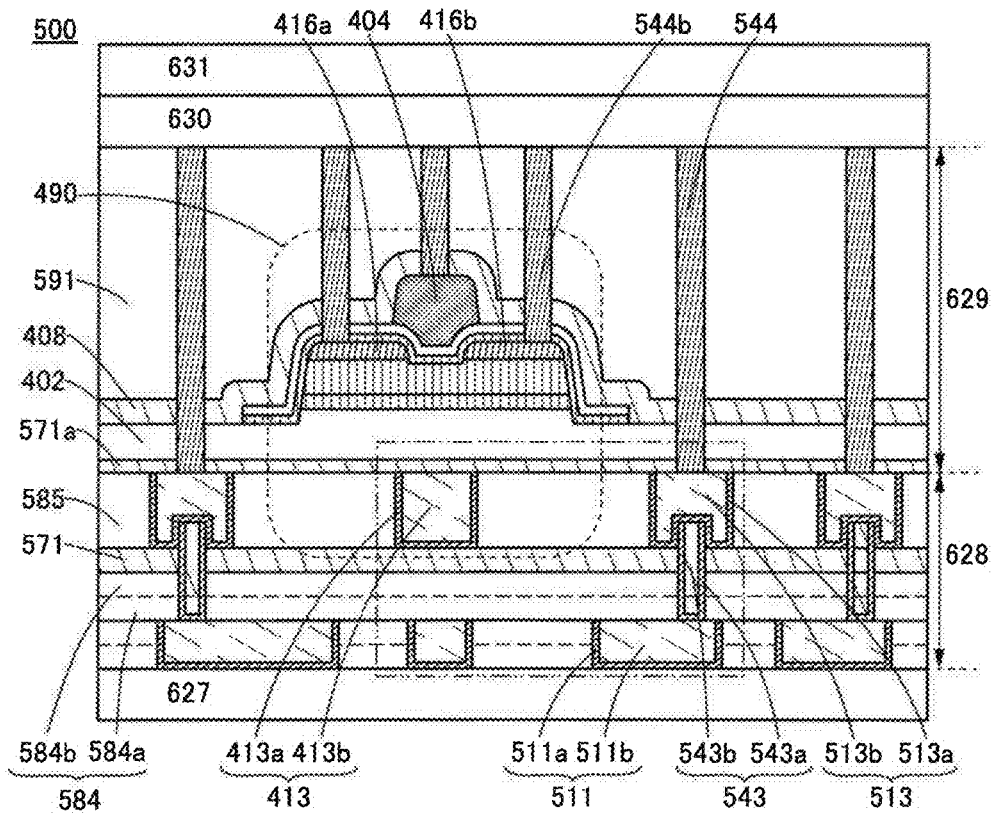
FIGS. 3A and 3B are cross-sectional views illustrating an example of a semiconductor device of one embodiment of the present invention.
Figure 3B:
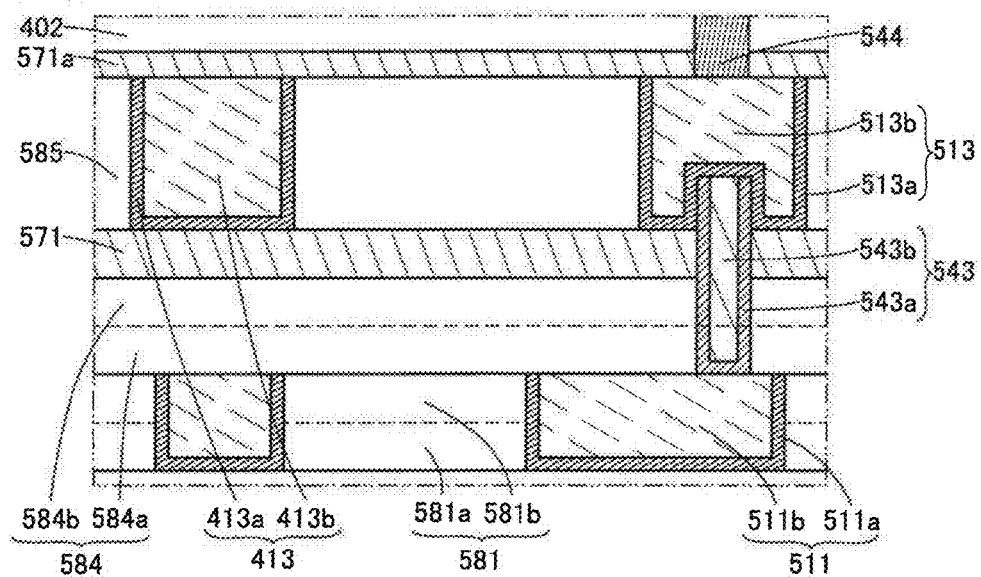

In the case where the conductor 511 has a stacked-layer structure of a conductor 511a and a conductor 511b as shown in FIGS. 3A and 3B and the like, an impurity such as copper released from a top surface of the conductor 511b not covered with the conductor 511a might be diffused into a layer over the conductor 511b through an insulator 584 or the like, for example. Thus, the insulator 584 over the conductor 511b is preferably formed using a material through which an impurity such as copper is hardly allowed to pass. For example, the insulator 584 has a stacked-layer structure of an insulator 584a and an insulator 584b over the insulator 584a as shown in FIGS. 3A and 3B to be referred to later, and the description of the insulator 581*a* and an insulator 581*b* is referred to for the insulator 584*a* and the insulator 584*b*.

<Layer 628>

The layer 628 includes an insulator 581, the insulator 584 over the insulator 581, an insulator 571 over the insulator 584, an insulator 585 over the insulator 571, the conductor 511 and the like over the insulator 464, a plug 543 and the like connected to the conductor 511 and the like, and a conductor 513 over the insulator 571. The conductor 511 is preferably formed to be embedded in the insulator 581. The plug 543 and the like are preferably formed to be embedded in the insulator 584 and the insulator 571. The conductor 513 is preferably formed to be embedded in the insulator 585.

The layer 628 may include a conductor 413. The conductor 413 is preferably formed to be embedded in the insulator 585.

The insulator 584 and the insulator 585 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 584 and the insulator 585 can be formed by a sputtering method, a CVD method (including a thermal CVD method, an MOCVD method, a PECVD method, and the like), an MBE method, an ALD method, a PLD method, or the like. In particular, it is preferable that the insulator be formed by a CVD method, further preferably a plasma CVD method because coverage can be further improved. It is preferable to use a thermal CVD method, an MOCVD method, or an ALD method in order to reduce plasma damage.

Alternatively, the insulator 584 and the insulator 585 can be formed using silicon carbide, silicon carbonitride, silicon oxycarbide, or the like. Further alternatively, undoped silicate glass (USG), boron phosphorus silicate glass (BPSG), borosilicate glass (BSG), or the like can be used. USG, BPSG, and the like may be formed by an atmospheric pressure CVD method. Alternatively, hydrogen silsesquioxane (HSQ) or the like may be applied by a coating method.

Each of the insulators 584 and 585 may have a single-layer structure or a stacked-layer structure of a plurality of materials.

The insulator 581 may have a stacked-layer structure of a plurality of layers. For example, the insulator 581 has a two-layer structure of the insulator 581*a* and the insulator 581*b* over the insulator 581*a* as shown in FIG. 1.

The plug 543 has a portion projecting above the insulator 571.

A conductive material such as a metal material, an alloy material, or a metal oxide material can be used as a material of the conductor 511, the conductor 513, the conductor 413, the plug 543, and the like. For example, a single-layer structure or a stacked-layer structure using any of metals such as aluminum, titanium, chromium, nickel, copper, yttrium, zirconium, niobium, molybdenum, silver, tantalum, and tungsten, or an alloy containing any of these metals as a main component can be used. Alternatively, a metal nitride such as tungsten nitride, molybdenum nitride, or titanium nitride can be used.

The conductors such as the conductor 511 and the conductor 513 preferably function as wirings in the semiconductor device 500. Therefore, these conductors are also referred to as wirings or wiring layers in some cases. These conductors are preferably connected to each other via plugs such as the plug 543.

In the semiconductor device of one embodiment of the present invention, the conductor 511, the conductor 513, the conductor 413, the plug 543, and the like in the layer 628 may have a stacked-layer structure of two or more layers. An example of the case is shown in FIG. 3A. The semiconductor device 500 shown in FIG. 3A includes the layers 627 to 631. The details of the layers 627, 630, and 631 are not shown in FIG. 3A, but FIG. 1 or the like can be referred to.

A region surrounded by the dashed-dotted line in FIG. 3A is shown in FIG. 3B. In the layer 628 shown in FIG. 3A, the conductor 511 includes the conductor 511*a* and the conductor 511*b* formed over the conductor 511*a*. Similarly, the conductor 513 includes a conductor 513*a* and a conductor 513*b* formed over the conductor 513*a*, the conductor 413 includes a conductor 413*a* and a conductor 413*b* formed over the conductor 413*a*, and the plug 543 includes a plug 543*a* and a plug 543*b* formed over the plug 543*a*.

It is preferable that the conductor 511*a* be formed along a side surface of the opening in the insulator 581 and the conductor 511*b* be formed to fill the opening covered with the conductor 511*a*.

It is preferable that conductors in lower layers, such as the conductor 511*a*, the conductor 413*a*, the conductor 513*a*, and the plug 543*a*, hardly transmit an element contained in conductors in upper layers, such as the conductor 511*b*. For example, the conductor 513*a* preferably suppresses the diffusion of an element contained in the conductor 513*b* into the insulator 585 and the like.

It is preferable that the conductors in the lower layers, such as the conductor 511*a*, the conductor 413*a*, and the conductor 513*a*, have high adhesion with the insulators such as the insulator 581 on which the conductors are formed.

For example, the case is considered where the conductors in the upper layers, such as the conductor 511*b*, include copper. Copper has a low resistance and is preferably used as a conductor such as a plug or a wiring. On the other hand, copper is easily diffused, and the diffusion of copper into a semiconductor element degrades the characteristics of the semiconductor element in some cases. The conductors in the lower layers, such as the conductor 511*a*, may be formed using a material with low copper permeability, e.g., tantalum, tantalum nitride, and titanium nitride. It is particularly preferable to use tantalum.

It is preferable that hydrogen or water be hardly allowed to pass through the conductors in the lower layers, such as the conductor 511*a*, the conductor 413*a*, the conductor 513*a*, and the plug 543*a*, and the plug, in which case the diffusion of hydrogen or water included in the layer 627 or the like into a layer above the layer 629 can be suppressed. That is, the diffusion of hydrogen or water included in the layer 627 or the like into a layer above the layer 629 through the plug or the conductor can be suppressed. Thus, for example, the degradation of characteristics of the transistor 490 can be suppressed and stable characteristics can be obtained. Metal nitride may be used as a material with low hydrogen permeability, for example, and it is particularly preferable to use tantalum nitride.

The thicknesses of the conductors in the lower layers, such as the conductor 511*a*, the conductor 413*a*, the conductor 513*a*, and the plug 543*a*, are each preferably greater than or equal to 5 nm and less than or equal to 100 nm, more preferably greater than or equal to 10 nm and less than or equal to 70 nm, still more preferably greater than or equal to 20 nm and less than or equal to 70 nm.

The conductors in the lower layers, such as the conductor 511*a*, the conductor 413*a*, the conductor 513*a*, and the plug 543*a*, preferably have a stacked-layer structure of, for example, a material with low hydrogen permeability and a material with low copper permeability. For example, a stack of a tantalum nitride layer and a tantalum layer, or a stack of a titanium nitride layer and a tantalum layer is preferably used.

The case is considered where the conductors in the lower layers, such as the conductor 511a, the conductor 413a, the conductor 513a, and the plug 543a, have a stacked-layer structure of a first conductive layer formed using a material low hydrogen permeability and a second conductive layer formed using a material with low copper permeability. In this case, the thickness of the first conductive layer is preferably greater than or equal to 5 nm and less than or equal to 50 nm, more preferably greater than or equal to 10 nm and less than or equal to 50 nm, still more preferably greater than or equal to 10 nm and less than or equal to 30 nm, and the thickness of the second conductive layer is preferably greater than or equal to 5 nm and less than or equal to 50 nm, more preferably greater than or equal to 10 nm and less than or equal to 50 nm, still more preferably greater than or equal to 10 nm and less than or equal to 40 nm. The second conductive layer is preferably positioned over the first conductive layer, for example. A third conductive layer may be provided over the first conductive layer and the second conductive layer.

In each of the conductors in the lower layers, such as the conductor 511a, the conductor 413a, the conductor 513a, and the plug 543a, the thickness at a sidewall and the thickness at a bottom portion may be different from each other. For example, the larger one of the sidewall and the bottom portion, or the thickness of the thickest region at the sidewall and the bottom portion is greater than or equal to 5 nm. The conductor is preferably formed by, for example, a collimated sputtering method, in which case the coverage by the conductor is improved in some cases. When the conductor is formed by a collimated sputtering method, the thickness at the bottom portion is larger than the thickness at the sidewall in some cases. For example, the thickness at the bottom portion is 1.5 times or more, or twice or more as large as the thickness at the sidewall in some cases.

The thickness of each of the conductors in the lower layers, such as the conductor 511a, the conductor 413a, the conductor 513a, and the plug 543a, may be less than 5 nm. For example, the thickness is preferably greater than or equal to 1 nm and less than 5 nm, more preferably greater than or equal to 2 nm and less than 5 nm. In the case where the conductors in the lower layers, such as the conductor 511a, the conductor 413a, the conductor 513a, and the plug 543a, have a stacked-layer structure of the first conductive layer formed using a material with low hydrogen permeability and the second conductive layer formed using a material with low copper permeability, the thickness of each of the first conductive layer and the second conductive layer may be less than 5 nm, for example, preferably greater than or equal to 1 nm and less than 5 nm, more preferably greater than or equal to 2 nm and less than 5 nm.

When the conductors in the lower layers, such as the conductor 511a, the conductor 413a, and the plug 543a, are formed using a material such as titanium nitride, tantalum nitride, titanium, or tantalum, the conductors can have high adhesion with the openings in the insulators in which the conductors are formed, in some cases.

In the case where the conductors in the lower layers, such as the conductor 511a, the conductor 413a, and the plug 543a, are each formed of stacked films, for example, a layer containing copper may be formed as a layer on the surface side. For example, three layers of tantalum nitride, tantalum over the tantalum nitride, and copper over the tantalum may be stacked. The formation of the layer containing copper as the layer on the surface side of the conductor 511a increases the adhesion between the conductor 511b and the conductor 511a in some cases when the conductor 511b is formed using copper, for example.

For the insulator 581, the description of the insulator 464 is referred to. The insulator 581 may have a single-layer structure or a stacked-layer structure of a plurality of materials. In the example shown in FIG. 1, the insulator 581 has a two-layer structure of the insulator 581a and the insulator 581b over the insulator 581a. For a material and a formation method that can be used for the insulator 581a and the insulator 581b, the description of the material and the formation method that can be used for the insulator 464a and the insulator 464b can be referred to.

As an example of the insulator 581a, silicon nitride formed by a CVD method can be used. In a semiconductor element included in the semiconductor device 500, such as the transistor 490, hydrogen is diffused into the semiconductor element, so that the characteristics of the semiconductor element are degraded in some cases. In view of this, a film that releases a small amount of hydrogen is preferably used as the insulator 581a. The released amount of hydrogen can be measured by thermal desorption spectroscopy (TDS), for example. In TDS analysis, the amount of hydrogen released from the insulator 581a which is converted into hydrogen atoms is, for example, less than or equal to $5\times10^{20}$ atoms/cm$^3$, preferably less than or equal to $1\times10^{20}$ atoms/cm$^3$ in the range of 50° C. to 500° C. The amount of hydrogen released from the insulator 581a per area of the insulating film, which is converted into hydrogen atoms, is less than or equal to $5\times10^{15}$ atoms/cm$^2$, preferably less than or equal to $1\times10^{15}$ atoms/cm$^2$, for example, The dielectric constant of the insulator 581b is preferably lower than that of the insulator 581a. For example, the relative dielectric constant of the insulator 581b is preferably lower than 4, more preferably lower than 3. For example, the relative dielectric constant of the insulator 581b is preferably 0.7 times or less that of the insulator 581a, more preferably 0.6 times or less that of the insulator 581a.

The insulator 571 is preferably formed using an insulating material through which an impurity hardly passes. Preferably, the insulator 571 has low oxygen permeability, for example. Preferably, the insulator 571 has low hydrogen permeability, for example. Preferably, the insulator 571 has low water permeability, for example.

The insulator 571 can be formed using a single-layer structure or a stacked-layer structure using, for example, aluminum oxide, hafnium oxide, tantalum oxide, zirconium oxide, lead zirconate titanate (PZT), strontium titanate (SrTiO$_3$), (Ba,Sr)TiO$_3$ (BST), silicon nitride, or the like. Alternatively, aluminum oxide, bismuth oxide, germanium oxide, niobium oxide, silicon oxide, titanium oxide, tungsten oxide, yttrium oxide, zirconium oxide, or gallium oxide may be added to the insulator, for example. Alternatively, the insulator may be subjected to nitriding treatment to be oxynitride. A layer of silicon oxide, silicon oxynitride, or silicon nitride may be stacked over the insulator. Aluminum oxide is particularly preferable because of its excellent barrier property against water or hydrogen.

The insulator 571 is formed using, for example, silicon carbide, silicon carbonitride, or silicon oxycarbide.

The insulator 571 may be a stack including a layer of a material through which water or hydrogen is hardly allowed to pass and a layer containing an insulating material. The insulator 571 may be, for example, a stack of a layer containing silicon oxide or silicon oxynitride, a layer containing a metal oxide, and the like.

The insulator 571 included in the semiconductor device 500 can suppress the diffusion of an element included in the conductor 513, the conductor 413, and the like into the insulator 571 and layers under the insulator 571 (e.g., the insulator 584, the insulator 581, and the layer 627), for example.

In the case where the dielectric constant of the insulator 571 is higher than that of the insulator 584, the thickness of the insulator 571 is preferably smaller than that of the insulator 584. Here, the relative dielectric constant of the insulator 584 is 0.7 times or less that of the insulator 571, more preferably 0.6 times or less that of the insulator 571, for example. The thickness of the insulator 571 is preferably greater than or equal to 5 nm and less than or equal to 200 nm, more preferably greater than or equal to 5 nm and less than or equal to 60 nm, and the thickness of the insulator 584 is preferably greater than or equal to 30 nm and less than or equal to 800 nm, more preferably greater than or equal to 50 nm and less than or equal to 500 nm, for example. The thickness of the insulator 571 is preferably less than or equal to one-third of the thickness of the insulator 584, for example.

Figure 4:
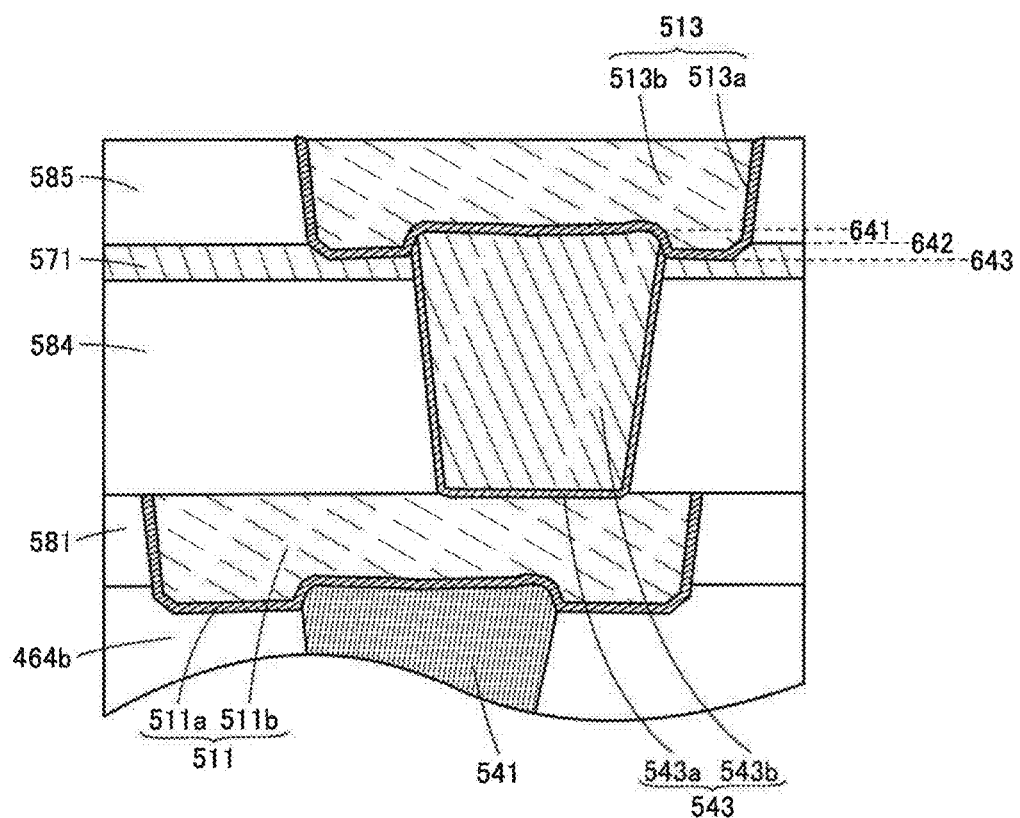
FIG. 4 is a cross-sectional view illustrating an example of a semiconductor device of one embodiment of the present invention.

FIG. 4 is a cross-sectional view showing some of components of the semiconductor device 500. The insulator 464b, the plug 541 formed to be embedded in the insulator 464b, the insulator 581 over the insulator 464b, the conductor 511 over the plug 541 and the insulator 464b, the insulator 584 over the insulator 581, the insulator 571 over the insulator 584, the plug 543 formed to be embedded in the insulator 584 and the insulator 571 and positioned over the conductor 511, the insulator 585 over the insulator 571, and the conductor 513 over the plug 543 and the insulator 571 are shown in FIG. 4. In the cross section shown in FIG. 4, a level 641 of the highest region in a top surface of the plug 543 is preferably higher than a level 642 of the highest region in a top surface of the insulator 571.

As shown in FIG. 4, the conductor 511, the conductor 513, and the plug 543 may have rounded corners. In some cases, a part of the insulator 571 is removed when an opening for forming the conductor 513 is formed. In that case, in the cross section shown in FIG. 4, a level 643 of the lowest region in a bottom surface of the conductor 513 is preferably lower than the level 642.

The insulator 464a and the insulator 581a are formed using, for example, silicon nitride and silicon carbonitride, respectively. Here, a material with low hydrogen permeability is used as at least one of an insulator 571a and the insulator 571. When titanium nitride is used as the conductor 513b, for example, diffusion of hydrogen contained in silicon nitride and silicon carbonitride into the transistor 490 can be suppressed.

<Layer 629>

The layer 629 includes the transistor 490 and plugs such as a plug 544 and a plug 544b. The plugs such as the plug 544 and the plug 544b are connected to the conductor 513 in the layer 628 and a gate electrode, a source electrode, and a drain electrode of the transistor 490.

The transistor 490 includes a semiconductor layer 406. The semiconductor layer 406 includes a semiconductor material. Examples of the semiconductor material include oxide semiconductor materials, semiconductor materials such as silicon, germanium, gallium, and arsenic, compound semiconductor materials including silicon, germanium, gallium, arsenic, aluminum, and the like, and organic semiconductor materials. In particular, the semiconductor layer 406 preferably includes an oxide semiconductor.

Figure 5A:
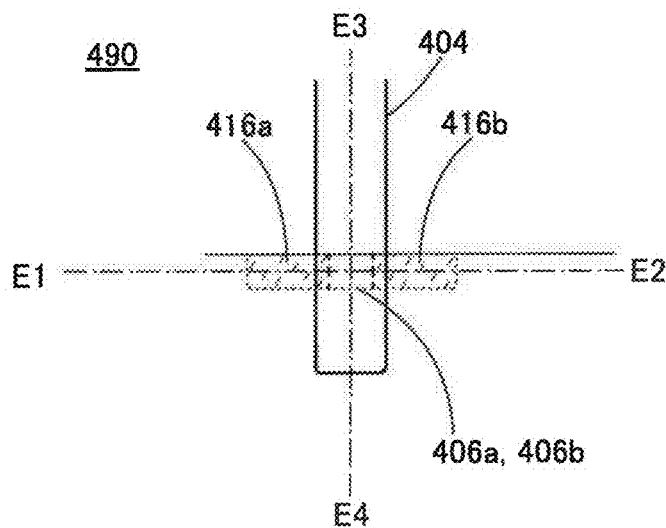
FIGS. 5A and 5B are a top view and a cross-sectional view illustrating an example of a transistor of one embodiment of the present invention.
Figure 5B:
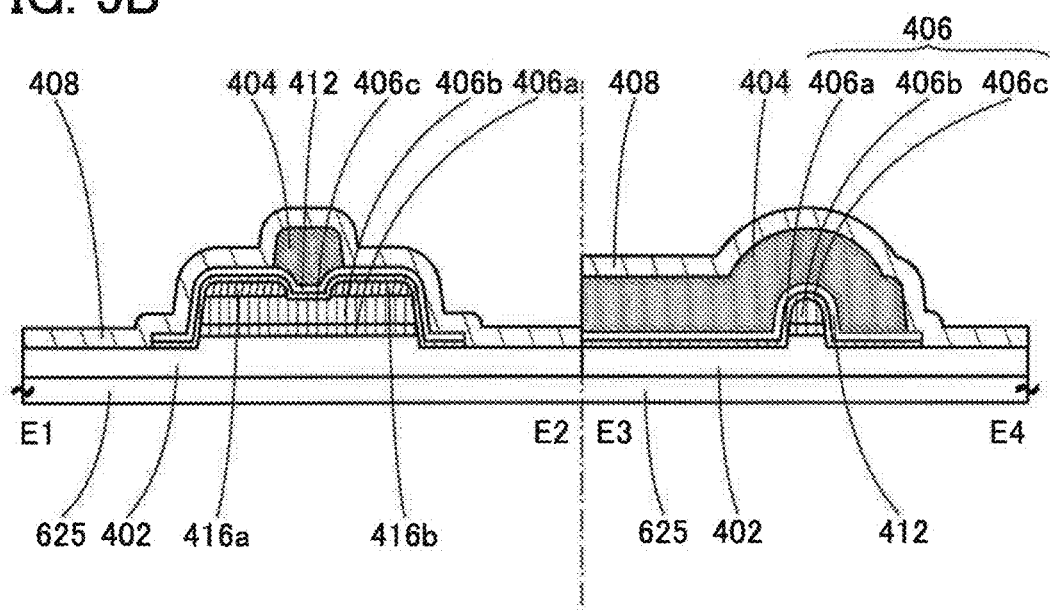

FIG. 5A is a top view of the transistor 490 shown in FIG. 1. FIG. 5B is a cross-sectional view taken along dashed-dotted line E1-E2 and dashed-dotted line E3-E4 in FIG. 5A. A layer 625 may be a substrate or have a structure in which an insulator or a conductor is formed over a substrate.

The transistor 490 preferably includes the conductor 413 and the insulator 571a over the conductor 413 as shown in FIG. 1.

In the transistor 490 shown in FIG. 1, the semiconductor layer 406 includes three layers of an oxide layer 406a, an oxide layer 406b, and an oxide layer 406c. The transistor 490 includes the insulator 571a, an insulator 402 over the insulator 571a, the oxide layer 406a over the insulator 402, the oxide layer 406b over the oxide layer 406a, a conductor 416a and a conductor 416b over the oxide layer 406b, the oxide layer 406c in contact with a top surface and a side surface of the oxide layer 406b, a top surface of the conductor 416a, and a top surface of the conductor 416b, an insulator 412 over the oxide layer 406c, an insulator 408 over the insulator 412, and an insulator 591 over the insulator 408. A conductor 404 is preferably formed over a region between the conductor 416a and the conductor 416b (a dividing region) with the insulator 412 positioned therebetween.

The conductors 416a and 416b preferably function as the source electrode and the drain electrode of the transistor 490. The conductor 404 preferably functions as a gate electrode of the transistor 490. The conductor 413 included in the layer 628 may function as a gate electrode of the transistor 490. For example, the conductor 404 and the conductor 413 may function as a first gate electrode and a second gate electrode, respectively.

The insulator 571a can be formed with a single-layer structure or a stacked-layer structure using the material described as the material of the insulator 571. Here, the transistor 490 preferably includes a charge trap layer between the semiconductor layer 406 and the conductor 413, in which case the threshold value of the transistor 490 can be controlled by trapping charges in the charge trap layer. The insulator 571a preferably includes the charge trap layer. In this specification, the threshold value refers to, for example, gate voltage at which a channel is formed. For example, the threshold value can be calculated from a curve obtained in a graph where the horizontal axis represents the gate voltage $V_g$ and the vertical axis represents the square root of drain current $I_d$ ($V_g$-$\sqrt{I_d}$ characteristics); the threshold value corresponds to the gate voltage $V_g$ at the intersection of an extrapolated tangent line having the highest inclination with the square root of drain current $I_d$ of 0 (i.e., $I_d$ of 0 A).

The material described as the material of the insulator 571 can be used for the charge trap layer. For example, hafnium oxide or silicon nitride is preferably used for the charge trap layer. An insulating film including a metal cluster may be used as the charge trap layer. By trapping electrons in the charge trap layer, the threshold value of the transistor 490 can be shifted in the positive direction in some cases.

The insulator 571a may have a stacked-layer structure of a layer that easily traps a charge and a layer that hardly transmits an impurity. For example, as the layer that easily traps a charge, hafnium oxide is formed, and, as the layer that hardly transmits an impurity, aluminum oxide is stacked thereover. Alternatively, hafnium oxide may be formed over aluminum oxide.

Further alternatively, three layers of hafnium oxide, aluminum oxide, and silicon oxide may be stacked. Here, the stacking order of the three layers is not limited.

Silicon oxide is preferably used in the lower layer of the insulator 571a, in which case the characteristics and the reliability of the transistor 490 might be improved. For example, silicon oxide and hafnium oxide may be used in the lower layer and the upper layer, respectively, in the insulator 571a. Alternatively, a three-layer structure including silicon oxide, hafnium oxide over the silicon oxide, and aluminum oxide over the hafnium oxide may be used. Here, examples of materials used as the insulator 571a and the insulator 402 are described. For example, two layers including silicon oxide and hafnium oxide over the silicon oxide can be used as the insulator 571a, and silicon oxide can be used as the insulator 402.

The insulator 571 and the insulator 571a in the semiconductor device 500 can suppress the diffusion of hydrogen, water, or the like included in the layer 627 into the transistor 490. Moreover, the diffusion of an element included in the conductors such as the conductor 511, the conductor 513, and the conductor 413 and the plugs such as the plug 543 into the transistor 490 can be suppressed. Furthermore, the diffusion of an element included in the conductor 513 or the like into the layer 627 can be suppressed. In addition, the insulator 408 included in the semiconductor device 500 can suppress the diffusion of an impurity, such as hydrogen or water, from above the insulator 408.

In the case where the transistor 490 includes an oxide semiconductor, for example, the degradation of the characteristics of the transistor can be suppressed in some cases by suppressing the diffusion of hydrogen into the oxide semiconductor.

Although not included in the semiconductor device 500 in some cases, the insulator 571a is preferably included.

The material described as the material of the conductor 511 or the like can be used as each of the conductor 416a and the conductor 416b, for example.

In the case where a material that is easily bonded to oxygen, e.g., tungsten or titanium, is used as each of the conductor 416a and the conductor 416b, an oxide of the material is formed, so that oxygen vacancies in the semiconductor layer 406 are increased in and near a region where the semiconductor layer 406 is in contact with the conductor 416a and the conductor 416b. When hydrogen is bonded to an oxygen vacancy, the carrier density is increased and the resistivity is decreased in the region.

The conductor 416a and the conductor 416b preferably include a material through which an element included in the plug 544b formed in contact with the top surfaces of the conductor 416a and the conductor 416b is unlikely to pass.

Each of the conductor 416a and the conductor 416b may be formed of stacked films. For example, each of the conductor 416a and the conductor 416b is formed of stacked layers of a first layer and a second layer. Here, the first layer is formed over the oxide layer 406b, and the second layer is formed over the first layer. For example, tungsten and tantalum nitride are used as the first layer and the second layer, respectively. Here, copper is used as the plug 544b or the like, for example. Copper is preferably used as a conductor such as a plug or a wiring because of its low resistance. On the other hand, copper is easily diffused; the diffusion of copper into a semiconductor layer, a gate insulating film, or the like of a transistor degrades the transistor characteristics in some cases. When tantalum nitride is included in the conductor 416a and the conductor 416b, the diffusion of copper included in the plug 544b or the like into the oxide layer 406b can be suppressed in some cases.

The semiconductor device 500 of one embodiment of the present invention preferably has a structure in which, in the case where an element and a compound that cause degradation of characteristics of a semiconductor element are included in the plug, the wiring, or the like, the diffusion of the element and the compound into the semiconductor element is suppressed.

The material described as the material of the insulator 571 can be used as the insulator 408. As described later, excess oxygen is preferably supplied to the interface between the insulator 408 and a film under the insulator 408 and the vicinity of the interface at the time of formation of the insulator 408.

When the insulator 571, the insulator 571a, and the insulator 408 are formed using a material with low oxygen permeability, the diffusion of oxygen from the transistor 490 to the outside (e.g., the diffusion of oxygen to a layer under the insulator 571 and a layer over the insulator 408) can be suppressed. Accordingly, oxygen can be supplied to the transistor 490 efficiently. In the case where the transistor 490 includes an oxide semiconductor, for example, easy supply of oxygen to the oxide semiconductor might improve transistor characteristics.

<Layer 630>

The layer 630 includes an insulator 592, conductors such as a conductor 514, and plugs such as a plug 545. The plug 545 and the like are connected to the conductors such as the conductor 514.

<Layer 631>

The layer 631 includes a capacitor 150. The capacitor 150 includes a conductor 516, a conductor 517, and an insulator 572. The insulator 572 includes a region positioned between the conductor 516 and the conductor 517. The layer 631 preferably includes an insulator 594 and a plug 547 over the conductor 517. The plug 547 is preferably formed to be embedded in the insulator 594. The layer 631 preferably includes a conductor 516b connected to the plug included in the layer 630 and a plug 547b over the conductor 516b.

The layer 631 may include a wiring layer connected to the plug 547 and the plug 547b. In the example shown in FIG. 1, the wiring layer includes a conductor 518 and the like connected to the plug 547 and the plug 547b, a plug 548 over the conductor 518, an insulator 595, a conductor 519 over the plug 548, and an insulator 599 over the conductor 519. The plug 548 is preferably formed to be embedded in the insulator 595. The insulator 599 includes an opening over the conductor 519.

<Transistor 490>

FIG. 5A is a top view of the transistor 490 shown in FIG. 1. FIG. 5B is a cross-sectional view taken along dashed-dotted line E1-E2 and dashed-dotted line E3-E4 in FIG. 5A.

As illustrated in FIG. 5B, the oxide layer 406b can be electrically surrounded by an electric field of the conductor 404 (a structure in which a semiconductor is electrically surrounded by an electric field of a conductor is referred to as a surrounded channel (s-channel) structure). Therefore, a channel is formed in the entire oxide layer 406b (bulk) in some cases. In the s-channel structure, a large amount of current can flow between a source and a drain of a transistor, so that a high on-state current can be obtained.

The s-channel structure is suitable for a miniaturized transistor because a high on-state current can be obtained. A device including a miniaturized transistor can have a high integration degree and high density. For example, the transistor includes a region having a channel length of less than or equal to 40 nm, further preferably less than or equal to 30 nm, and still further preferably less than or equal to 20 nm, and a region having a channel width of less than or equal to 40 nm, further preferably less than or equal to 30 nm, and still further preferably less than or equal to 20 nm.

Figure 6A:
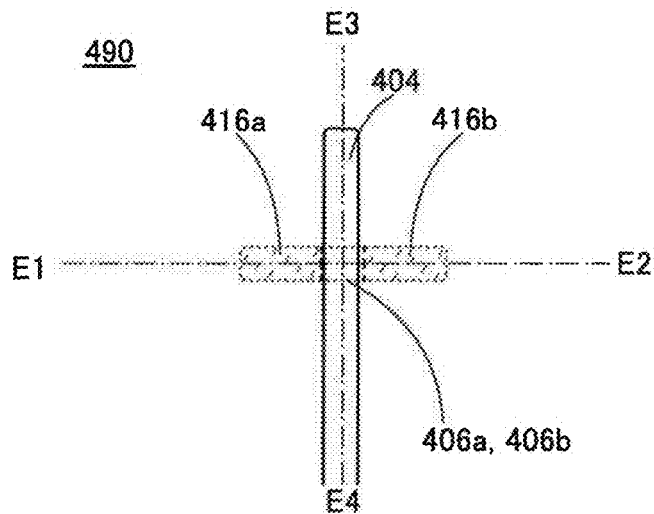
FIGS. 6A and 6B are a top view and a cross-sectional view illustrating an example of a transistor of one embodiment of the present invention.
Figure 6B:
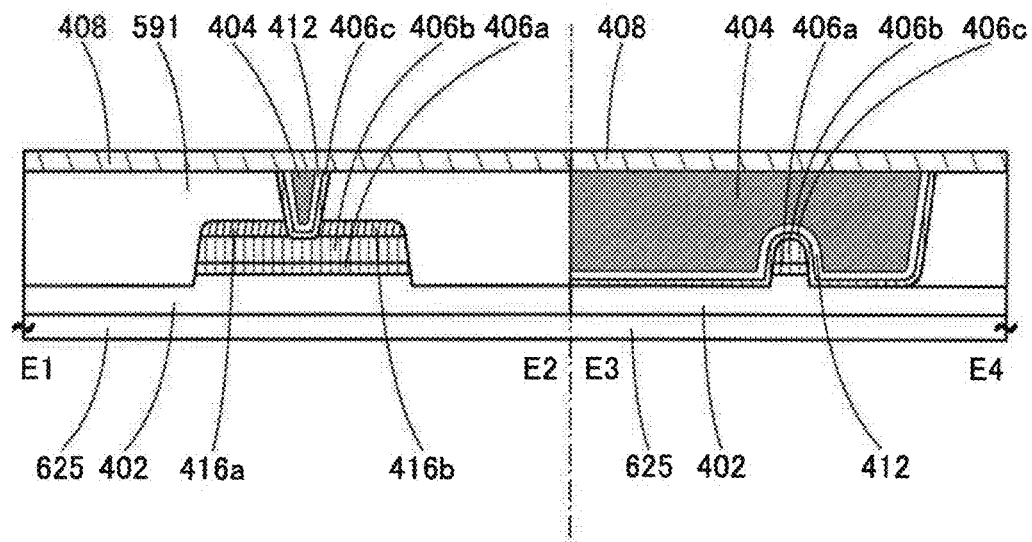
Figure 7A:
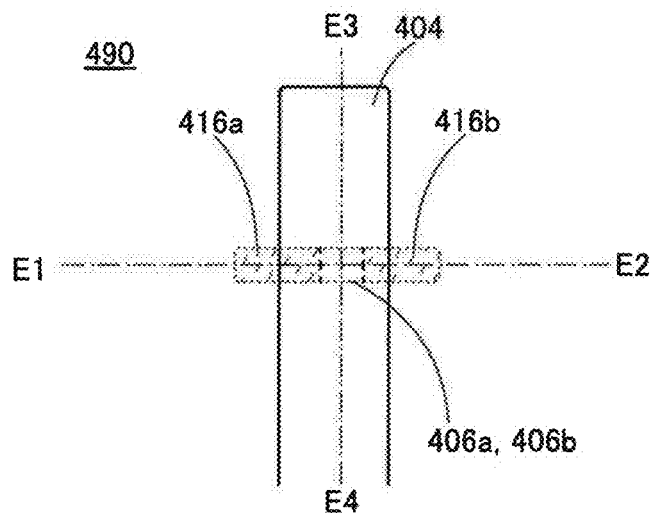
FIGS. 7A and 7B are a top view and a cross-sectional view illustrating an example of a transistor of one embodiment of the present invention.
Figure 7B:
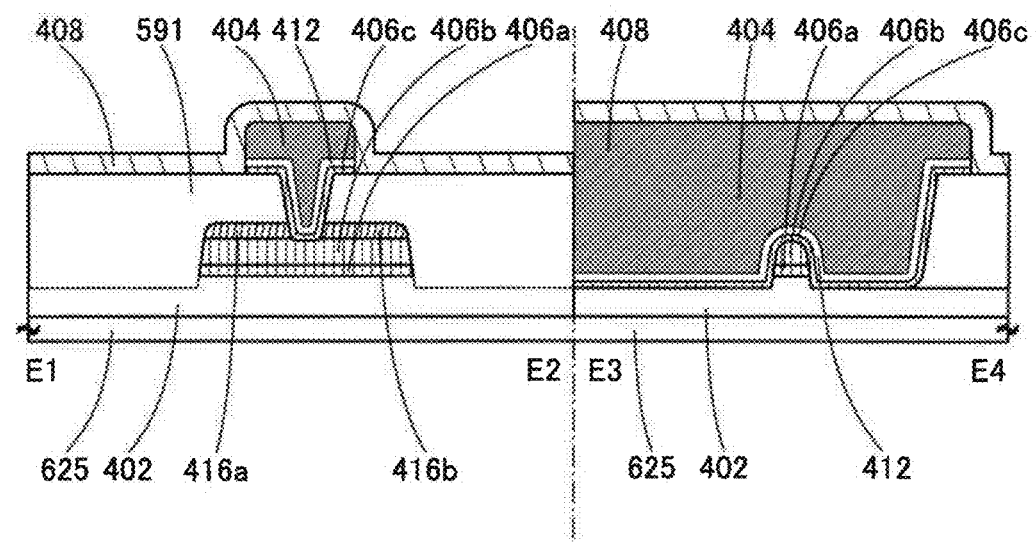

Instead of the structure of the transistor 490 shown in FIGS. 5A and 5B, a structure shown in FIGS. 6A and 6B or a structure shown in FIGS. 7A and 7B may be used.

The transistor 490 shown in FIGS. 6A and 6B is different from that shown in FIGS. 5A and 5B in the structures of the oxide layer 406c, the insulator 412, the conductor 404, and the insulator 408. FIG. 6A is a top view of the transistor 490. FIG. 6B is a cross-sectional view taken along dashed-dotted line E1-E2 and dashed-dotted line E3-E4 in FIG. 6A. The transistor 490 shown in FIG. 6B includes the following components: the layer 625; the insulator 402 over the layer 625; the oxide layer 406a over the insulator 402; the oxide layer 406b over the oxide layer 406a; the conductor 416a and the conductor 416b over the oxide layer 406b; the oxide layer 406c in contact with the top surface of the oxide layer 406b; the insulator 412 over the oxide layer 406c; the conductor 404 over the insulator 412; the insulator 591 over the conductor 416a and the conductor 416b; and the insulator 408 over the insulator 591 and the conductor 404.

As shown in FIG. 6B, it is preferable that the insulator 412 be stacked over the oxide layer 406c, and the oxide layer 406c and the insulator 412 be formed on a side surface of an opening in the insulator 591. The conductor 404 is preferably formed to fill the opening whose inner wall is covered with the oxide layer 406c and the insulator 412. The conductor 404 is preferably formed over a region between the conductor 416a and the conductor 416b (a dividing region) with the insulator 412 positioned therebetween.

The transistor 490 shown in FIGS. 7A and 7B is different from that shown in FIGS. 6A and 6B in the structures of the oxide layer 406c, the insulator 412, and the conductor 404. FIG. 7A is a top view of the transistor 490. FIG. 7B is a cross-sectional view taken along dashed-dotted line E1-E2 and dashed-dotted line E3-E4 in FIG. 7A. In the transistor 490 shown in FIG. 7B, the insulator 412 is stacked over the oxide layer 406c. The oxide layer 406c is formed in contact with the side surface of the opening in the insulator 591 and a top surface of the insulator 591. The insulator 412 is formed over the oxide layer 406c. The conductor 404 is formed to fill the opening whose inner wall is covered with the oxide layer 406c and the insulator 412. The conductor 404 is formed over the top surface of the insulator 591 with the oxide layer 406c and the insulator 412 provided therebetween. The insulator 408 is formed in contact with a top surface of the conductor 404. The insulator 408 is preferably formed in contact with at least a part of a side surface of the conductor 404.

<Variations of Transistor 490>

Figure 38A:
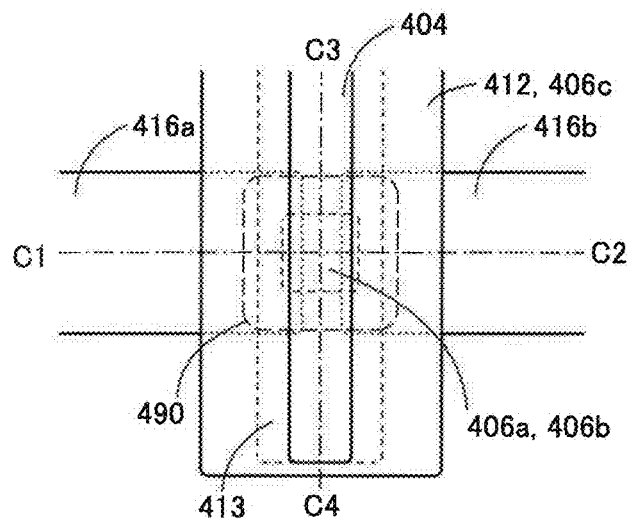
FIGS. 38A and 38B are a top view and a cross-sectional view illustrating an example of a transistor of one embodiment of the present invention.
Figure 38B:
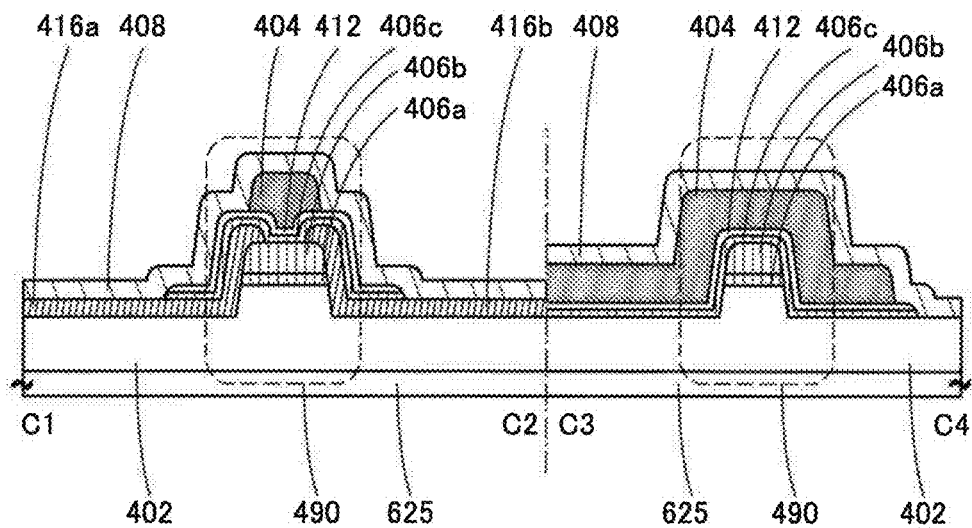

FIG. 38A is a top view of the transistor 490. FIG. 38B illustrates cross sections along dashed-dotted line C1-C2 and dashed-dotted line C3-C4 in FIG. 38A.

The transistor 490 illustrated in FIG. 38B includes the following components: the insulator 402; the oxide layer 406a over the insulator 402; the oxide layer 406b over the oxide layer 406a; the conductor 416a and the conductor 416b in contact with a side surface of the oxide layer 406a and the top surface and the side surface of the oxide layer 406b; the oxide layer 406c in contact with the side surface of the oxide layer 406a, the top surface and the side surface of the oxide layer 406b, a top surface and a side surface of the conductor 416a, and a top surface and a side surface of the conductor 416b; the insulator 412 over the oxide layer 406c; and the conductor 404 over the insulator 412.

Figure 39A:
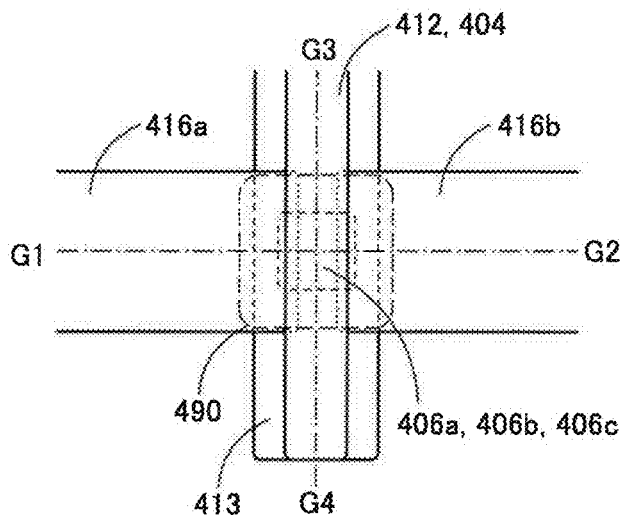
FIGS. 39A and 39B are a top view and a cross-sectional view illustrating an example of a transistor of one embodiment of the present invention.
Figure 39B:
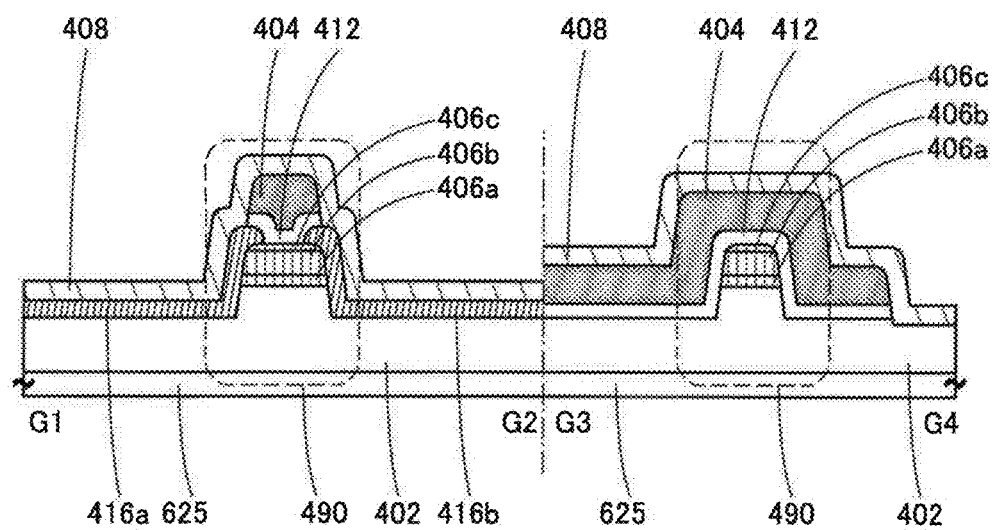

FIG. 39A is a top view of the transistor 490. FIG. 39B is a cross-sectional view taken along dashed-dotted line G1-G2 and dashed-dotted line G3-G4 in FIG. 39A.

The transistor 490 shown in FIGS. 39A and 39B includes the following components: the insulator 402; the oxide layer 406a over a projecting portion of the insulator 402; the oxide layer 406b over the oxide layer 406a; the oxide layer 406c over the oxide layer 406b; the conductor 416a and the conductor 416b that are spaced and in contact with the oxide layer 406a, the oxide layer 406b, and the oxide layer 406c; the insulator 412 over the oxide layer 406c, the conductor 416a, and the conductor 416b; the conductor 404 over the insulator 412; and the insulator 408 over the conductor 416a, the conductor 416b, the insulator 412, and the conductor 404.

The insulator 412 is in contact with at least the side surface of the oxide layer 406b in the cross section G3-G4. The conductor 404 faces the top surface and the side surface of the oxide layer 406b with at least the insulator 412 positioned therebetween in the cross section G3-G4.

Figure 40A:
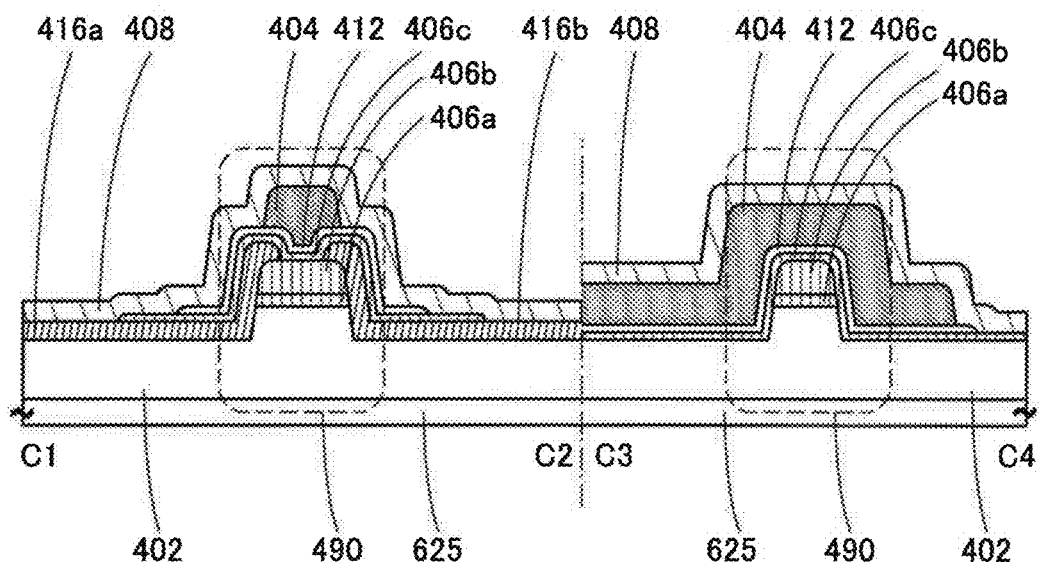
FIGS. 40A and 40B are cross-sectional views each illustrating an example of a transistor of one embodiment of the present invention.
Figure 40B:
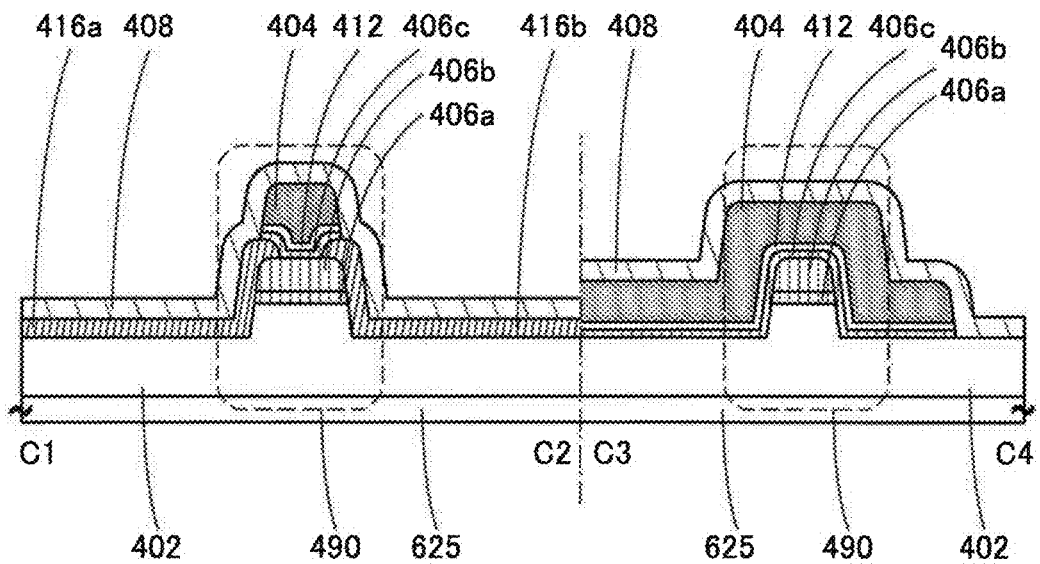

A structure in which an end of the oxide layer 406c is not aligned with an end of the insulator 412 as shown in FIG. 40A may be used. A structure in which an end of the conductor 404 is substantially aligned with the end of the oxide layer 406c and the end of the insulator 412 as shown in FIG. 40B may be used.

Figure 41A:
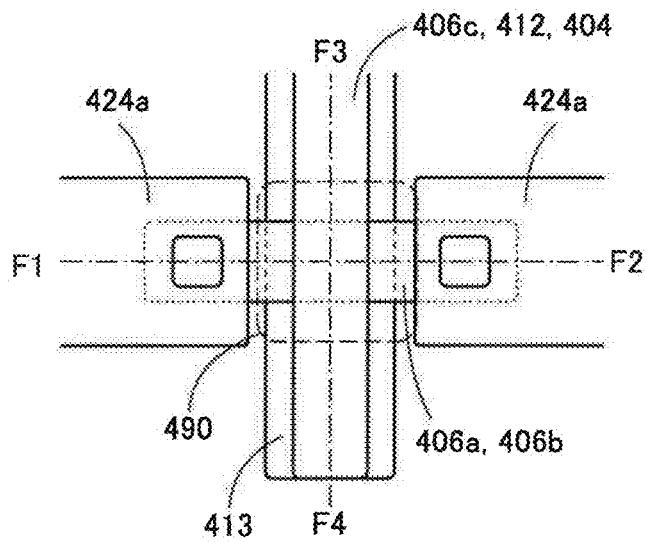
FIGS. 41A and 41B are a top view and a cross-sectional view illustrating an example of a transistor of one embodiment of the present invention.
Figure 41B:
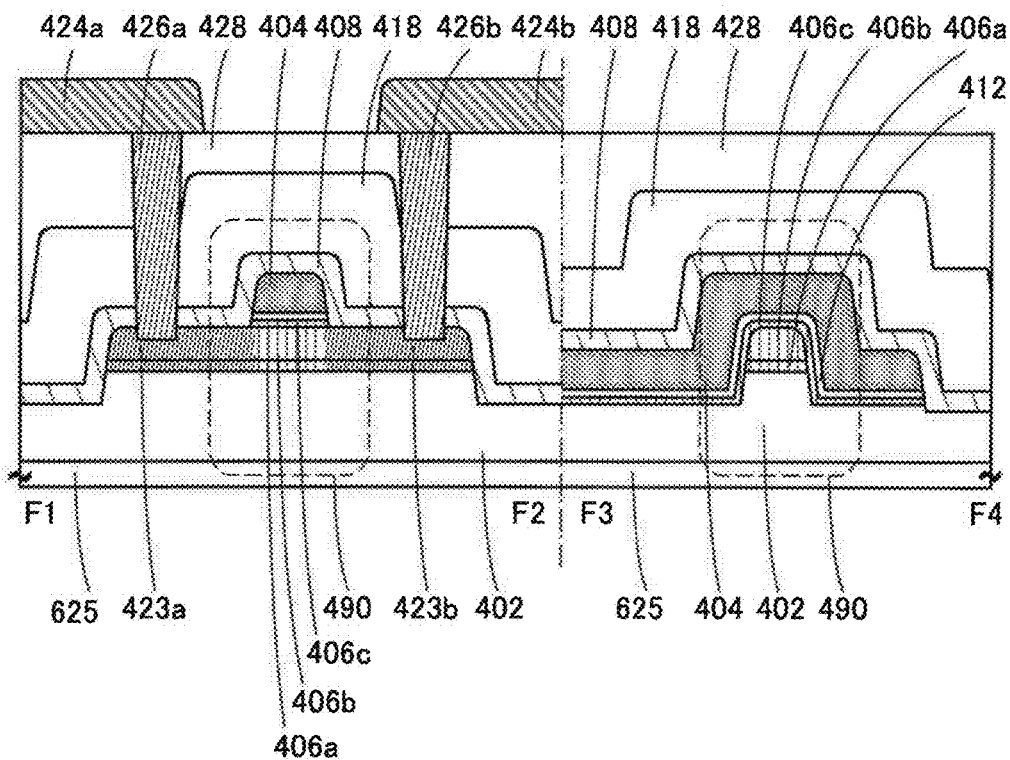

FIG. 41A is an example of a top view of the transistor 490. FIG. 41B is an example of a cross-sectional view taken along dashed-dotted line F1-F2 and dashed-dotted line F3-F4 in FIG. 41A. Note that some components such as an insulator are omitted in FIG. 41A for easy understanding.

In the transistor 490 shown in FIGS. 41A and 41B, the conductor 416a and the conductor 416b are not included, and a conductor 426a and a conductor 426b are in contact with the oxide layer 406b. In this case, a low-resistance region 423a (a low-resistance region 423b) is preferably provided in a region in contact with at least the conductor 426a and the conductor 426b in the oxide layer 406b and/or the oxide layer 406a. The low-resistance region 423a and the low-resistance region 423b may be formed in such a manner that, for example, the conductor 404 or the like is used as a mask and impurities are added to the oxide layer 406b and/or the oxide layer 406a. The conductor 426a and the conductor 426b may be provided in holes (portions which penetrate) or recessed portions (portions which do not penetrate) of the oxide layer 406b. When the conductor 426a and the conductor 426b are provided in holes or recessed portions of the oxide layer 406b, contact areas between the conductors 426a and 426b and the oxide layer 406b are increased; thus, the adverse effect of the contact resistance can be decreased. In other words, the on-state current of the transistor can be increased.

Figure 42A:
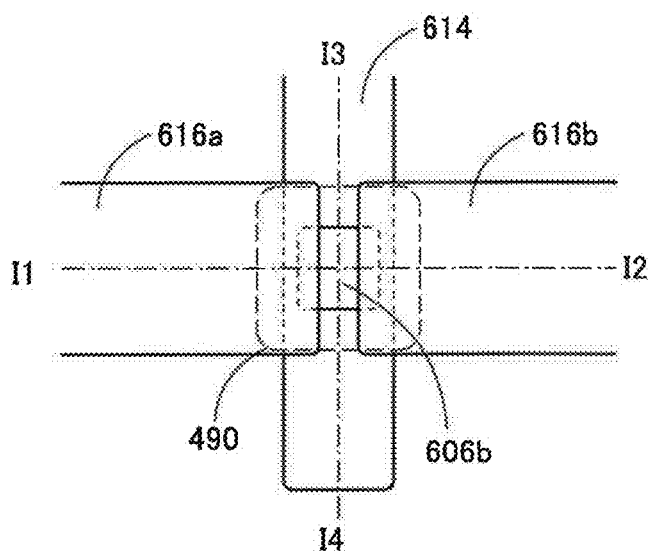
FIGS. 42A and 42B are a top view and a cross-sectional view illustrating an example of a transistor of one embodiment of the present invention.
Figure 42B:
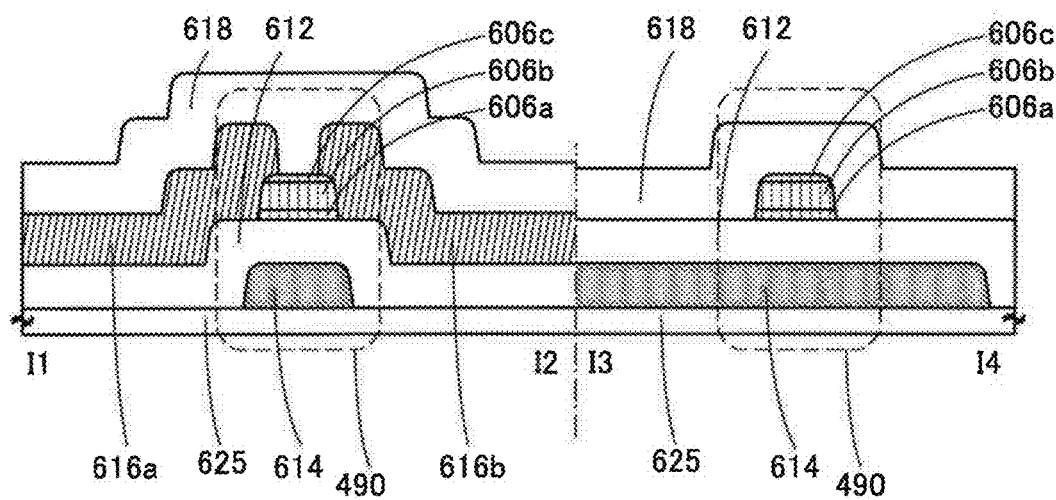

FIGS. 42A and 42B are a top view and a cross-sectional view which illustrate the transistor 490 of one embodiment of the present invention. FIG. 42A is a top view and FIG. 42B is a cross-sectional view taken along dashed-dotted line 11-12 and dashed-dotted line 13-14 in FIG. 42A. Note that for simplification of the drawing, some components in the top view in FIG. 42A are not illustrated.

The transistor 490 shown in FIGS. 42A and 42B includes the following components: a conductor 614 over the layer 625; the insulator 612 over the conductor 614; an oxide layer 606a over the insulator 612; an oxide layer 606b over the oxide layer 606a; an oxide layer 606c over the oxide layer 606b; a conductor 616a and a conductor 616b that are spaced and in contact with the oxide layer 606a, the oxide layer 606b, and the oxide layer 606c; and an insulator 618 over the oxide layer 606c, the conductor 616a, and the conductor 616b. Note that the conductor 614 faces a bottom surface of the oxide layer 606b with the insulator 612 provided therebetween. The insulator 612 may have a projecting portion. The oxide layer 606a need not necessarily be provided. The insulator 618 need not necessarily be provided.

The oxide layer 606b serves as a channel formation region of the transistor 490. The conductor 614 serves as a first gate electrode (also referred to as a front gate electrode) of the transistor 490. The conductor 616a and the conductor 616b serve as a source electrode and a drain electrode of the transistor 490.

The insulator 618 is preferably an insulator containing excess oxygen.

For the conductor 614, the description of the conductor 404 is referred to. For the insulator 612, the description of the insulator 412 is referred to. For the oxide layer 606a, the description of the oxide layer 406a is referred to. For the oxide layer 606b, the description of the oxide layer 406b is referred to. For the oxide layer 606c, the description of the oxide layer 406c is referred to. For the conductor 616a and the conductor 616b, the description of the conductor 416a and the conductor 416b is referred to. For the insulator 618, the description of the insulator 402 is referred to.

Thus, the transistor 490 in FIGS. 42A and 42B can be regarded to be different from the transistor 490 in FIGS. 5A and 5B in only part of the structure in some cases. Specifically, the structure of the transistor 490 in FIGS. 42A and 42B is similar to the structure of the transistor 490 in FIGS. 5A and 5B in which the conductor 404 is not provided. Thus, for the transistor 490 in FIGS. 42A and 42B, the description of the transistor 490 in FIGS. 5A and 5B can be referred to as appropriate.

The transistor 490 may include a conductor that overlaps with the oxide layer 606b with the insulator 618 provided therebetween. The conductor functions as a second gate electrode of the transistor 490. For the conductor, the description of the conductor 413 is referred to. Further, an s-channel structure may be formed using the second gate electrode.

Over the insulator 618, a display element may be provided. For example, a pixel electrode, a liquid crystal layer, a common electrode, a light-emitting layer, an organic EL layer, an anode, a cathode, or the like may be provided. The display element is connected to the conductor 616a or the like, for example.

Figure 43A:
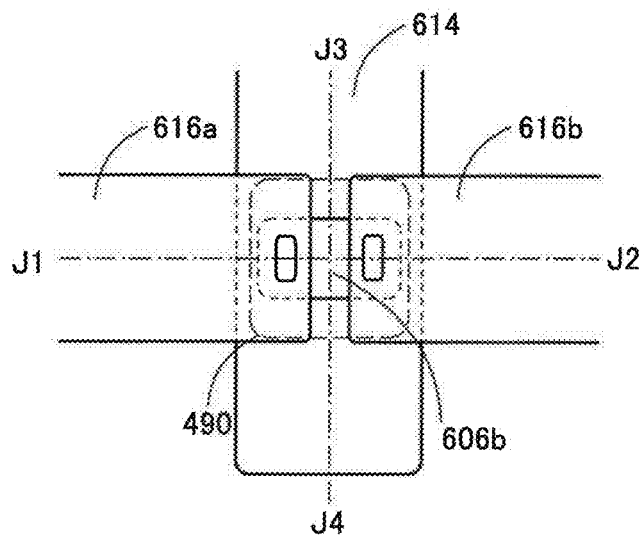
FIGS. 43A and 43B are a top view and a cross-sectional view illustrating an example of a transistor of one embodiment of the present invention.
Figure 43B:
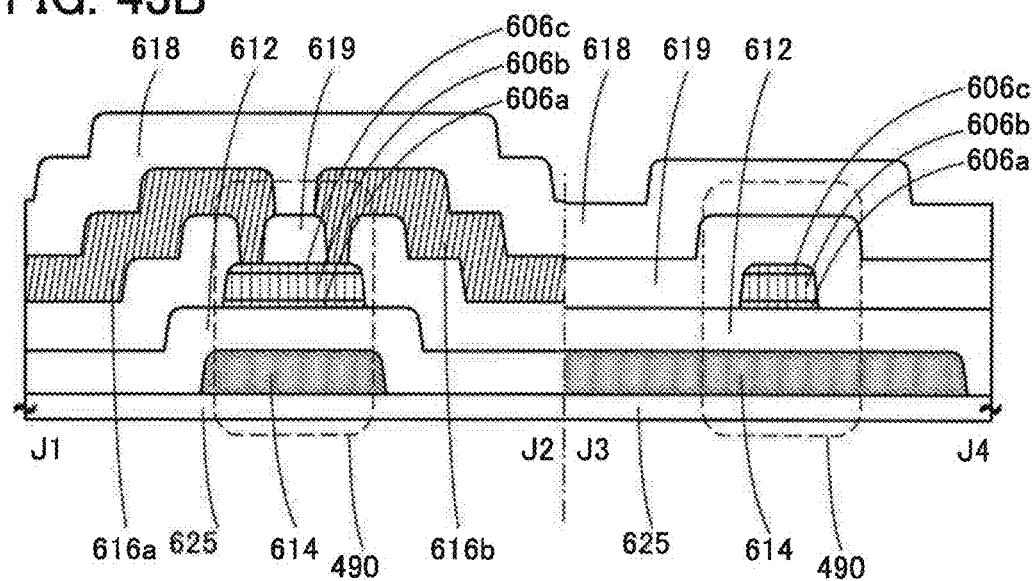

Over the oxide layer, an insulator that can function as a channel protective film may be provided. For example, as illustrated in FIGS. 43A and 43B, an insulator 619 may be provided between the oxide layer 606c and the conductors 616a and 616b. In that case, the conductor 616a (the conductor 616b) and the oxide layer 606c are connected to each other through an opening in the insulator 619. For the insulator 619, the description of the insulator 618 may be referred to.

Figure 44A:
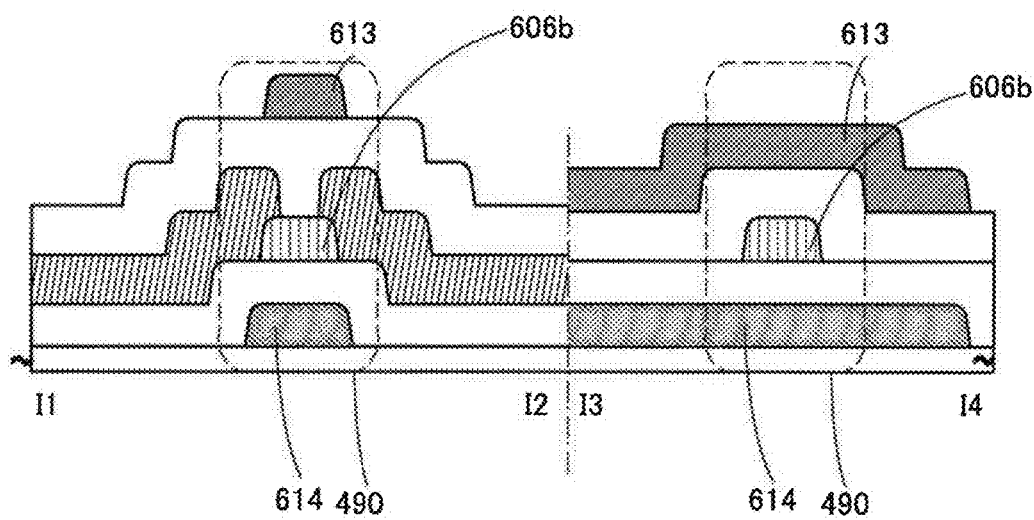
FIGS. 44A and 44B are cross-sectional views each illustrating an example of a transistor of one embodiment of the present invention.
Figure 44B:
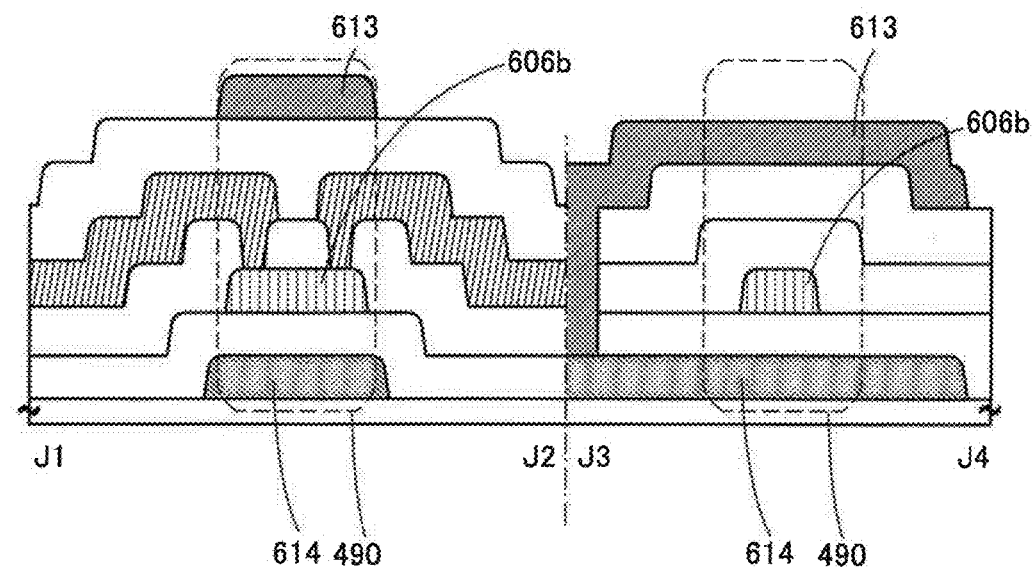

In FIG. 42B and FIG. 43B, a conductor 613 may be provided over the insulator 618. Examples in that case are shown in FIGS. 44A and 44B. For the conductor 613, the description of the conductor 413 is referred to. A potential or signal which is the same as that supplied to the conductor 614 or a potential or signal which is different from that supplied to the conductor 614 may be supplied to the conductor 613. For example, by supplying a constant potential to the conductor 613, the threshold voltage of the transistor 490 may be controlled. In other words, the conductor 613 can function as a second gate electrode.

<Transistor 491>

Next, the transistors 491 to 493 will be described.

The transistor 491 includes the following components: a channel formation region 407; the insulator 462 over the substrate 400; the conductor 454 over the insulator 462; an insulator 470 in contact with a side surface of the conductor 454; the region 476 positioned in the substrate 400 and overlapping with neither the conductor 454 nor the insulator 470; and a region 474 positioned in the substrate 400 and overlapping with the insulator 470. The region 476 is a low-resistance layer and preferably functions as a source or drain region of the transistor 491. The region 474 preferably functions as a lightly doped drain (LDD) region.

The transistor 491 may be either a p-channel transistor or an n-channel transistor, and an appropriate transistor is used depending on the circuit configuration or the driving method.

The substrate 400 preferably includes, for example, a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Alternatively, silicon having crystal lattice distortion may be contained. Alternatively, the transistor 491 may be a high-electron-mobility transistor (HEMT) with GaAs and AlGaAs or the like.

The region 476 preferably contains an element that imparts n-type conductivity, such as phosphorus, or an element that imparts p-type conductivity, such as boron.

The conductor 454 can be formed using a semiconductor material such as silicon containing the element that imparts n-type conductivity, such as phosphorus, or the element that imparts p-type conductivity, such as boron, or a conductive material such as a metal material, an alloy material, or a metal oxide material. It is particularly preferable to use a high-melting-point material that has both heat resistance and conductivity, such as tungsten or molybdenum, and it is particularly preferable to use tungsten.

The transistor 491 illustrated in FIG. 1 and FIG. 2 is an example in which element isolation is performed by a shallow trench isolation (STI) method or the like. Specifically, in FIG. 1, the transistor 491 is electrically isolated by element isolation using an element isolation region 460 that is formed in such a manner that an insulator including silicon oxide or the like is buried in a trench formed in the substrate 400 by etching or the like and then is partly removed by etching or the like.

In a projecting portion of the substrate 400 which is positioned in a region other than the trench, the regions 476 and 474 and the channel formation region 407 of the transistor 491 are provided. Furthermore, the transistor 491 includes the insulator 462 that covers the channel formation region 407 and the conductor 454 that overlaps with the channel formation region 407 with the insulator 462 positioned therebetween.

In the transistor 491, a side portion and an upper portion of the projecting portion in the channel formation region 407 overlap with the conductor 454 with the insulator 462 positioned therebetween, so that carriers flow in a wide area including the side portion and the upper portion of the channel formation region 407. Therefore, an area over the substrate occupied by the transistor 491 is reduced, and the number of transferred carriers in the transistor 491 is increased. As a result, the on-state current of the transistor 491 is increased and the field-effect mobility of the transistor 491 is increased. Suppose the length in the channel width direction (channel width) of the projecting portion in the channel formation region 407 is W, and the thickness of the projecting portion in the channel formation region 407 is T. When the aspect ratio (T/W) of the thickness T to the channel width W is high, a region where carriers flow becomes larger. Thus, the on-state current of the transistor 491 can be further increased and the field-effect mobility of the transistor 491 can be further increased.

Note that when the transistor 491 is formed using a bulk semiconductor substrate, the aspect ratio is desirably 0.5 or more, further desirably 1 or more.

Figure 34A:
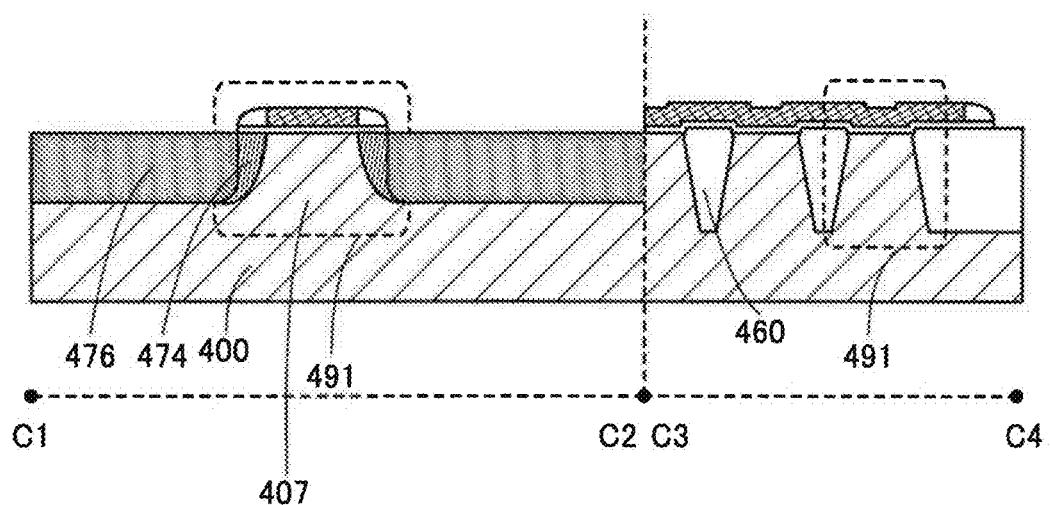
FIGS. 34A and 34B are cross-sectional views each illustrating an example of a transistor of one embodiment of the present invention.
Figure 34B:
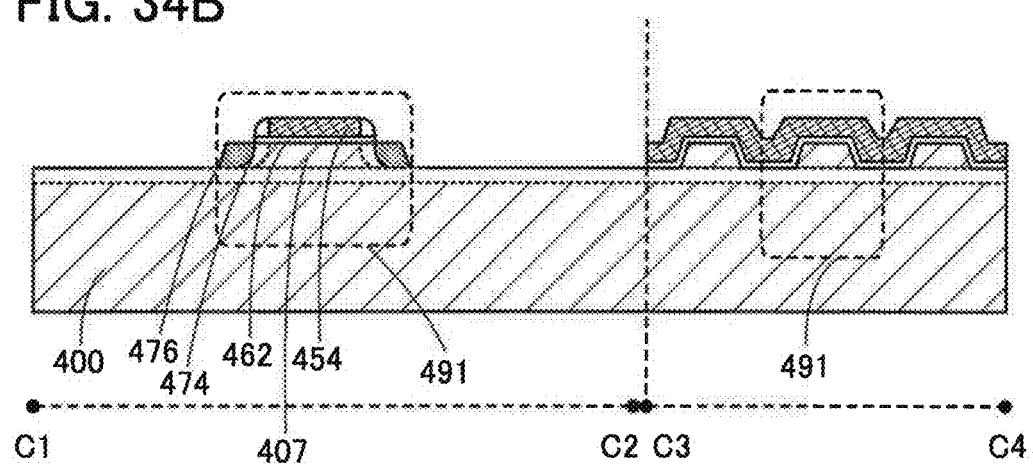

The transistor 491 does not necessarily include the projecting portion in the substrate 400 that is illustrated in FIG. 34A. As illustrated in FIG. 34B, the transistor 491 may be formed using a silicon on insulator (SOI) substrate.

For the transistor 492 and the transistor 493, the description of the transistor 491 may be referred to.

[Variations of Semiconductor Device]

An example of the structure of the semiconductor device 500 that is different from that shown in FIG. 1 is described.

Figure 8:
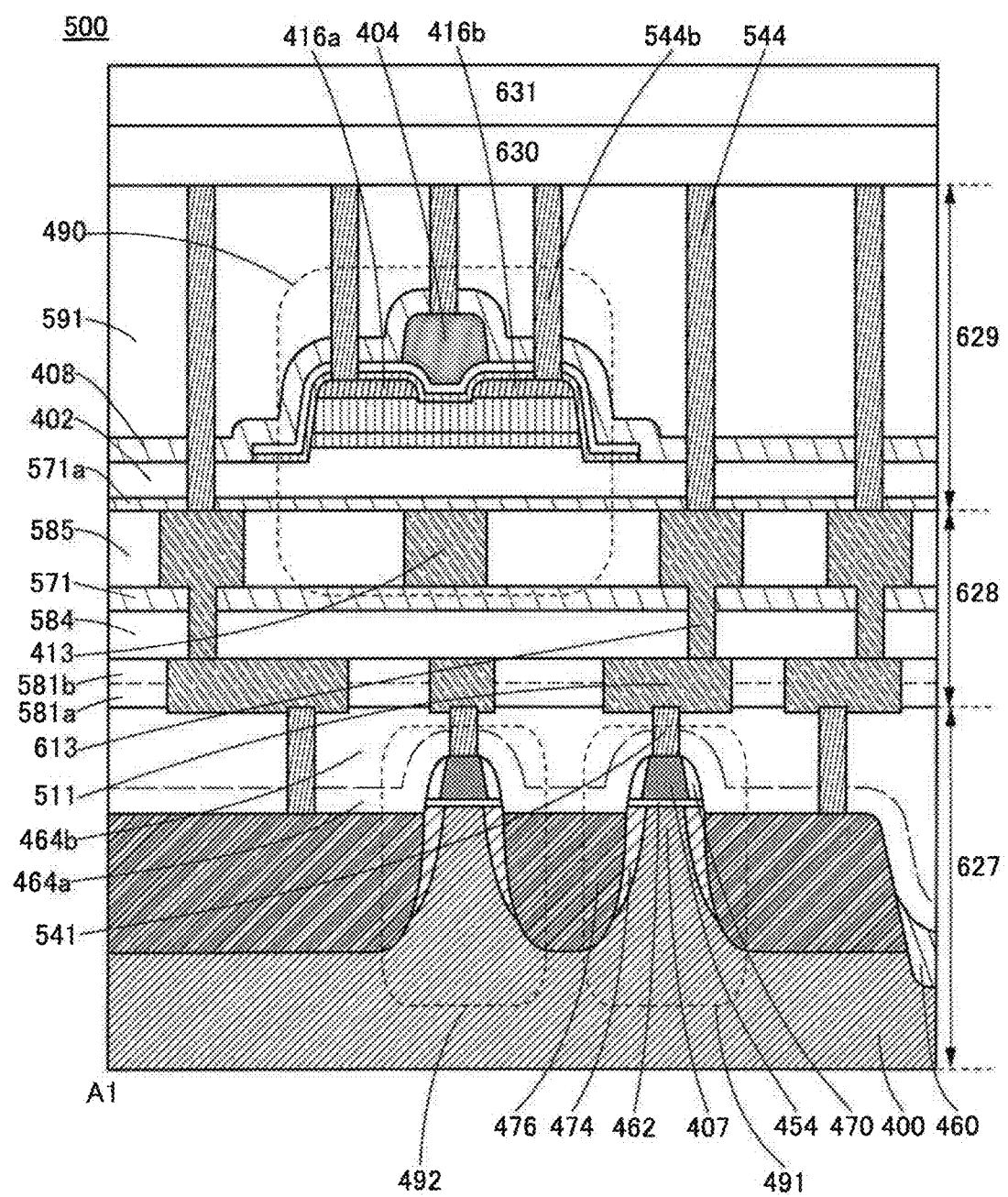
FIG. 8 is a cross-sectional view illustrating an example of a semiconductor device of one embodiment of the present invention.

FIG. 8 illustrates a cross section of the semiconductor device 500. The semiconductor device 500 shown in FIG. 8 includes the layers 627 to 631. The details of the layers 630 and 631 are omitted here for simplicity. The structure of the layer 628 in the semiconductor device 500 shown in FIG. 8 is different from that in the semiconductor device 500 shown in FIG. 1.

The layer 628 shown in FIG. 1 includes the conductor 513 over the plug 543. The conductor 513 functions as a wiring, for example. The conductor 613 shown in FIG. 8 functions as both the plug 543 and the conductor 513. In other words, the conductor 613 has a structure in which the plug 543 is integrated with the conductor 513. In the semiconductor device 500, the level of a bottom surface of the conductor 511 may be below the level of a top surface of the insulator 464b as shown in FIG. 4 and FIG. 8.

Figure 9A:
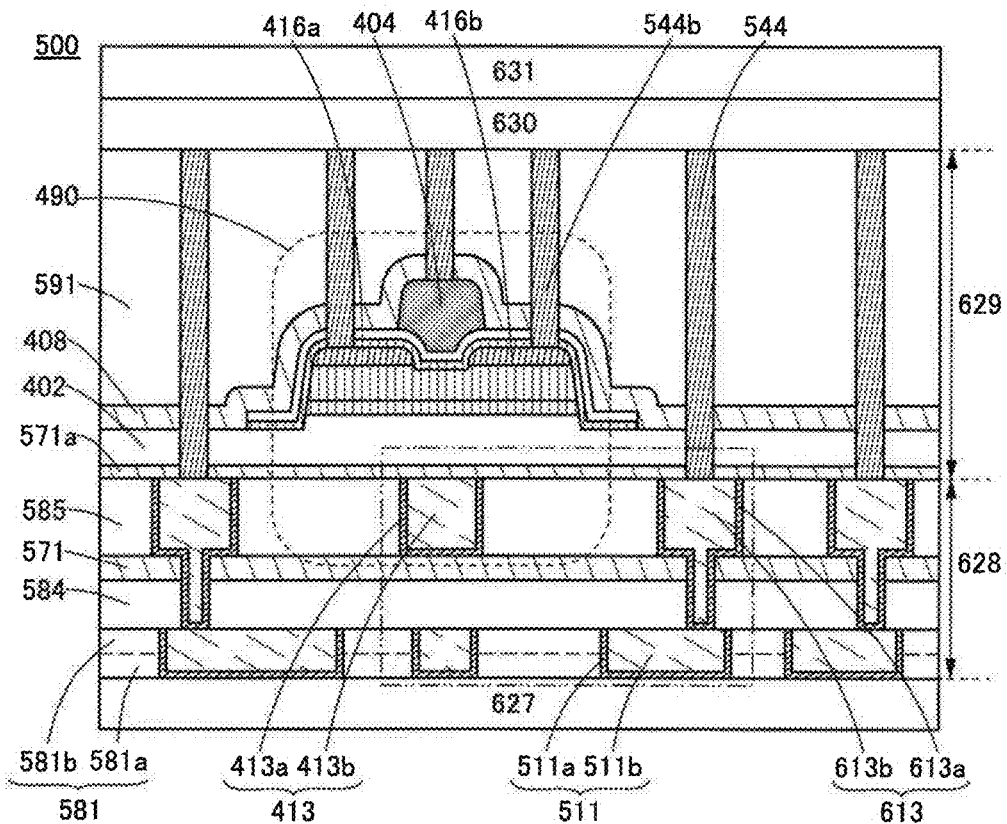
FIGS. 9A and 9B are cross-sectional views illustrating an example of a semiconductor device of one embodiment of the present invention.
Figure 9B:
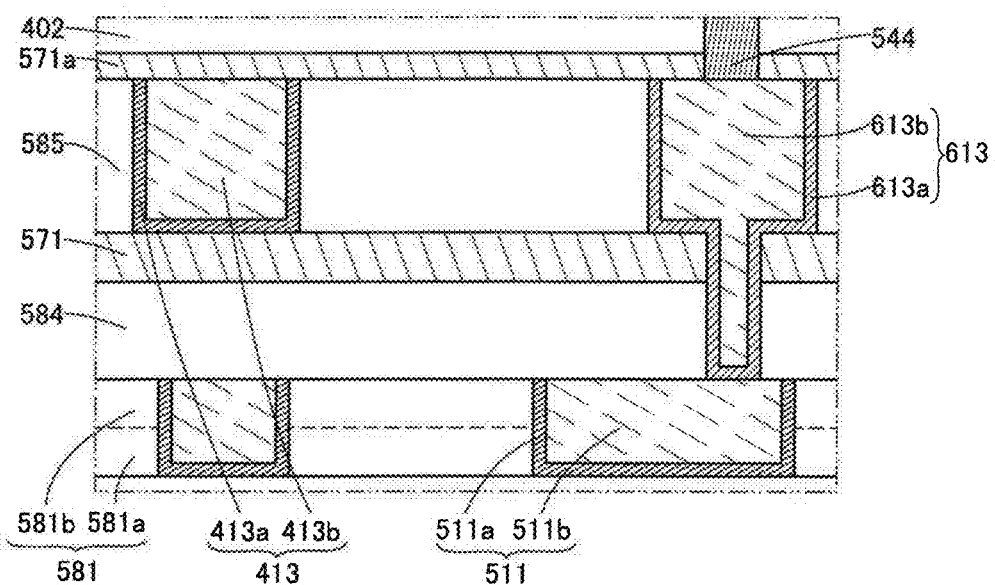

The conductors such as the conductor 613 may have a stacked-layer structure of a plurality of conductors, e.g., a stacked-layer structure of a conductor 613a and a conductor 613b. FIG. 9A shows an example in which the conductor 613 in FIG. 8 has a stacked-layer structure of the conductor 613a and the conductor 613b. A region surrounded by dashed-dotted line in FIG. 9A is shown in FIG. 9B.

The description of the conductor 513, the conductor 513a, and the conductor 513b can be referred to for the materials used as the conductor 613, the conductor 613a, and the conductor 613b, respectively.

Figure 10:
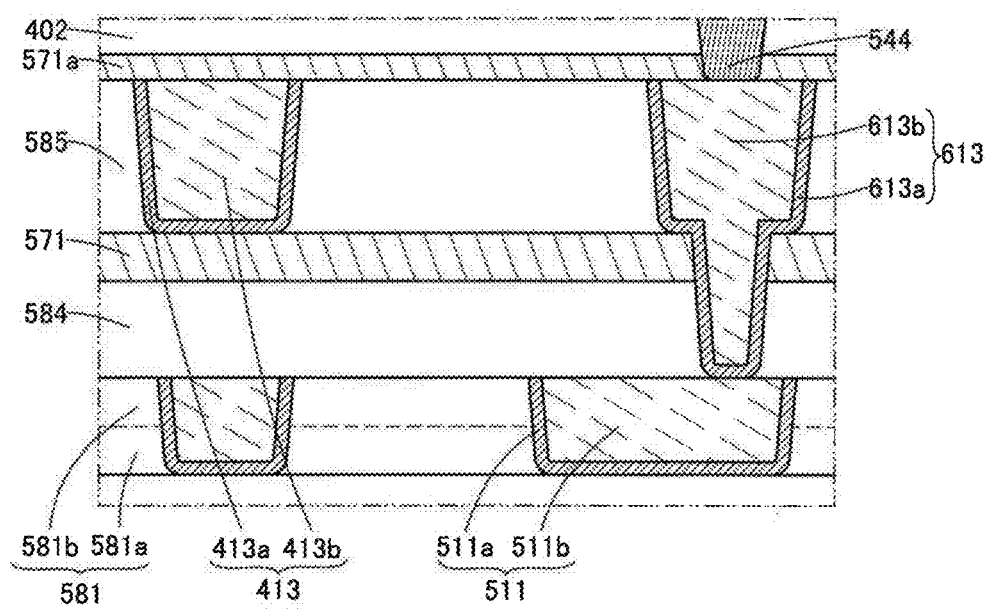
FIG. 10 is a cross-sectional view illustrating an example of a semiconductor device of one embodiment of the present invention.

The conductors and the plug such as the conductor 513, the plug 543, and the conductor 613 may have a rounded shape. FIG. 10 shows an example in which, in the cross section shown in FIG. 9B, the conductor 613 and the like have rounded corners.

Figure 11:
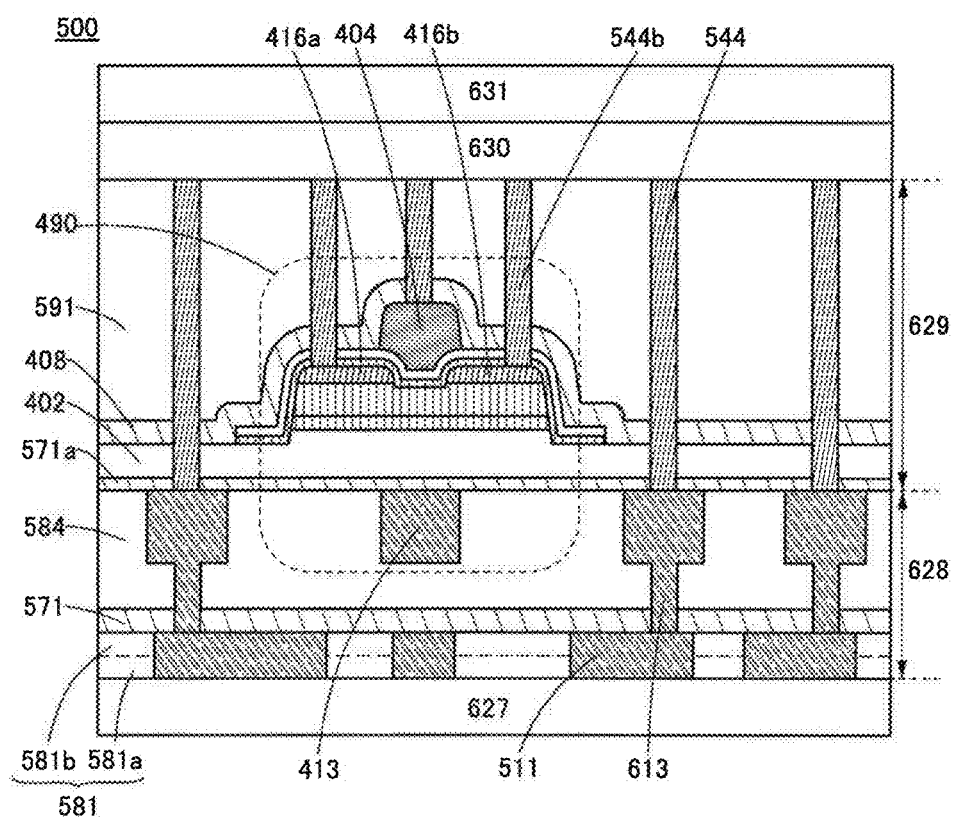
FIG. 11 is a cross-sectional view illustrating an example of a semiconductor device of one embodiment of the present invention.

The semiconductor device 500 may have a structure in which the insulator 571 is formed over the insulator 581 and the insulator 584 is formed over the insulator 571 as shown in FIG. 11.

Figure 12:
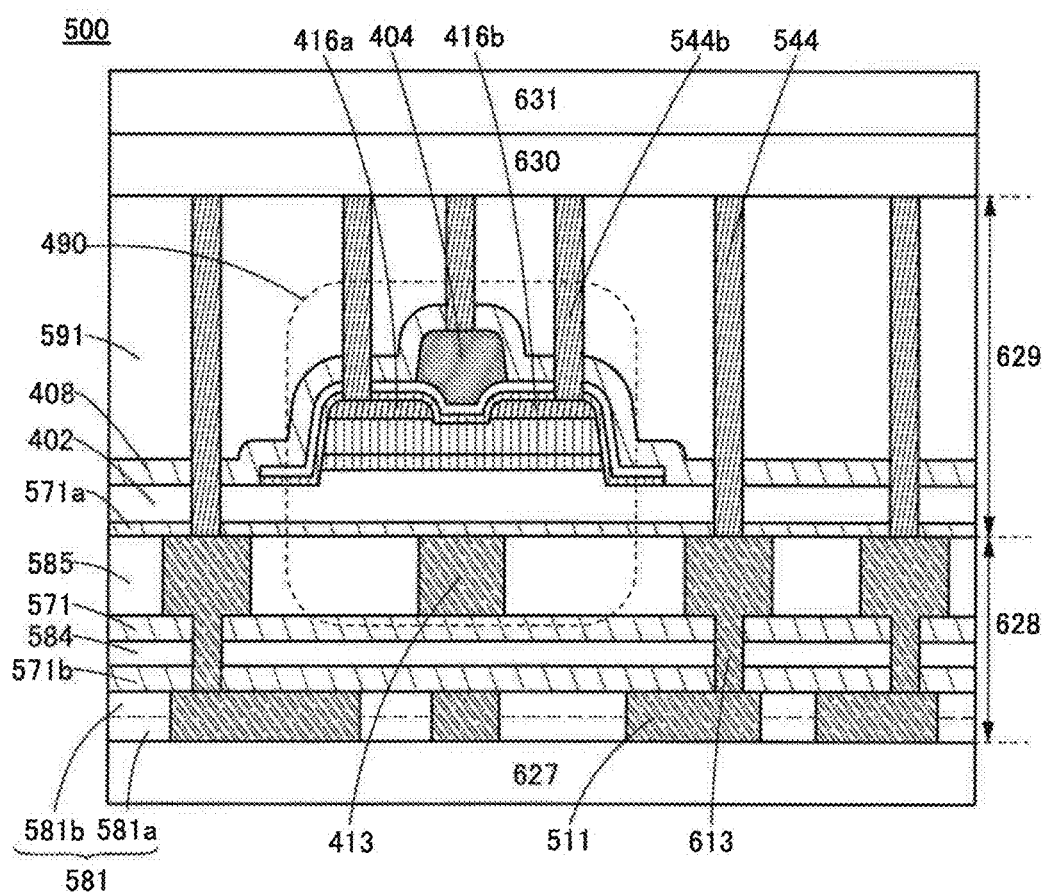
FIG. 12 is a cross-sectional view illustrating an example of a semiconductor device of one embodiment of the present invention.

The semiconductor device 500 may have a structure in which an insulator 571b is formed over the insulator 581, the insulator 584 is formed over the insulator 571b, and the insulator 571 is formed over the insulator 584 as shown in FIG. 12. For the insulator 571b, the description of the insulator 571 is referred to.

In the case where the dielectric constant of the insulator 571b is higher than that of the insulator 584, the thickness of the insulator 571b is preferably smaller than that of the insulator 584. The thickness of the insulator 571b is preferably greater than or equal to 5 nm and less than or equal to 200 nm, more preferably greater than or equal to 5 nm and less than or equal to 60 nm, and the thickness of the insulator 584 is preferably greater than or equal to 30 nm and less than or equal to 800 nm, more preferably greater than or equal to 50 nm and less than or equal to 500 nm, for example. The thickness of the insulator 571b is preferably less than or equal to one-third of the thickness of the insulator 584, for example.

Figure 13:
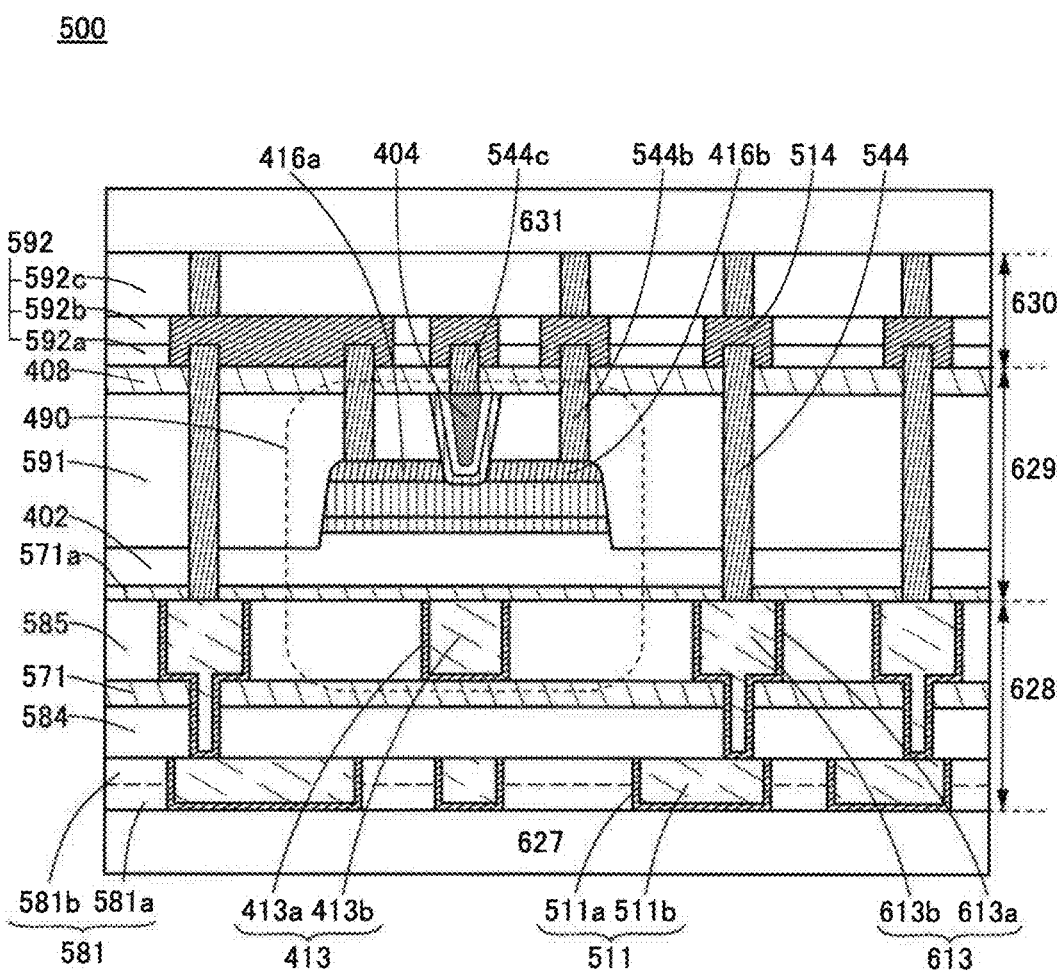
FIG. 13 is a cross-sectional view illustrating an example of a semiconductor device of one embodiment of the present invention.

FIG. 13 shows an example in which the structure shown in FIGS. 6A and 6B is used for the transistor 490 in the semiconductor device 500.

The semiconductor device 500 shown in FIG. 13 includes the layers 627 to 631. The details of the layers 627 and 631 are omitted here. For the layer 628, the description of FIGS. 9A and 9B and the like can be referred to.

In the examples shown in FIG. 1 and the like, the insulator 408 is formed over the transistor 490, and the insulator 591 is formed over the insulator 408 in the layer 629. In addition, a top surface of the insulator 591 is planarized. In FIG. 13, the insulator 591 covers at least part of the transistor 490, and the insulator 408 is formed over the insulator 591 having the planarized top surface.

The semiconductor device 500 shown in FIG. 13 includes the layer 630 over the insulator 408. The layer 630 includes the insulator 592 over the insulator 408. The insulator 592 includes an insulator 592a, an insulator 592b over the insulator 592a, and an insulator 592c over the insulator 592b. In FIG. 13, it is preferable that the plug 544 and the plug 544b have portions projecting above the insulator 408 and the conductor 514 and the like be positioned on the tops and sides of the projecting portions. In addition, it is preferable that the conductor 514 and the like be formed to embed the plug 544 and the plug 544b. Over the conductor 514 or the like, a plug connected to a conductor or the like in the layer 631 is formed to embed a plug 544c.

The semiconductor device 500 shown in FIG. 13 includes the plug 544c over and in contact with the conductor 404 included in the transistor 490. The plug 544c includes a portion projecting above the insulator 408, and a conductor is provided on the top and side of the projecting portion.

The insulator 408 is preferably formed over a planarized surface because, in some cases, the insulator 408 can have a higher coverage and lower hydrogen permeability, for example. Moreover, in some cases, the insulator 408 can be formed thin because the block property of the insulator 408 is improved.

<Capacitor>

Figure 14:
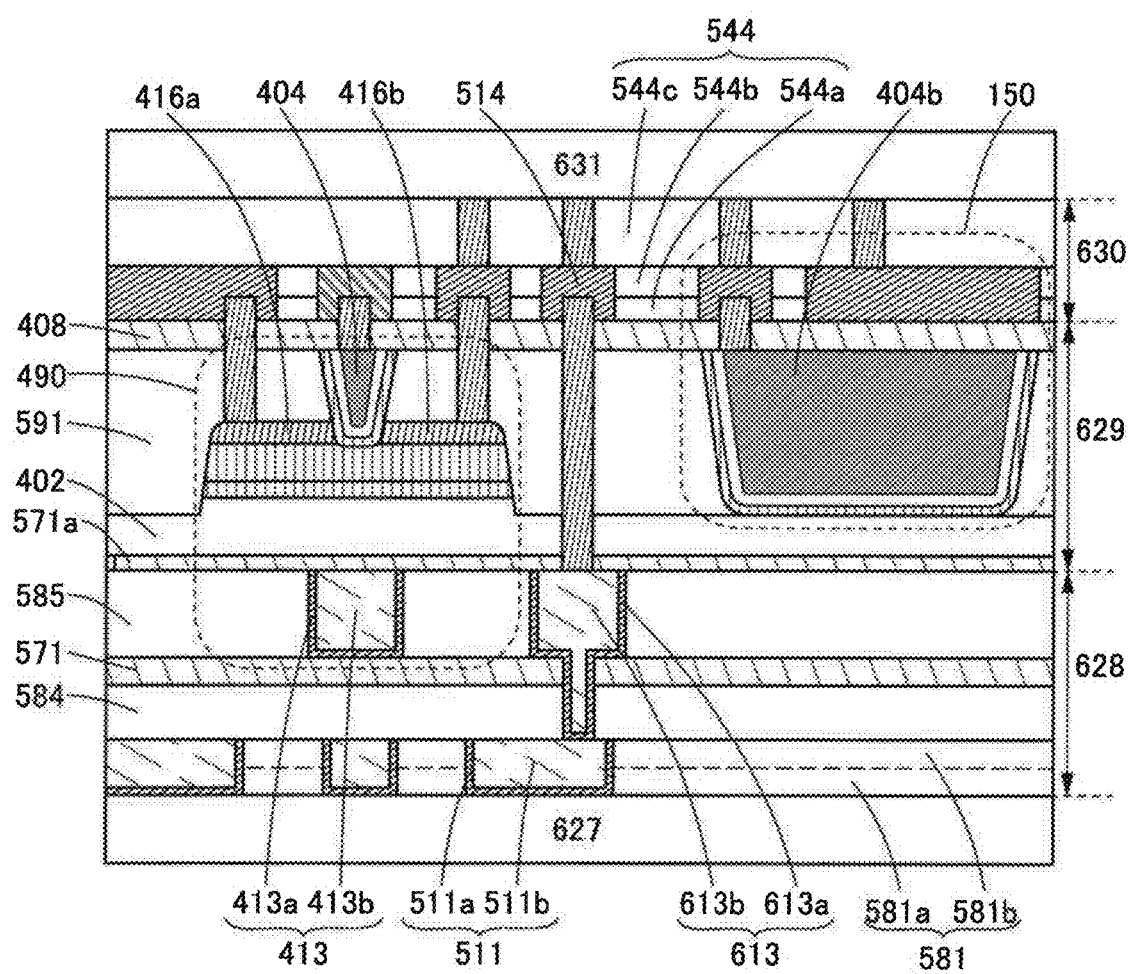
FIG. 14 is a cross-sectional view illustrating an example of a semiconductor device of one embodiment of the present invention.

In an example shown in FIG. 14, the capacitor 150 is provided adjacent to the transistor 490 shown in FIG. 13. A conductor 404b formed in an opening in the insulator 591 is used as one electrode of the capacitor 150, the insulator 408 is used as a dielectric of the capacitor 150, and a conductor over the insulator 408 is used as the other electrode of the capacitor 150. The conductor 404b can be formed in the same step as that for forming the conductor 404.

Figure 15A:
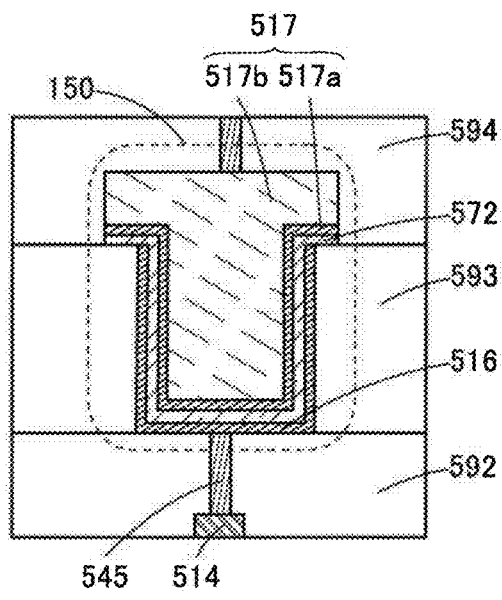
FIGS. 15A to 15C are cross-sectional views illustrating examples of a capacitor of one embodiment of the present invention.
Figure 15B:
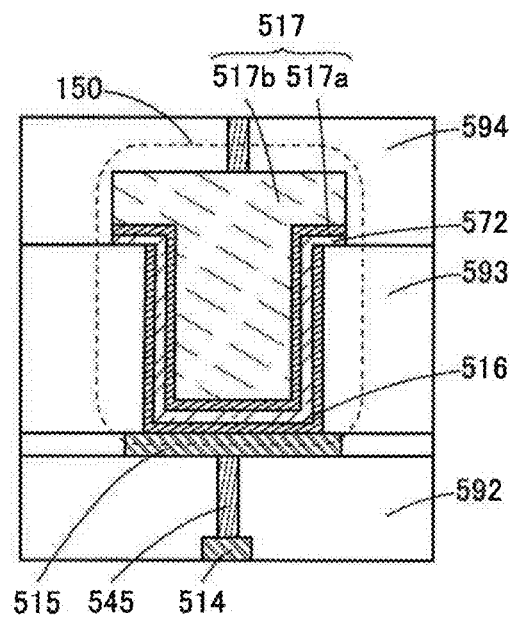
Figure 15C:
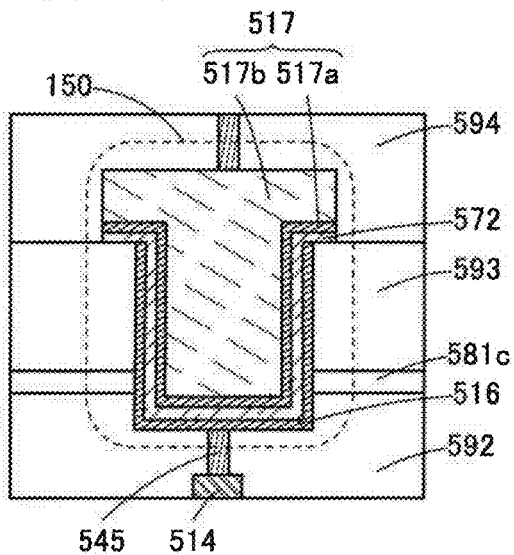

Instead of the capacitor 150 shown in FIG. 1, any of structures shown in FIGS. 15A to 15C can be used.

The capacitor 150 shown in FIG. 15A includes the following components: the insulator 592; the conductor 514; the plug 545; a conductor 516 over the insulator 592 and the plug 545; the insulator 572 over the conductor 516; and the conductor 517 over the insulator 572. For the insulator 592, the conductor 514, and the plug 545, the description of FIG. 1 may be referred to. The conductor 517 may be formed of two layers of a conductor 517a and a conductor 517b as shown in FIGS. 15A to 15C. For the conductor 517a and the conductor 517b, the description of the conductor 511a and the conductor 511b may be referred to, for example.

In the capacitor 150 shown in FIG. 15A, the conductor 516 is formed in a depressing portion in an insulator 593. Films to be the insulator 572 and the conductor 517a are formed over the conductor 516 and the insulator 593, a film to be the conductor 517b is formed to fill the depressing portion, and then, the conductor 517b, the conductor 517a, and the insulator 572 are formed using a mask.

The capacitor 150 shown in FIG. 15B differs from that shown in FIG. 15A in including a conductor 515 between the conductor 516 and the plug 545.

As shown in FIG. 15C, the conductor 516 and the like may be formed in a depressing portion in the insulator 592. In FIG. 15C, the insulator 592 is in contact with the bottom and a part of the side of the conductor 516. The insulator 593 is in contact with the side of the conductor 516. As shown in FIG. 15C, an insulator 581c may be provided between the insulator 592 and the insulator 593. For the insulator 581c, the description of the insulator 581a or the like may be referred to, for example.

[Method for Manufacturing Semiconductor Device]

Next, a method for manufacturing a semiconductor device of one embodiment of the present invention is described with reference to FIGS. 16A to 16E, FIGS. 17A to 17D, FIGS. 18A to 18C, FIGS. 19A and 19B, FIGS. 20A to 20C, FIGS. 21A to 21C, FIGS. 22A to 22D, FIGS. 23A to 23C, FIGS. 24A and 24B, FIGS. 25A to 25C, and FIGS. 26A and 26B.

A method for manufacturing the semiconductor device 500 illustrated in FIG. 1 is described with reference to FIGS. 16A to 16E, FIGS. 17A to 17D, FIGS. 18A to 18C, and FIGS. 19A and 19B. Here, a method for manufacturing the layers 628 to 630 is described.

The insulator 581 is formed over the layer 627. Then, a mask 207 is formed over the insulator 581 (see FIG. 16A). The mask 207 may be formed by, for example, a lithography method with the use of a resist. Alternatively, a hard mask formed of an inorganic film or a metal film may be used.

Figure 16A:
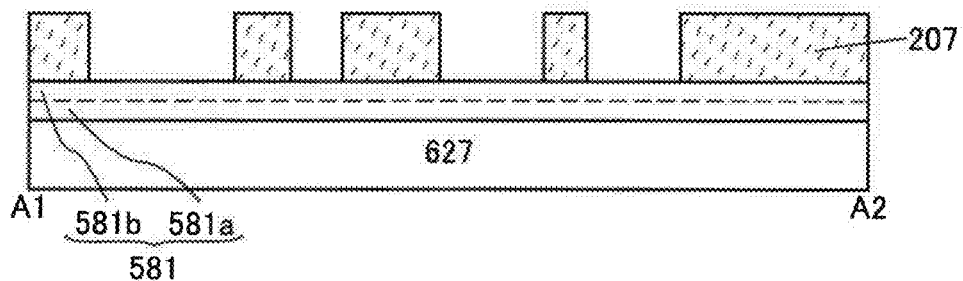
FIGS. 16A to 16E are cross-sectional views illustrating an example of a method for manufacturing a semiconductor device of one embodiment of the present invention.
Figure 16B:
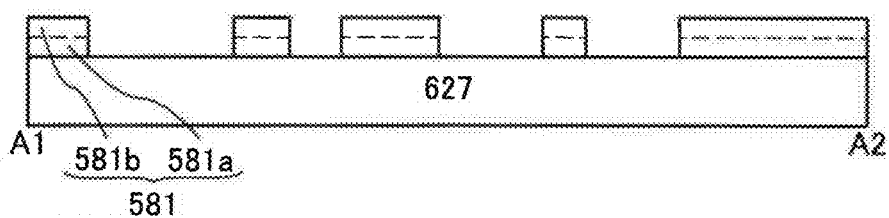
Figure 16C:
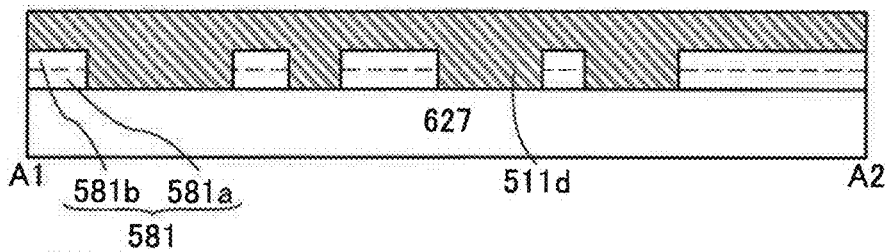
Figure 16D:
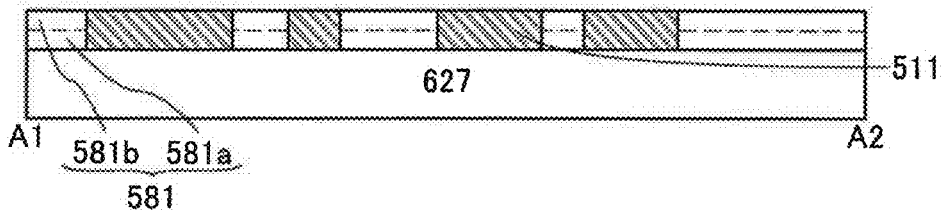

Then, a part of the insulator 581 is etched with the use of the mask 207 to form openings (see FIG. 16B). After the mask 207 is removed, a conductor 511d is formed in the openings and over the insulator 581 (see FIG. 16C).

Then, a surface of the conductor 511d is planarized (the conductor 511d is partly removed), so that the insulator 581 is exposed. Thus, the conductors such as the conductor 511 are formed (see FIG. 16D). For the removal of the conductor 511d, a polishing method such as a chemical mechanical polishing (CMP) method is preferably used, for example. Alternatively, dry etching may be used. For example, a method such as etch-back may be used. When a polishing method such as a CMP method is used, the polishing rate of the conductor 511d might have a distribution in the plane of a sample. In this case, in a region where the polishing rate is high, a period during which the insulator 581 is exposed might be long. The polishing rate of the insulator 581 is preferably lower than that of the conductor 511d. The low polishing rate of the insulator 581 allows it to serve as a polishing stopper film in the polishing step of the conductor 511d, and further can increase the planarity of a surface of the insulator 581.

Here, the CMP method is a method in which a surface of an object to be processed is planarized by a combination of chemical and mechanical actions. In general, the CMP treatment is treatment in which a polishing cloth is attached to a polishing stage, the polishing stage and the object to be processed are each rotated or swung while a slurry (abrasive) is supplied between the object to be processed and the polishing cloth, and the surface of the object to be processed is polished by chemical reaction of the slurry and the surface of the object to be processed and by action of mechanical polishing of the object to be processed with the polishing cloth.

As the polishing cloth for the CMP method, for example, polyurethane foam, nonwoven fabric, suede, or the like can be used. As abrasive particles, for example, silica (silicon oxide), cerium oxide, manganese oxide, aluminum oxide, or the like can be used. As silica, for example, fumed silica or colloidal silica can be used.

The pH of the slurry used for the CMP method may be adjusted in view of removability of the object to be processed or stability of the slurry solution. For example, in the case where acidic slurry is used, the insulator 581 serving as the stopper film preferably has high resistance to acid. Alternatively, in the case where alkaline slurry is used, the insulator 581 preferably has high resistance to alkali.

As an oxidizer in the slurry, for example, hydrogen peroxide or the like may be used.

Here, an example of the case where the conductor 511d contains tungsten and the insulator 581 contains silicon oxide is described. In the slurry, fumed silica or colloidal silica, for example, is preferably used as the abrasive particles. For example, acidic slurry is preferably used, and, for example, aqueous hydrogen peroxide is preferably used as an oxidizer.

Figure 16E:
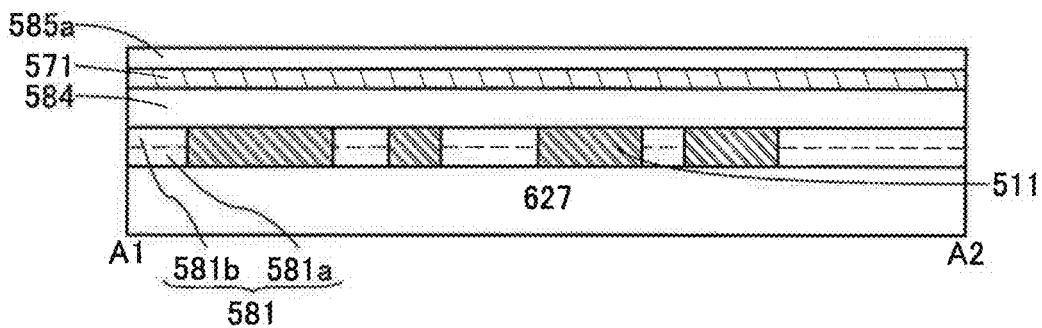

Next, the insulator 584 is formed over the insulator 581 and the conductor 511, the insulator 571 is formed over the insulator 584, and an insulator 585a is formed over the insulator 571 (see FIG. 16E). Note that in the example shown in FIGS. 16A to 16E, FIGS. 17A to 17D, FIGS. 18A to 18C, and FIGS. 19A and 19B, the insulator 585 has a stacked-layer structure of the insulator 585a and an insulator 585b. The insulator 585a and the insulator 585b may be formed using either the same material or different materials.

The insulator 571 can be formed by a sputtering method, a CVD method (including a thermal CVD method, an MOCVD method, a PECVD method, and the like), an MBE method, an ALD method, a PLD method, or the like. Here, as the insulator 571, aluminum oxide is formed by a sputtering method.

Figure 17A:
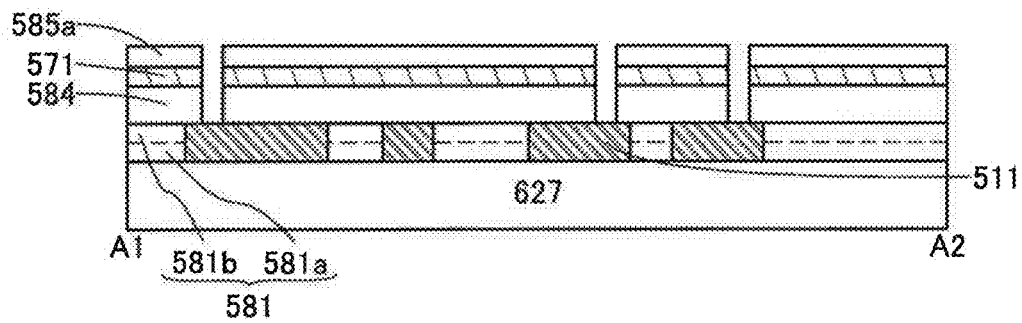
FIGS. 17A to 17D are cross-sectional views illustrating the example of the method for manufacturing the semiconductor device of one embodiment of the present invention.
Figure 17B:
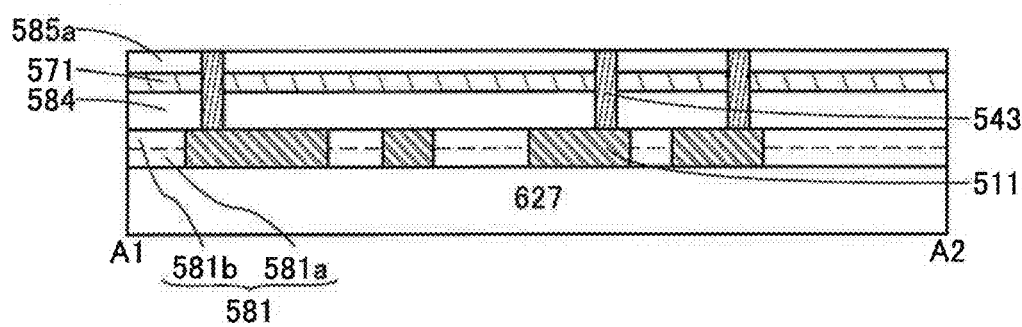

Next, a mask is formed over the insulator 585a, and openings are formed in the insulator 585a, the insulator 571, and the insulator 584 (see FIG. 17A). After the mask is removed, a conductor is formed in the openings and over the insulator 585a, and the conductor is removed such that a surface of the conductor is planarized. Thus, the plugs such as the plug 543 are formed (see FIG. 17B). Here, as an example, the plug 543 and the like are each formed of a layer including tungsten and the insulator 585a is formed of a layer including silicon oxide. Thus, the etching rate of the insulator 585a can be low when the conductor to be the plug 543 is removed by a CMP method. Accordingly, the planarity of a surface of the insulator 585a can be improved. Moreover, the variation in the height of the plugs such as the plug 543 can be reduced in some cases.

Figure 17C:
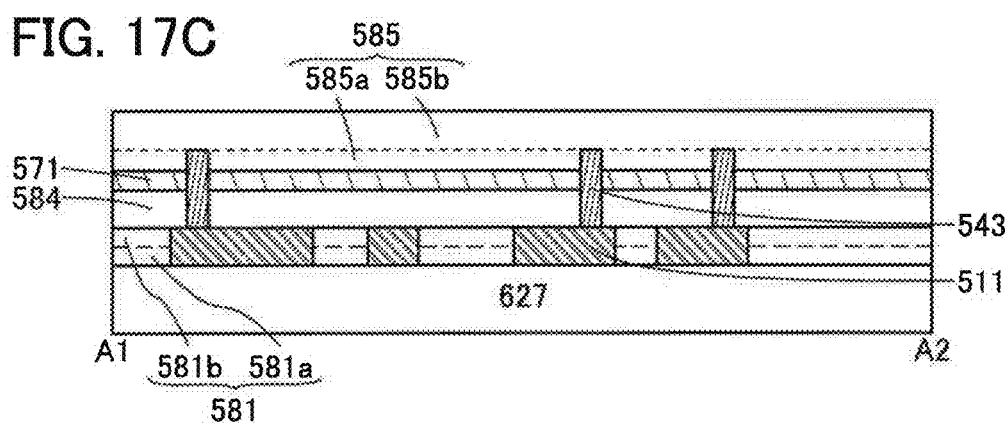
Figure 17D:
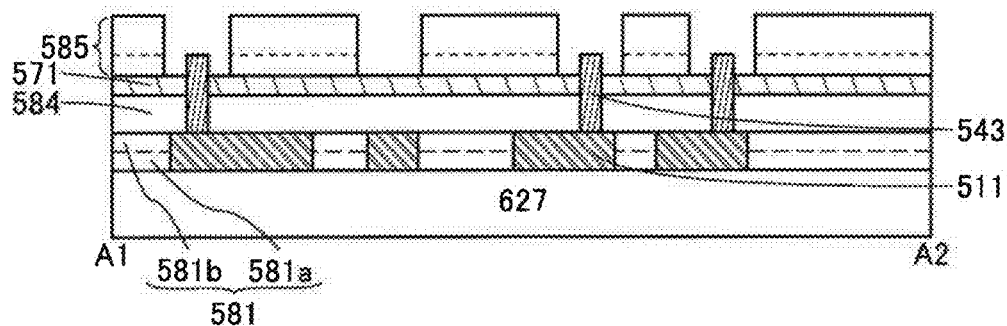

Then, the insulator 585b is formed over the insulator 585a and the plug 543, and the insulator 585 is formed (see FIG. 17C). After that, a mask is formed over the insulator 585, and openings are formed in the insulator 585 using the mask (see FIG. 17D). A dry etching method, a wet etching method, or the like can be used for forming the openings in the insulator 585, for example. In the case where the etching rate of the plug 543 is lower than that of the insulator 585 when the openings are formed, projecting portions of the plugs such as the plug 543 are formed in the openings as shown in FIG. 17D.

After the mask is removed, a conductor is formed in the openings of the insulator 585 and over the insulator 585, and the conductor is removed such that a surface of the conductor is planarized. Thus, conductors such as the conductor 513 and the conductor 413 are formed. Then, the insulator 571a is formed (see FIG. 18A). For a formation method of the insulator 571a, the description of the insulator 571 may be referred to.

The transistor 490 is formed over the insulator 571a. First, the insulator 402 is formed. Then, a first oxide to be the oxide layer 406a is formed, and a second oxide to be the oxide layer 406b is formed over the first oxide. After that, a first conductor to be the conductor 416a and the like is formed. The first oxide and the second oxide are processed using the first conductor as a hard mask, so that the oxide layer 406a and the oxide layer 406b are formed. The processing may be performed by dry etching, for example.

The first conductor is processed, so that the conductor 416a and the conductor 416b are formed. After that, the oxide layer 406c and the insulator 412 are formed, followed by the formation of the conductor 404. Thus, the transistor 490 is manufactured.

The insulator 402 may be formed to contain excess oxygen. Alternatively, oxygen may be added after the insulator 402 is formed. The addition of oxygen may be performed by an ion implantation method at an acceleration voltage of higher than or equal to 2 kV and lower than or equal to 100 kV and at a dose of greater than or equal to $5 \times 10^{14}$ ions/cm$^2$ and less than or equal to $5 \times 10^{16}$ ions/cm$^2$, for example.

Oxygen may be added after the first oxide to be the oxide layer 406a is formed.

Heat treatment may be performed after the second oxide to be the oxide layer 406b is formed. The heat treatment here may be performed at a temperature higher than or equal to 250° C. and lower than or equal to 650° C., preferably higher than or equal to 300° C. and lower than or equal to 500° C., more preferably higher than or equal to 350° C. and lower than or equal to 450° C., for example. The heat treatment is performed in an inert gas atmosphere or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. By the heat treatment, crystallinity of the oxide layer 406a and crystallinity of the oxide layer 406b can be increased and impurities such as hydrogen and water can be removed, for example. Here, by the heat treatment, hydrogen or water is released from a material in a layer under the insulator 402 and diffused to the oxide layer 406b in some cases.

To form films to be the oxide layer 406a, the oxide layer 406b, and the oxide layer 406c, a sputtering method, a CVD method, an MBE method, a PLD method, an ALD method, or the like can be used, for example. In the case where In—Ga—Zn oxide layers are formed by an MOCVD method as the films to be the oxide layer 406a, the oxide layer 406b, and the oxide layer 406c, trimethylindium, trimethylgallium, dimethylzinc, and the like may be used as source gases. The source gases are not limited to the combination of these gases, triethylindium or the like may be used instead of trimethylindium. Triethylgallium or the like may be used instead of trimethylgallium. Diethylzinc or the like may be used instead of dimethylzinc. As a dry etching gas for the oxide layer 406a, the oxide layer 406b, and the oxide layer 406c, a mixed gas of methane (CH$_4$) and argon (Ar), or the like can be used, for example.

Figure 18A:
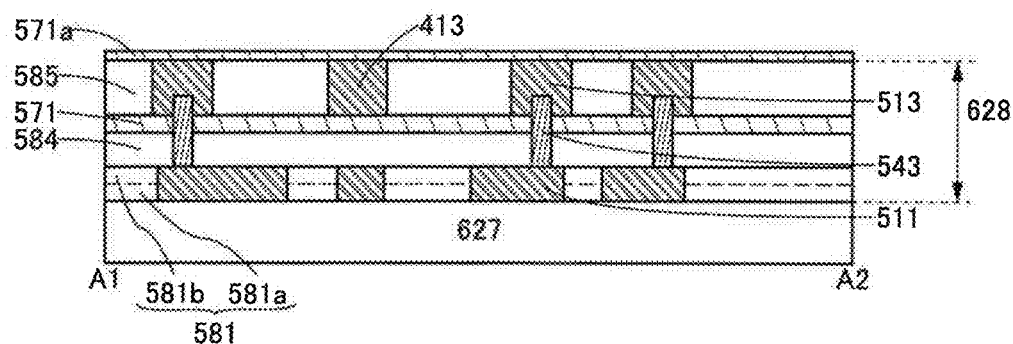
FIGS. 18A to 18C are cross-sectional views illustrating the example of the method for manufacturing the semiconductor device of one embodiment of the present invention.
Figure 18B:
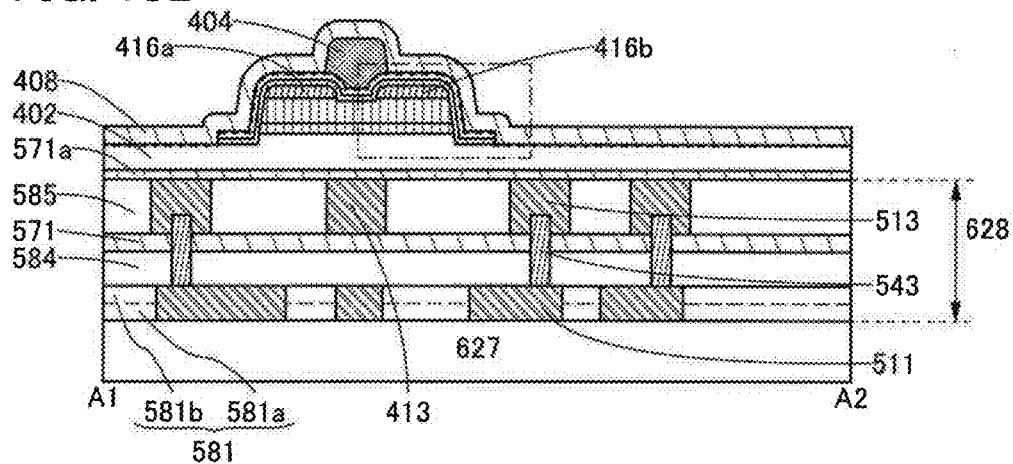
Figure 18C:
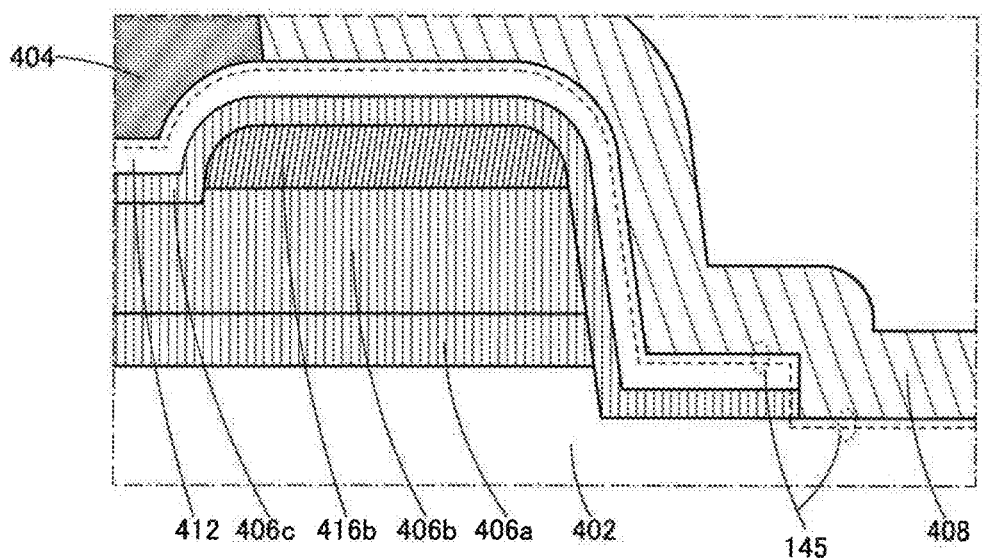
Figure 19A:
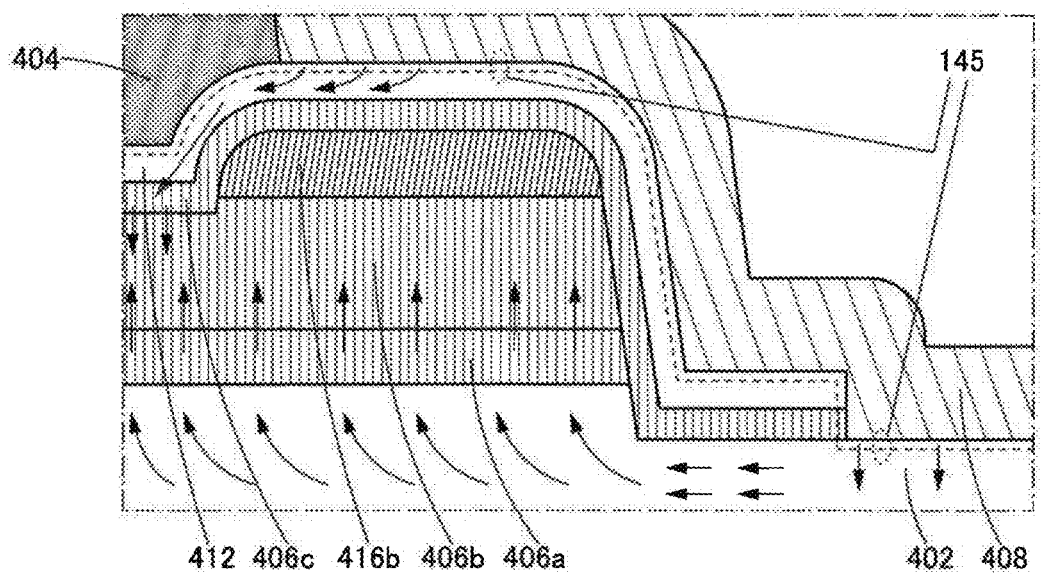
FIGS. 19A and 19B are cross-sectional views illustrating the example of the method for manufacturing the semiconductor device of one embodiment of the present invention.
Figure 19B:
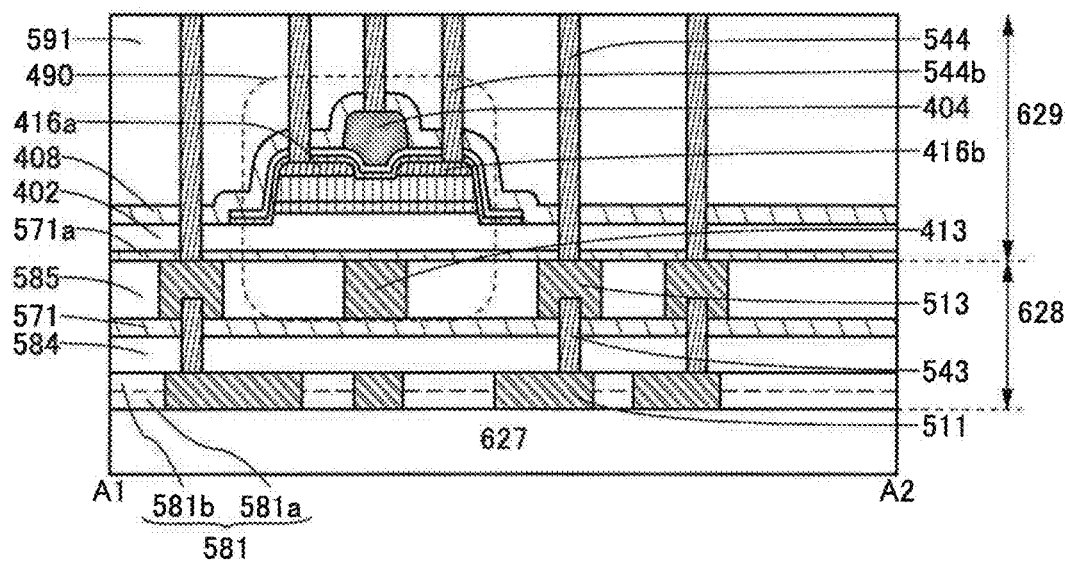

Next, the insulator 408 is formed over the transistor 490 (see FIG. 18B). For a formation method of the insulator 408, the description of the insulator 571 can be referred to. FIG. 18C is an enlarged view of a region surrounded by dashed-dotted line in FIG. 18B.

The insulator 408 is preferably formed by, for example, a sputtering method, so that a mixed layer is formed at and near the interface between the insulator 408 and a surface where the insulator 408 is formed. In the mixed layer, the insulator 408 and the surface where the insulator 408 is formed are mixed. Specifically, a mixed layer 145 is formed at and near the interface between the insulator 408 and the insulator 402 and the interface between the insulator 408 and the insulator 412.

In this embodiment, an aluminum oxide formed by a sputtering method is used for the insulator 408. In addition, a gas containing oxygen is used as a sputtering gas. Furthermore, the mixed layer 145 contains part of the sputtering gas. In this embodiment, a gas containing oxygen is used as the sputtering gas; therefore, the mixed layer 145 contains oxygen. Thus, the mixed layer 145 contains excess oxygen.

Next, heat treatment is performed. The heat treatment is preferably performed at a temperature higher than or equal to 200° C. and lower than or equal to 500° C., more preferably higher than or equal to 300° C. and lower than or equal to 450° C., and further preferably higher than or equal to 350° C. and lower than or equal to 400° C.

Oxygen contained in the mixed layer 145 is diffused by the heat treatment. Excess oxygen contained in the mixed layer 145 is diffused to the oxide layers 406a, 406b, and 406c through the insulator 402, the insulator 412, or the like. When a material that is less likely to transmit oxygen is used for the insulator 408, the insulator 571, and the insulator 571a, the excess oxygen contained in the mixed layer 145 is effectively diffused to the oxide layers 406a, 406b, and 406c through the insulator 402, the insulator 412, or the like. A state of diffusion of the excess oxygen contained in the mixed layer 145 is shown by the arrows in FIG. 19A. The transfer of excess oxygen to the oxide layer 406b or the like causes a reduction of defects (oxygen vacancies) in the oxide layer 406b or the like.

Then, the insulator 591 is formed over the insulator 408. After that, openings are formed in the insulator 591, the insulator 408, the insulator 402, and the insulator 571a, and plugs such as the plug 544 and the plug 544b are formed in the openings (see FIG. 19B). Then, the layer 630 and the layer 631 are formed. Thus, the semiconductor device 500 shown in FIG. 1 can be manufactured.

Next, a formation method of the layer 628 in the semiconductor device 500 including the conductor 613 as shown in FIG. 8, FIGS. 9A and 9B, and the like is described with reference to FIGS. 20A to 20C and FIGS. 21A to 21C. Here, a manufacturing method of the semiconductor device 500 shown in FIGS. 9A and 9B is described as an example.

First, the insulator 581, the conductor 511, and the like are formed over the layer 627. Then, the insulator 584 is formed over the insulator 581, the insulator 571 is formed over the insulator 584, and the insulator 585 is formed over the insulator 571. After that, a mask is formed over the insulator 585, and openings are formed in the insulator 585 using the mask (see FIG. 20A). Here, the etching rate of the insulator 571 is preferably lower than that of the insulator 585 when the openings are formed in the insulator 585, so that the amount of a reduction in film thickness of the insulator 571 can be reduced. Thus, when openings are formed in the insulator 571 and the insulator 584, etching time is easily controlled in some cases and time for exposing the conductor 511 can be shortened in some cases. After that, the mask is removed.

Figure 20A:
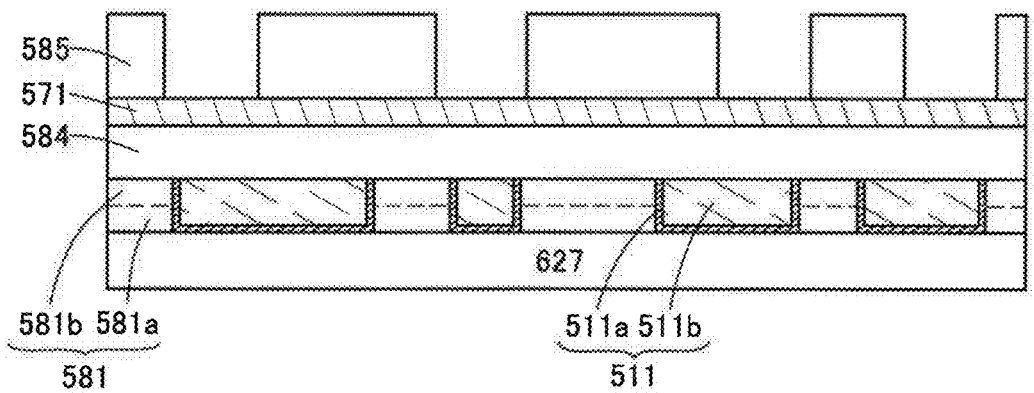
FIGS. 20A to 20C are cross-sectional views illustrating an example of a method for manufacturing a semiconductor device of one embodiment of the present invention.
Figure 20B:
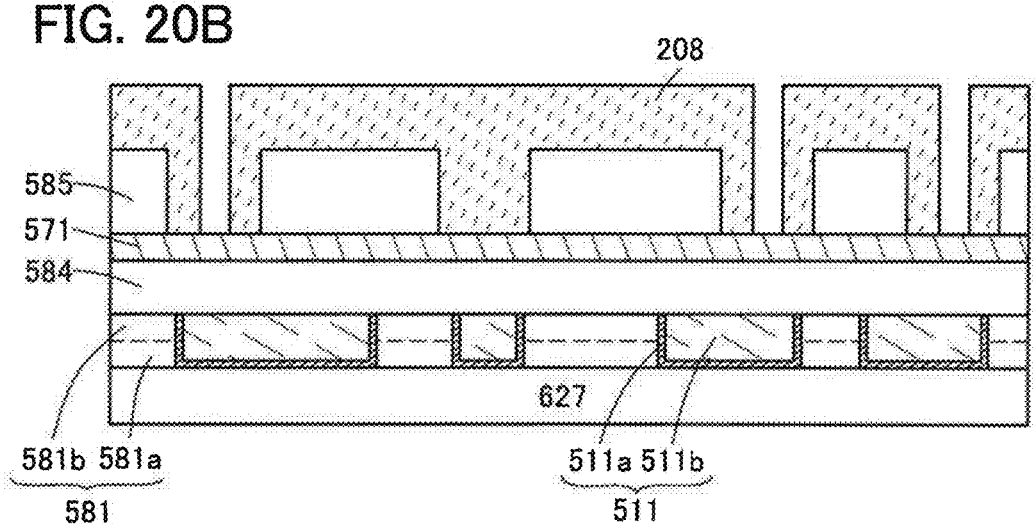

Next, a mask 208 is formed over the insulator 585 and the insulator 571 under the openings of the insulator 585 (see FIG. 20B). In the case where the etching rate of the insulator 571 is lower than that of the insulator 584, the insulator 571 functions as a hard mask for etching the insulator 584 in some cases.

Figure 20C:
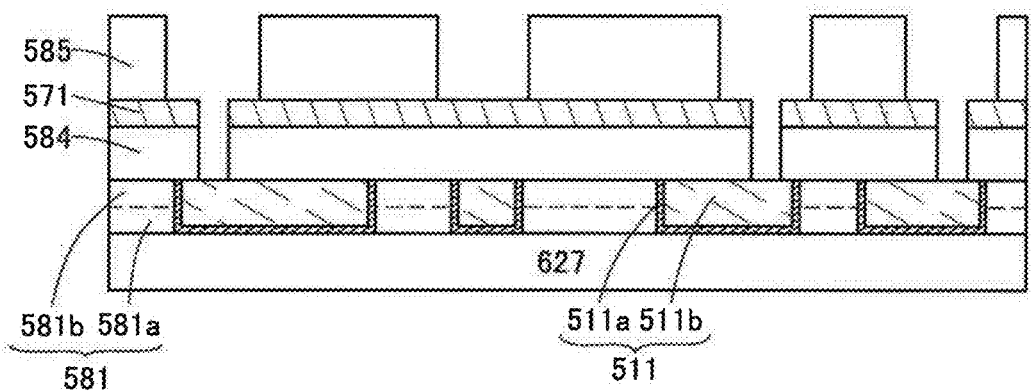

Next, the insulator 571 and the insulator 584 are etched using the mask 208 to form openings (see FIG. 20C).

Figure 21A:
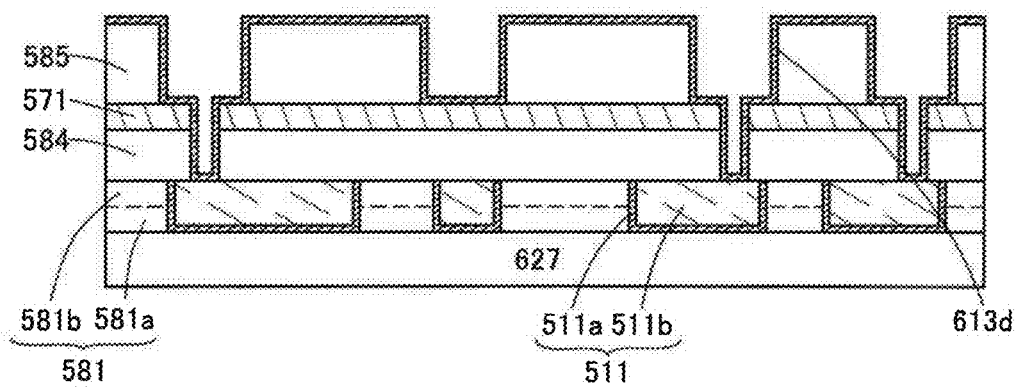
FIGS. 21A to 21C are cross-sectional views illustrating the example of the method for manufacturing the semiconductor device of one embodiment of the present invention.

After the mask 208 is removed, a conductor 613d to be the conductor 613a and the conductor 413a is formed in the openings of the insulator 585 and the openings of the insulator 571 and the insulator 584 and over the insulator 585 (see FIG. 21A).

Figure 21B:
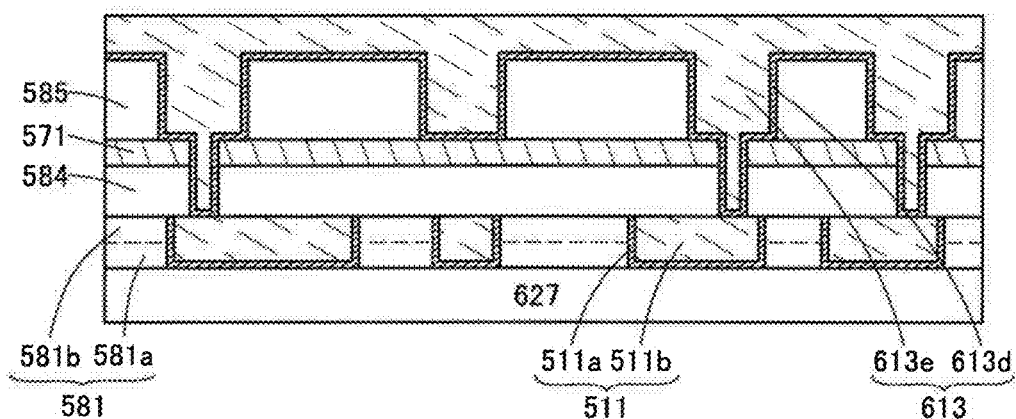
Figure 21C:
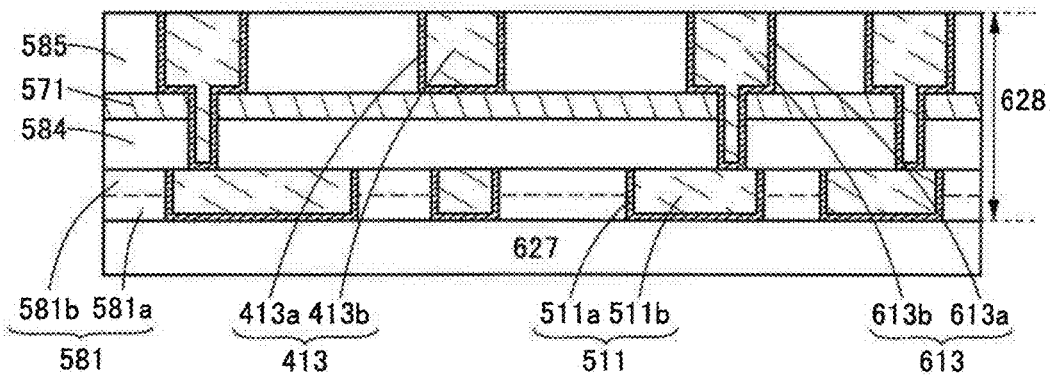

Then, a conductor 613e to be the conductor 613b and the conductor 413b is formed over the conductor 613d (see FIG. 21B).

The conductor 613d has a stacked-layer structure of tantalum nitride, tantalum over the tantalum nitride, and copper over the tantalum, for example. Here, copper used as the upper layer of the conductor 613d is referred to as "copper seed layer" in some cases. The tantalum nitride may be formed by a sputtering method, for example. The copper may be formed by a CVD method or a sputtering method, for example. A copper-manganese alloy layer may be used as the conductor 613d. A copper layer may be formed over the copper-manganese alloy layer.

Copper is used as the conductor 613e, for example. The copper can be formed by a plating method, for example.

Next, the conductor 613e and the conductor 613d are removed such that a surface of the conductor 613e is planarized, whereby a surface of the insulator 585 is exposed. Thus, the conductors such as the conductor 613 and the conductor 413 are formed. Consequently, the layer 628 shown in FIGS. 9A and 9B can be formed (see FIG. 21C).

FIGS. 22A to 22D show a formation method of the layer 628 shown in FIG. 11.

The insulator 581 and the conductors such as the conductor 511 are formed over the layer 627. Then, the insulator 571 is formed over the insulator 581, and the insulator 584 is formed over the insulator 571. After that, openings are formed in the insulator 584 using the mask (see FIG. 22A). In the case where the etching rate of the insulator 571 is lower than the etching rate of the insulator 584 when the opening is formed in the insulator 584, for example, the conductor 511 and the like can be protected in some cases.

Figure 22A:
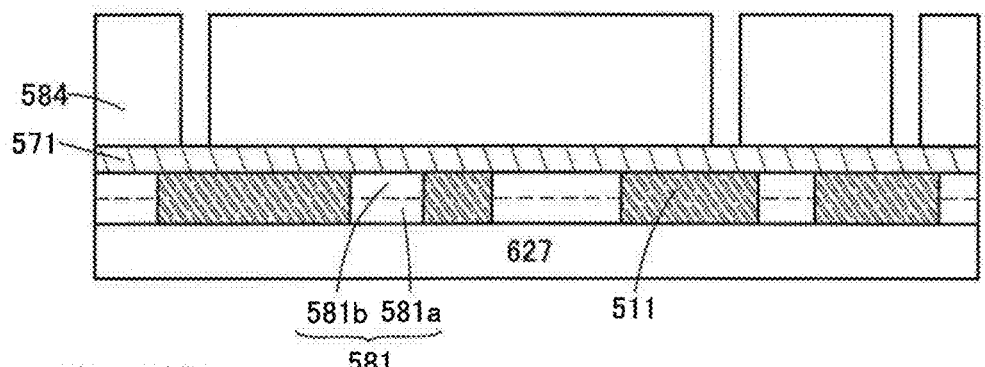
FIGS. 22A to 22D are cross-sectional views illustrating an example of a method for manufacturing a semiconductor device of one embodiment of the present invention.
Figure 22B:
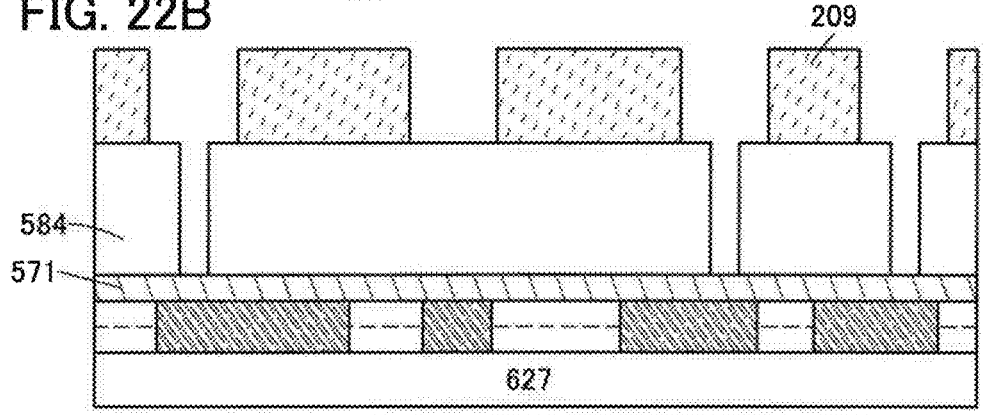
Figure 22C:
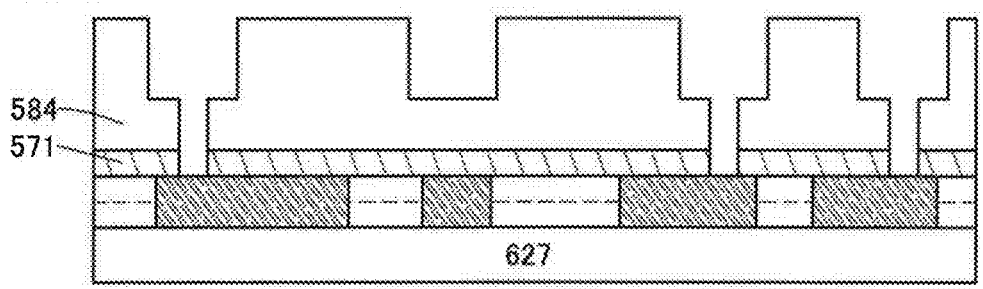
Figure 22D:
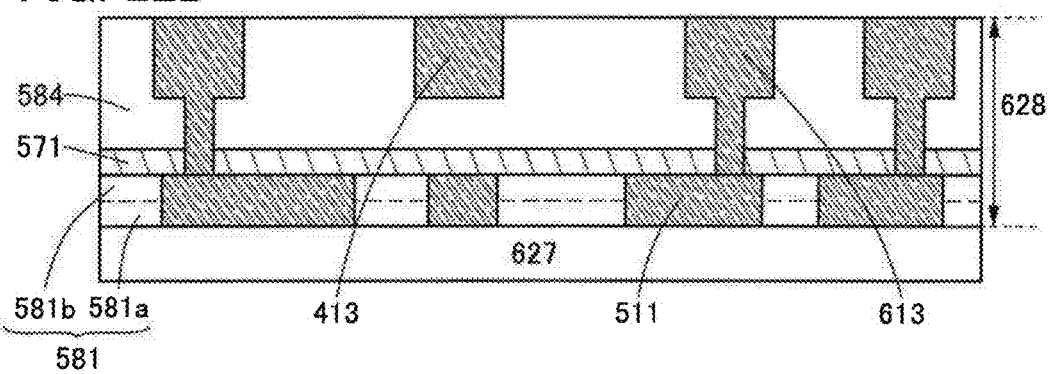

Then, a mask 209 is formed over the insulator 584 (see FIG. 22B). After that, the insulator 584 is etched using the mask 209, and the insulator 571 is etched using the openings of the insulator 584 formed in FIG. 22A (see FIG. 22C).

After the mask 209 is removed, conductors such as the conductor 613 and the conductor 413 are formed in openings of the insulator 584 and the insulator 571. Thus, the layer 628 shown in FIG. 11 can be formed (see FIG. 22D).

FIGS. 23A to 23C, FIGS. 24A and 24B, FIGS. 25A to 25C, and FIGS. 26A and 26B show a formation method of the layers 629 and 630 shown in FIG. 13.

First, the layer 628 is formed over the layer 627. Next, the insulator 571a and the insulator 402 are formed over the layer 628. Then, a first oxide to be the oxide layer 406a is formed over the insulator 402, and a second oxide to be the oxide layer 406b is formed over the first oxide. After that, a first conductor to be the conductor 416a and the like is formed. The first oxide and the second oxide are processed using the first conductor as a hard mask, so that the oxide layer 406a and the oxide layer 406b are formed. The processing may be performed by dry etching, for example.

Next, the insulator 591 is formed. Then, a mask is formed over the insulator 591. An opening is formed in the insulator 591 and the first conductor is processed using the mask, so that the conductor 416a and the conductor 416b are formed (see FIG. 23A).

Figure 23A:
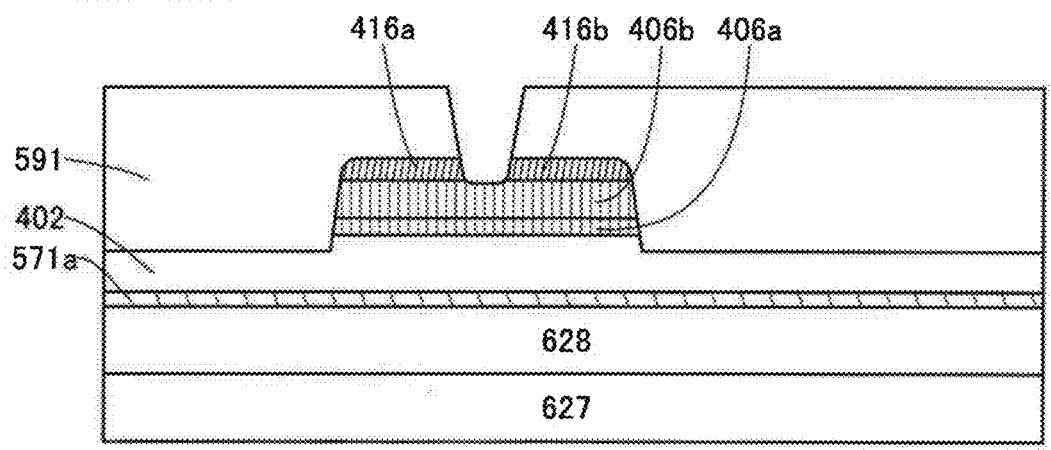
FIGS. 23A to 23C are cross-sectional views illustrating an example of a method for manufacturing a semiconductor device of one embodiment of the present invention.
Figure 23B:
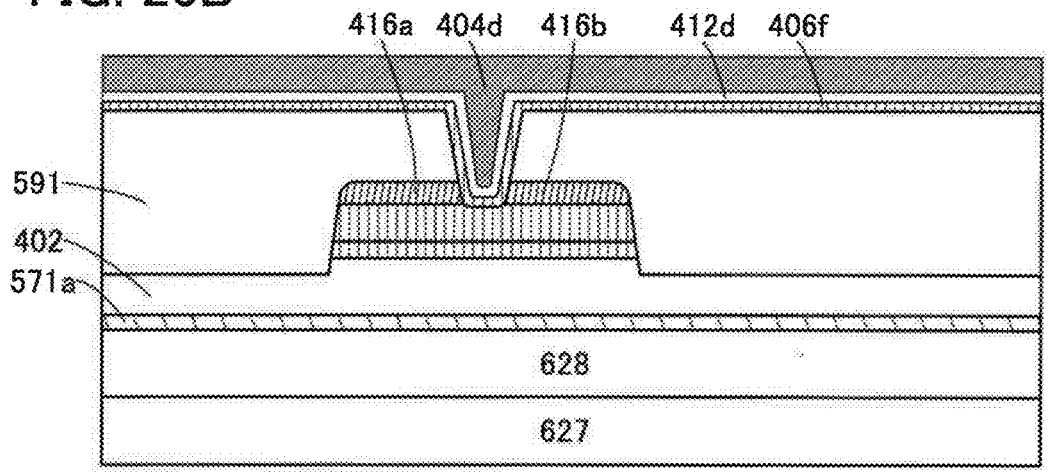

After the mask is removed, an oxide layer 406f to be the oxide layer 406c, an insulator 412d to be the insulator 412, and a conductor 404d to be the conductor 404 are formed (see FIG. 23B).

Figure 23C:
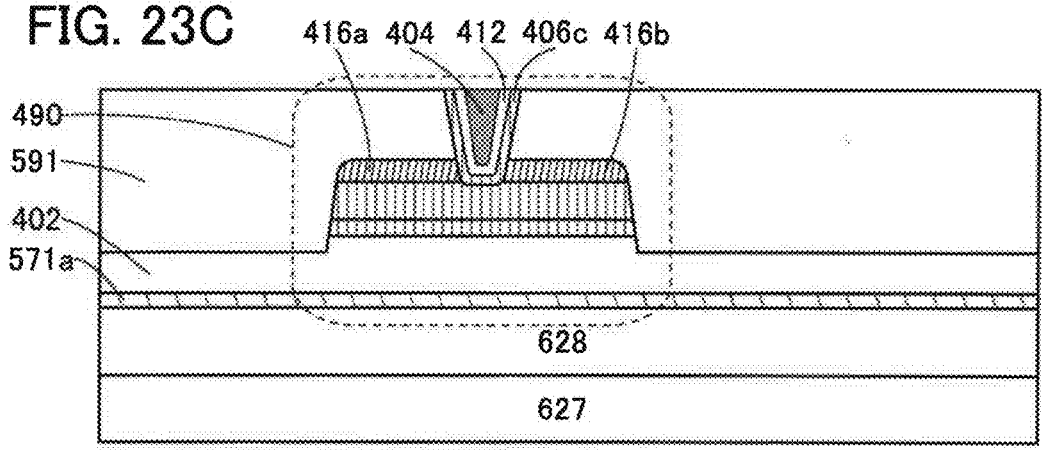

Then, the conductor 404d, the insulator 412d, and the oxide layer 406f are removed such that a surface of the conductor 404d is planarized, and the conductor 404, the insulator 412, and the oxide layer 406c are formed (see FIG. 23C). Through the above-described process, the transistor 490 is manufactured.

Figure 24A:
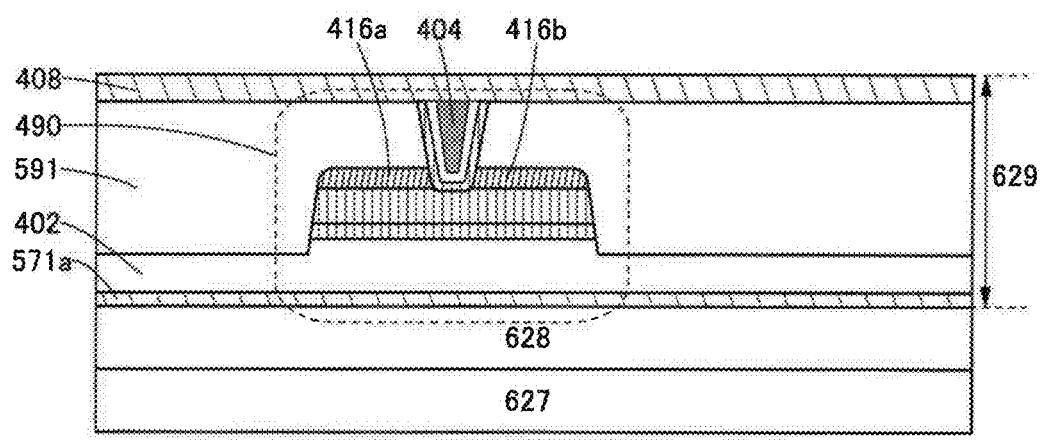
FIGS. 24A and 24B are cross-sectional views illustrating the example of the method for manufacturing the semiconductor device of one embodiment of the present invention.

Then, the insulator 408 is formed over the insulator 591, the conductor 404, the insulator 412, and the oxide layer 406c (see FIG. 24A).

The insulator 408 is preferably formed by, for example, a sputtering method, so that the mixed layer 145 is formed at and near the interface between the insulator 408 and a surface where the insulator 408 is formed. In the mixed layer 145, the insulator 408 and the surface where the insulator 408 is formed are mixed.

In this embodiment, an aluminum oxide formed by a sputtering method is used for the insulator 408. In addition, a gas containing oxygen is used as a sputtering gas. The mixed layer 145 preferably contains excess oxygen.

Figure 24B:
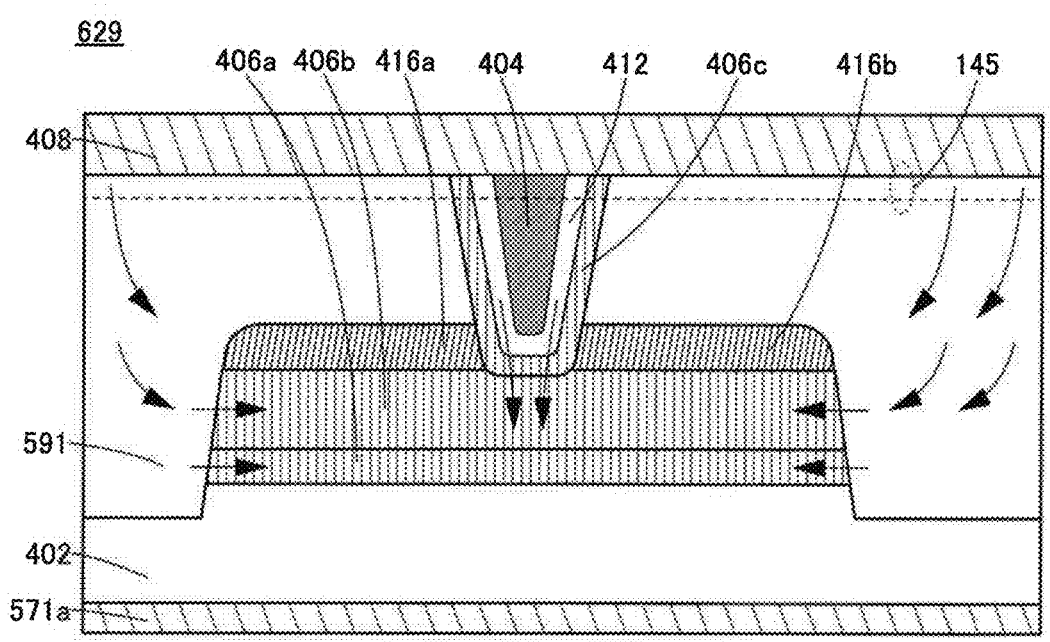

Oxygen contained in the mixed layer 145 is diffused by the heat treatment. Excess oxygen contained in the mixed layer 145 is diffused to the oxide layers 406a, 406b, and 406c through the insulator 591, the insulator 412, or the like. When a material that is less likely to transmit oxygen is used for the insulator 408, the insulator 571, and the insulator 571a, the excess oxygen contained in the mixed layer 145 is effectively diffused to the oxide layers 406a, 406b, and 406c through the insulator 402, the insulator 412, or the like. A state of diffusion of the excess oxygen contained in the mixed layer 145 is shown by the arrows in FIG. 24B. In FIG. 24B, an enlarged view of the layer 629 is shown.

Note that the mixed layer 145 is not shown in some diagrams to make the diagrams easy to understand.

Then, the insulator 592a is formed over the insulator 408. After that, openings are formed in the insulator 592a, the insulator 408, the insulator 591, the insulator 402, and the insulator 571a (see FIG. 25A).

Figure 25A:
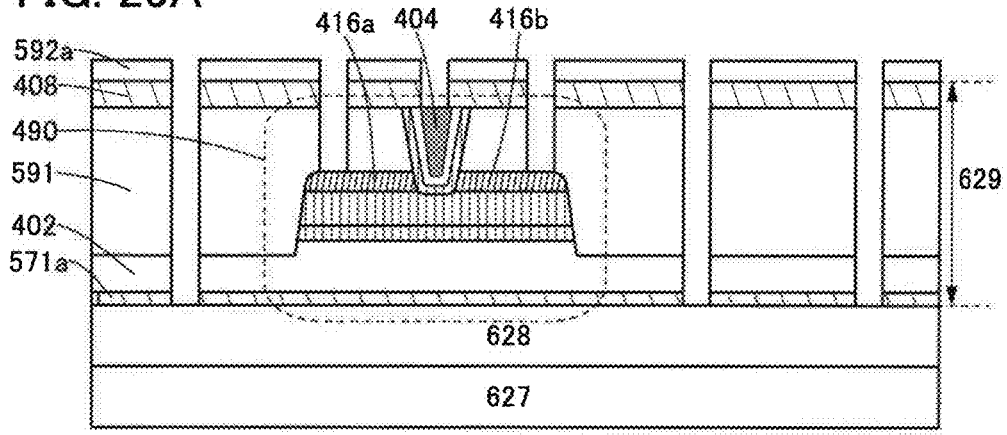
FIGS. 25A to 25C are cross-sectional views illustrating the example of the method for manufacturing the semiconductor device of one embodiment of the present invention.
Figure 25B:
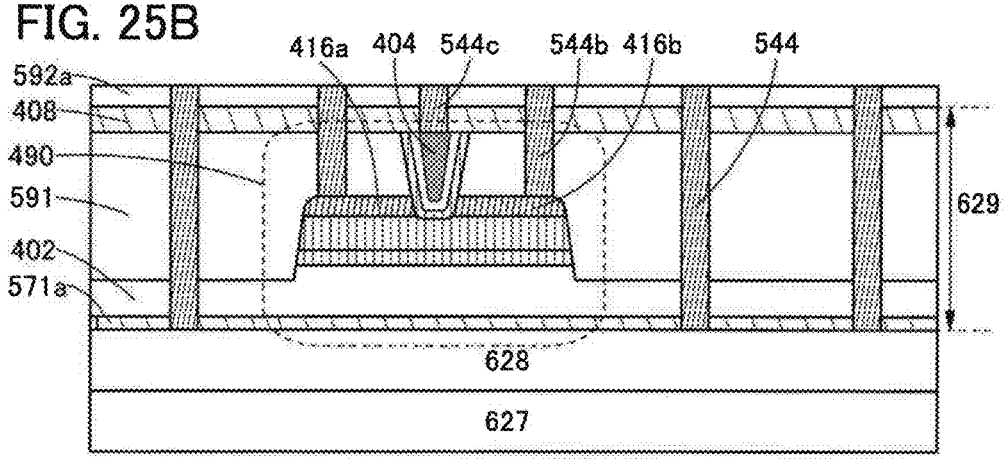
Figure 25C:
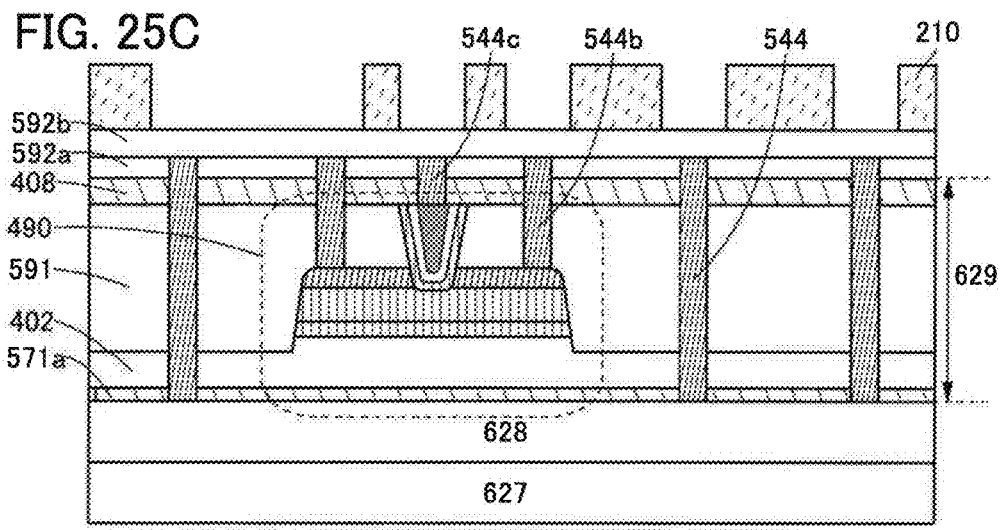

The plugs such as the plug 544 and the plug 544b are formed in the openings formed in the insulator 592a, the insulator 408, the insulator 591, the insulator 402, and the insulator 571a (see FIG. 25B).

Then, the insulator 592b is formed over the insulator 592a. Then, a mask 210 is formed over the insulator 592b (see FIG. 25C).

Figure 26A:
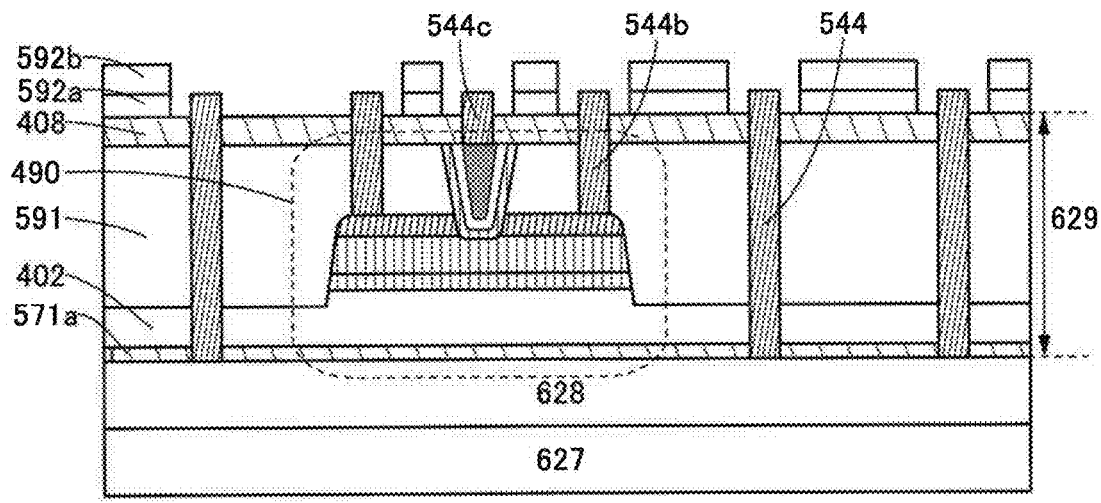
FIGS. 26A and 26B are cross-sectional views illustrating the example of the method for manufacturing the semiconductor device of one embodiment of the present invention.
Figure 26B:
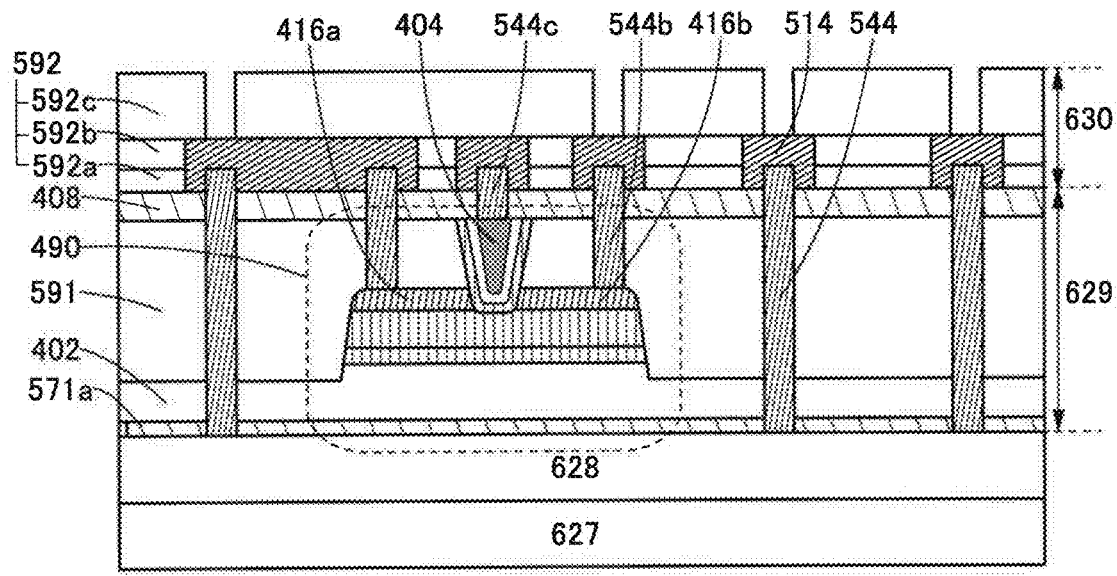

Openings are formed in the insulator 592b and the insulator 592a using the mask 210 (see FIG. 26A). Here, the plug 544 and the plug 544b have portions projecting above the insulator 408 in the openings formed in the insulator 592b and the insulator 592a.

After the mask is removed, the conductors such as the conductor 514 are formed in the openings. Then, the insulator 592c is formed over the insulator 592b and the conductor 514. Then, openings are formed in the insulator 592c (see FIG. 26B). A conductor is formed in the openings. Thus, the layers 629 and 630 shown in FIG. 13 can be formed.

The conductors such as the conductor 511, the conductor 513, the conductor 413, the conductor 613, and the conductor 514 and the plugs such as the plug 541, the plug 543, the plug 544, and the plug 545 can be formed by a sputtering method, a CVD method (including a thermal CVD method, an MOCVD method, a PECVD method, and the like), an MBE method, an ALD method, a PLD method, a plating method, or the like. As the sputtering method, for example, a collimated sputtering method, a long throw sputtering method in which the distance between a target and a substrate is set long, or a combination of a long throw sputtering method and a collimated sputtering method is employed, whereby the embeddability can be improved.

[Example of Circuit]

Next, an example of a circuit that can be used in the device of one embodiment of the present invention will be described.

Figure 27A:
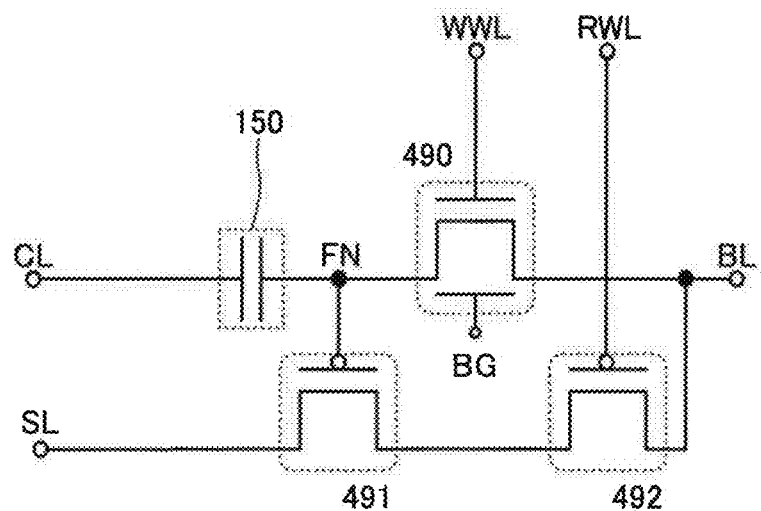
FIGS. 27A to 27C are circuit diagrams of one embodiment of the present invention.

FIG. 27A shows an example of a circuit including three transistors and one capacitor. Here, the case in which the transistor 490, the transistor 491, and the transistor 492 described with reference to FIG. 1 and the like are used as the three transistors and the capacitor 150 is used as the capacitor is considered.

Here, the transistors used in the circuit of FIG. 27A are preferably provided in the layer 627 or 629 in the cross section of the semiconductor device illustrated in FIG. 1, for example. In particular, when the transistors 491 and 492 are provided in the layer 627 and the transistor 490 is provided in the layer 629 with the layer 628 sandwiched between the layers 627 and 629, the transistors 490 to 492 can show excellent characteristics. The capacitor 150 may be provided in any of the layers 628 to 631.

An example of a device including the circuit illustrated in FIG. 27A can have the structure illustrated in FIG. 1. In FIG. 1, the transistor 491 and the transistor 492 are formed in the layer 627, the transistor 490 is formed in the layer 629, and the capacitor is formed in the layer 631.

In FIG. 27A, one of a source and a drain of the transistor 490 is connected to a gate electrode of the transistor 491 and one electrode of the capacitor 150 through a floating node (FN). The other of the source and the drain of the transistor 490 is connected to one of a source and a drain of the transistor 492. These connections are preferably made via a conductor provided in the layer 628. One of the source electrode and the drain electrode of the transistor 491 is connected to, for example, a terminal SL connected to the layer 631 through a conductor or the like provided in the layer 628. The other of the source and the drain of the transistor 491 is connected to the other of the source and the drain of the transistor 492.

In FIG. 1, the conductor 454 that is the gate electrode of the transistor 491 is connected to the conductor 516 that is the electrode of the capacitor 150 included in the layer 631 through conductors such as the plug 543 and the conductor 513 provided in the layer 628. The conductor 516 is connected to the conductor 416b that is one of the source electrode and the drain electrode of the transistor 490 through the conductor and the plugs provided in the layers 629 and 630. One of the source and the drain of the transistor 492 is connected to the conductor 416a that is one of the source electrode and the drain electrode of the transistor 490 through conductors and plugs provided in the layers 628 to 630.

Figure 27B:
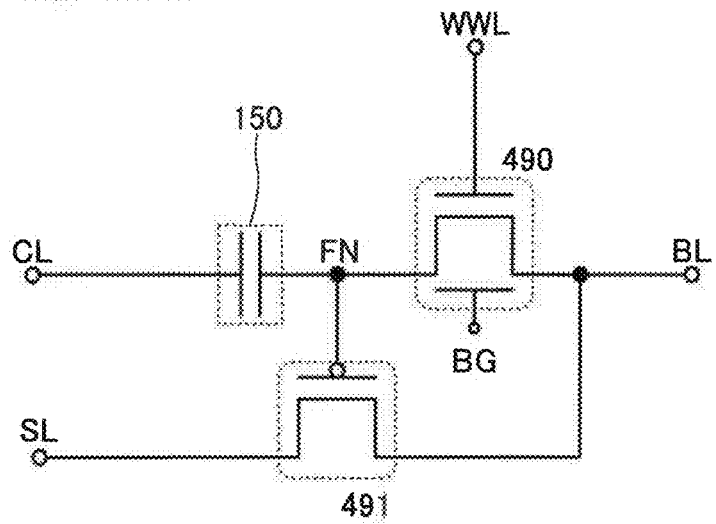
Figure 27C:
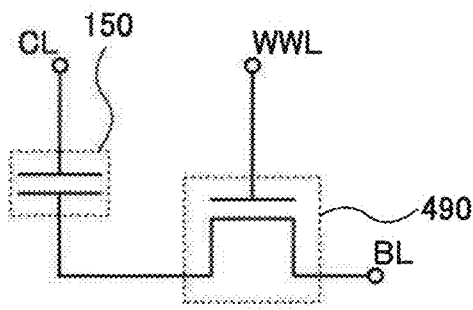

Here, a transistor provided in the layer 627 in FIG. 1, such as the transistor 493, may be used in a peripheral circuit, e.g., a driver circuit or a converter, connected to the circuit illustrated in FIGS. 27A to 27C or the like.

FIG. 27B is different from FIG. 27A in not including the transistor 492. Since the transistor 492 is not included, the integration degree of a circuit can be increased in some cases.

Figure 29:
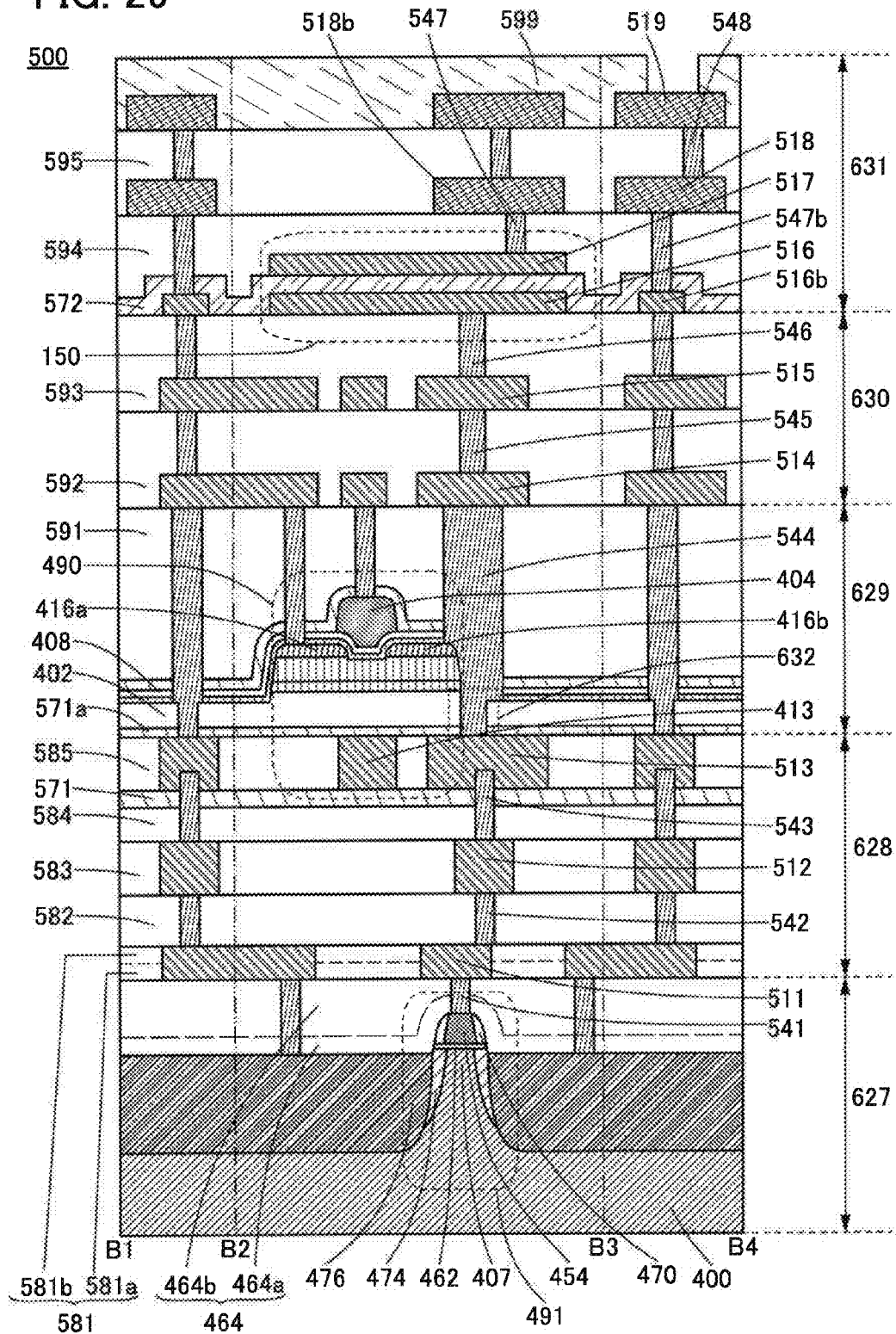
FIG. 29 is a cross-sectional view illustrating an example of a semiconductor device of one embodiment of the present invention.

As an example of the semiconductor device 500 including the circuit shown in FIG. 27B, the semiconductor device 500 shown in FIG. 29 is given.

FIG. 29 is different from FIG. 1 in that the plug 544 is in contact with the conductor 513 and the conductor 416b. The plug 544 and the plug 544b are included in FIG. 1, whereas the plug 544b is unnecessary in FIG. 29. Thus, the integration degree of a circuit can be increased.

In FIG. 29, it is preferable that after the formation of an opening 632 as a first opening in the insulator 571a and the insulator 402, a second opening be formed in the insulator 591, the insulator 408, the insulator 412, and the oxide layer 406c. In addition, it is preferable that the plug 544 be formed to fill the opening 632 and the second opening. The case in which the insulator 571a includes aluminum oxide and hafnium oxide is considered, for example. In dry etching or the like, the etching rate of these materials is lower than that of a material such as silicon oxide in some cases. Thus, forming the second opening after the formation of the opening 632 is preferable because a period during which the conductor 416b is exposed to a dry etching atmosphere can be shortened and the amount of a reduction in film thickness of the conductor 416b can be reduced more in some cases.

FIG. 29 includes an insulator 582 over the insulator 581 and an insulator 583 over the insulator 582 between the insulator 581 and the insulator 584, unlike in FIG. 1. A top surface of the insulator 583 is in contact with the insulator 584. A plug 542 and a conductor 512 are formed to be embedded in the insulator 582 and the insulator 583, respectively. The plug 542 is preferably in contact with a top surface of the conductor 511. The conductor 512 is preferably in contact with a top surface of the plug 542.

FIG. 29 includes the insulator 593 over the insulator 592, and the conductor 515 and a plug 546 formed to be embedded in the insulator 593, unlike in FIG. 1. The conductor 515 is preferably in contact with a top surface of the plug 545, and the plug 546 is preferably in contact with a top surface of the conductor 515. The plug 546 is preferably in contact with a bottom surface of the conductor 516.

FIGS. 30A to 30F and FIGS. 31A to 31C are top views of layouts that can be used in FIG. 27B. Note that a region surrounded by dashed-two dotted line in FIGS. 30A to 30F and FIGS. 31A to 31C illustrates an example of the area forming a unit of the circuit (or referred to as cell in some cases) shown in FIG. 27B.

Figure 30A:
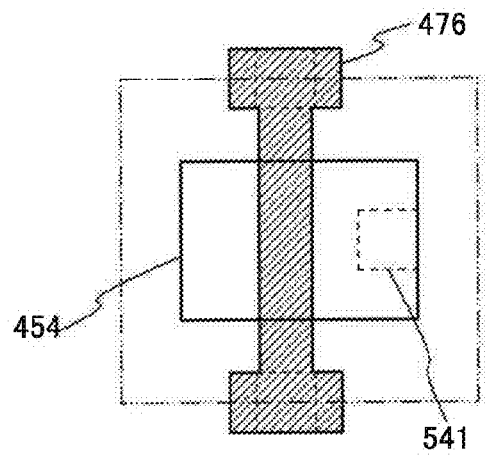
FIGS. 30A to 30F are top views illustrating an example of a semiconductor device of one embodiment of the present invention.

In FIG. 30A, a channel region, a source region, a drain region, and the like (a diagonally shaded region) of the transistor 491, the conductor 454 functioning as a gate electrode, and a region (dotted lines) in which the plug 541 or the like for connecting the source region, the drain region, or the conductor 454 to a conductor in an upper layer is formed are shown.

Figure 30B:
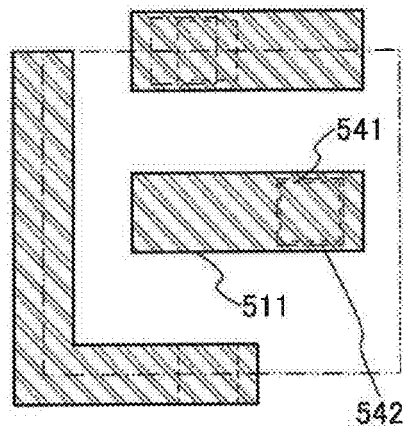

In FIG. 30B, a conductor such as the conductor 511 and a region (dashed-dotted line) in which the plug 542 or the like for connecting the conductor to a conductor in an upper layer is formed are shown.

Figure 30C:
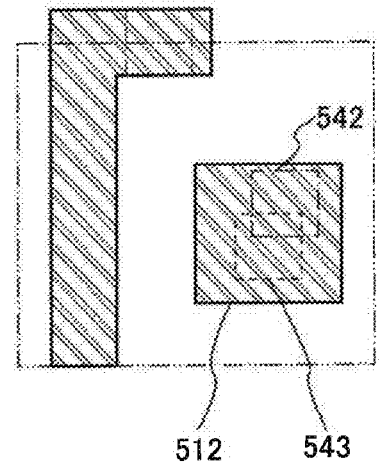

In FIG. 30C, a conductor such as the conductor 512 and a region (dotted line) in which the plug 543 or the like for connecting the conductor to a conductor in an upper layer is formed are shown.

Figure 30D:
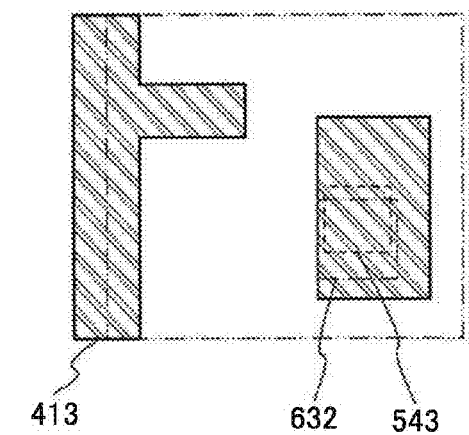

In FIG. 30D, the conductor 413, the plug 543, and the opening 632 are shown.

Figure 30E:
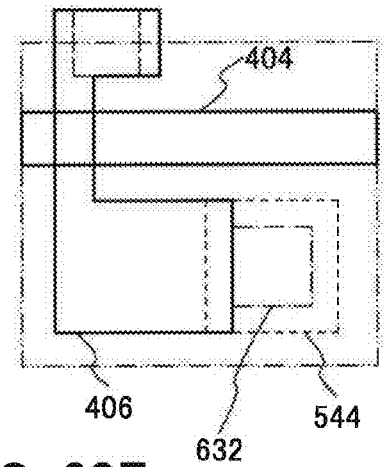

In FIG. 30E, the semiconductor layer 406 and the conductor 404 included in the transistor 490, the opening 632, and a region in which the plug 544 connected to a conductor in an upper layer is formed are shown.

Figure 30F:
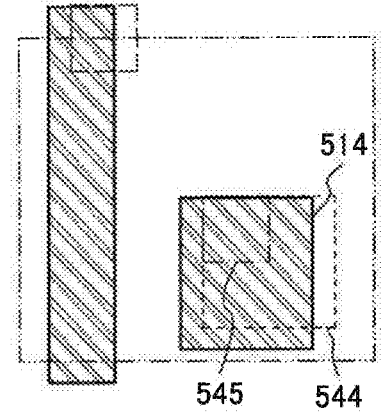

In FIG. 30F, a conductor such as the conductor 514, a region (dashed-dotted line) in which the plug 545 for connecting the conductor to a conductor in an upper layer and the like are formed are shown.

Figure 31A:
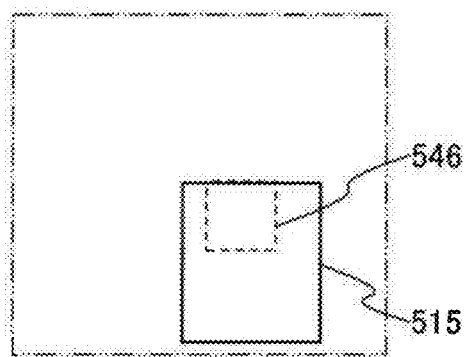
FIGS. 31A to 31C are top views illustrating an example of a semiconductor device of one embodiment of the present invention.

In FIG. 31A, the conductor 515 and a region in which the plug 546 for connecting the conductor 515 to the conductor 516 in an upper layer is formed are shown.

Figure 31B:
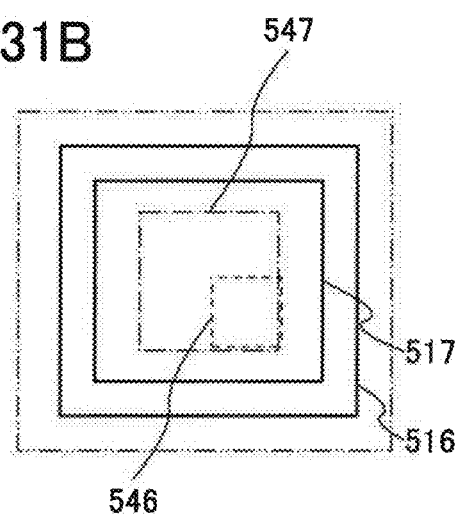

In FIG. 31B, the conductor 516, the conductor 517, and a region in which the plug 547 for connecting the conductor 517 to a conductor in an upper layer is formed are shown.

Figure 31C:
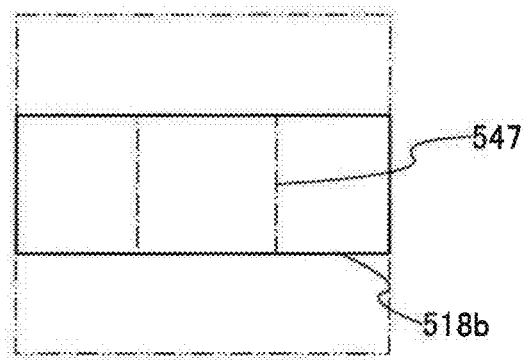

In FIG. 31C, a conductor 518*b* is shown.

Figure 32:
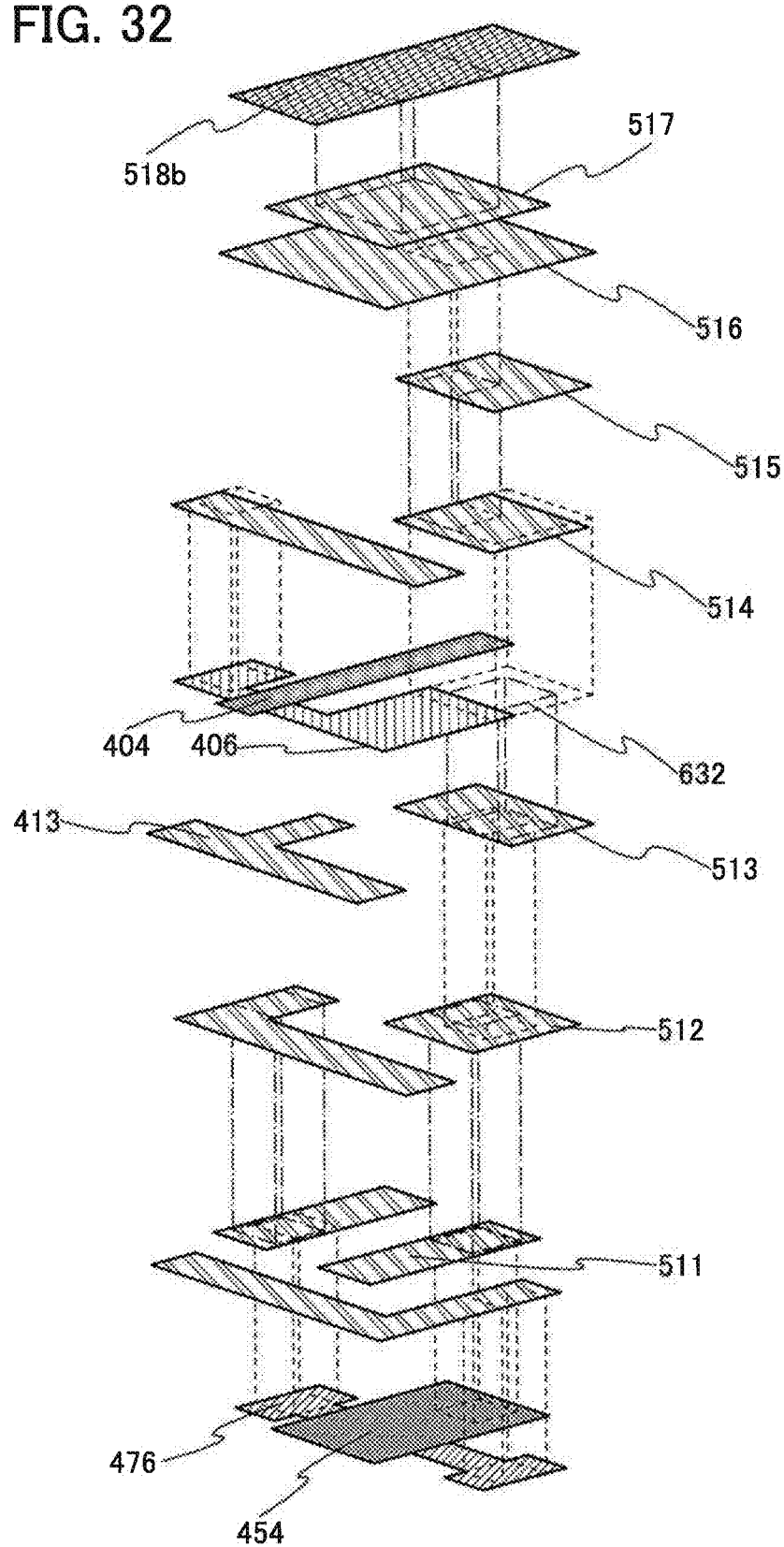
FIG. 32 is a perspective view illustrating an example of a semiconductor device of one embodiment of the present invention.

FIG. 32 is a perspective view of stacked layers in which the top views shown in FIGS. 30A to 30F and FIGS. 31A to 31C are stacked sequentially. Note that the distance between the stacked layers is longer than the actual distance therebetween for easy understanding.

Figure 33:
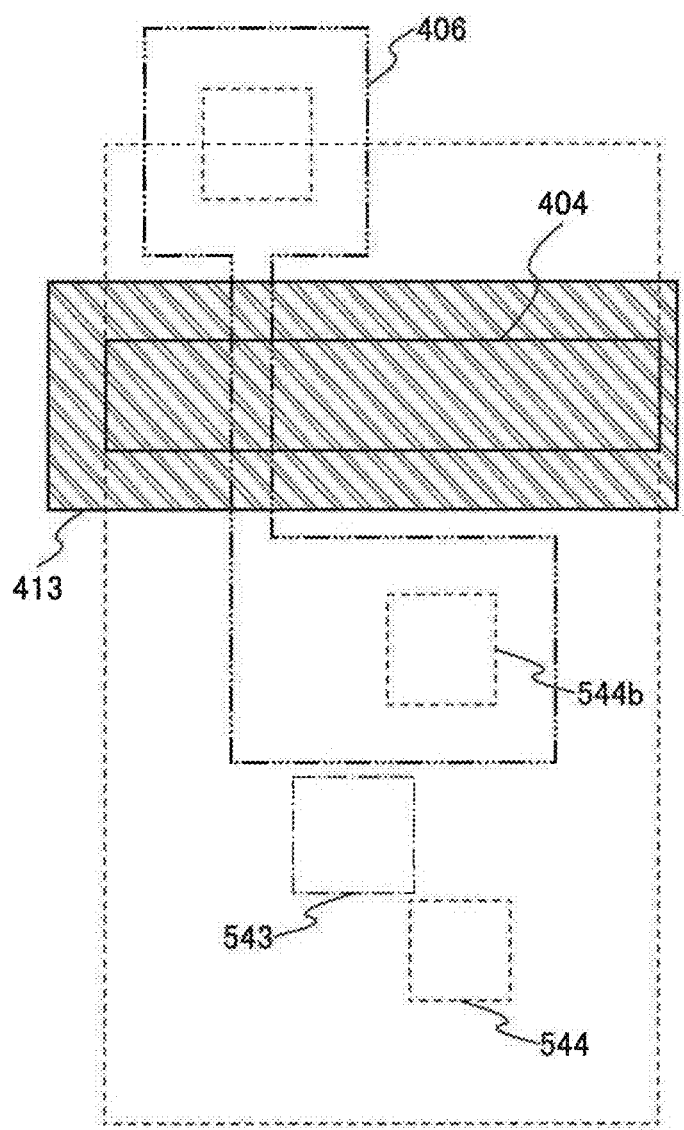
FIG. 33 is a top view illustrating an example of a semiconductor device of one embodiment of the present invention.

FIG. 33 shows an example of the layout different from that shown in FIGS. 30A to 30F, FIGS. 31A to 31C, and FIG. 32. In FIG. 30E, the area of a circuit can be reduced compared with the top view shown in FIG. 33. Moreover, the integration degree of a circuit can be increased because the plug 544*b* is unnecessary in FIG. 30E whereas the plug 544*b* in contact with the conductor 416*b* and the plug 544 in contact with the conductor 513 are included in FIG. 33.

Figure 35:
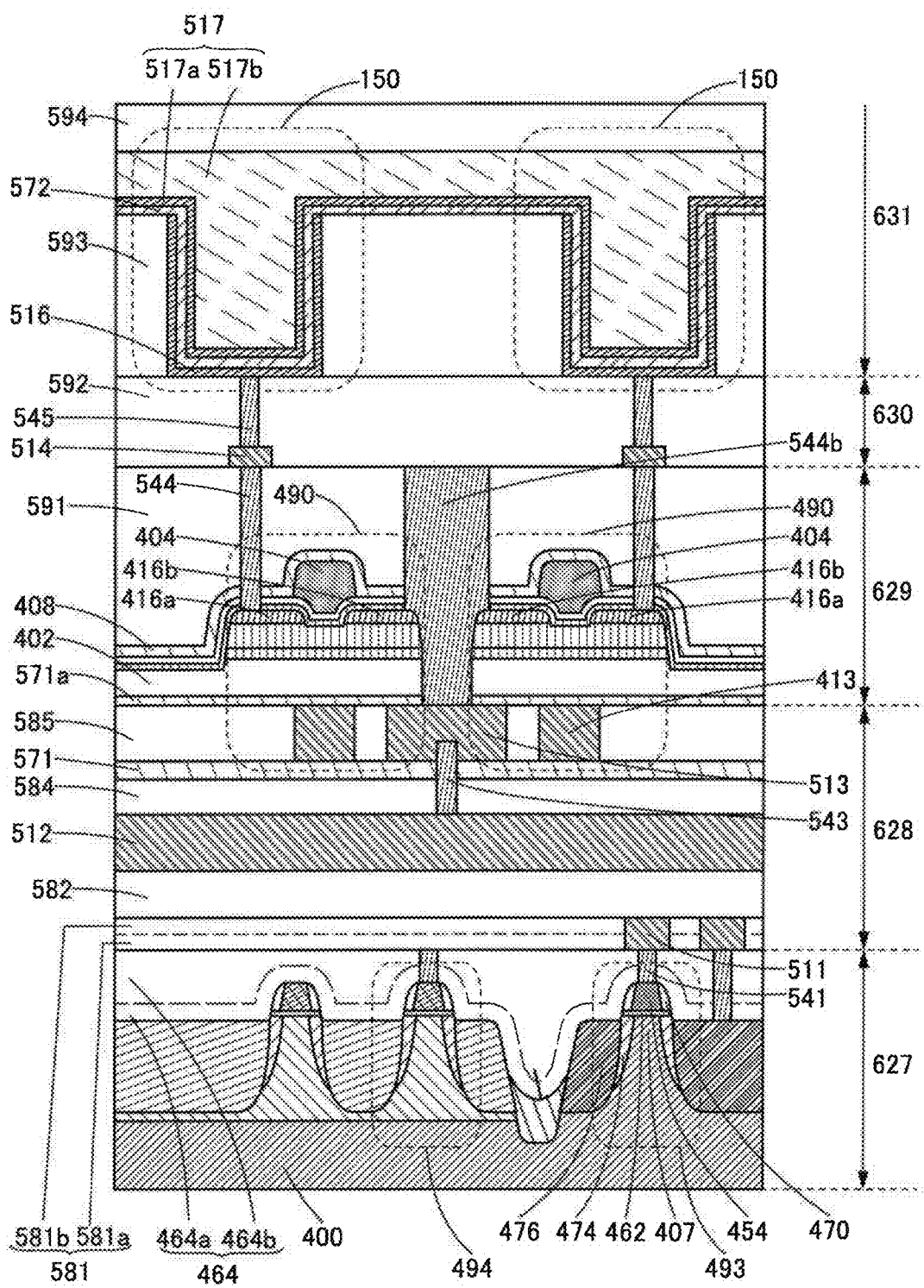
FIG. 35 is a cross-sectional view illustrating an example of a semiconductor device of one embodiment of the present invention.

FIG. 35 shows an example of a cross section of the semiconductor device 500 including a circuit shown in FIG. 27C. The circuit shown in FIG. 27C corresponds to one cell functioning as a memory device, for example. In the example shown in FIG. 35, two adjacent cells are connected to each other. The adjacent cells share the plug 544*b* connected to a terminal BL. Accordingly, the integration degree of a circuit can be increased. The plug 544*b* is in contact with each of the conductors 416*a* included in two adjacent transistors 490. The plug 544*b* is connected to the conductor 512 through the conductor 513 and the plug 543. The conductor 512 preferably functions as the terminal BL.

In FIG. 35, the capacitor 150 overlaps the transistor 490. The conductor 416*a* included in the transistor 490 is connected to the conductor 516 included in the capacitor 150 through the plug 544, the conductor 514, and the like.

As shown in FIG. 35, the semiconductor device 500 may include a transistor 494 in the layer 627. Here, the transistor 494 is a p-channel transistor and the transistor 491 is an re-channel transistor, for example.

Figure 36:
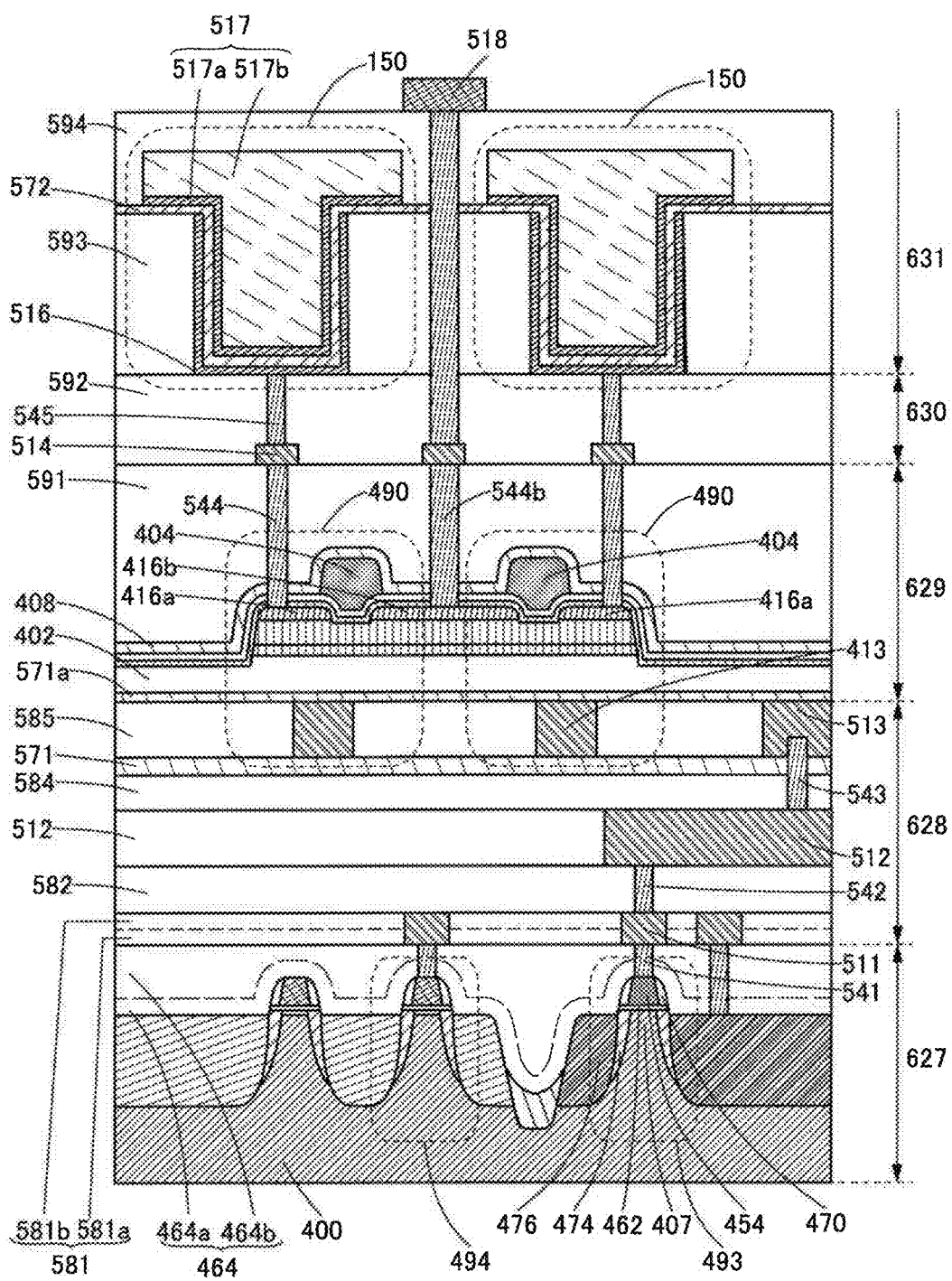
FIG. 36 is a cross-sectional view illustrating an example of a semiconductor device of one embodiment of the present invention.

FIG. 36 shows an example of the cross section of the semiconductor device 500 including the circuit shown in FIG. 27C. The transistor 490 is connected to the terminal BL through a conductor in the layer 628 in FIG. 35, whereas the transistor 490 is connected to the terminal BL through a conductor in the layer 631 in FIG. 36.

In FIG. 36, the two adjacent transistors 490 share the conductor 416*b*. Accordingly, the integration degree of a circuit can be increased. The conductor 416*b* is connected to the conductor 518 through the plug 544*b*, and a conductor and a plug formed in the layers 630 and 631, for example. The conductor 518 preferably functions as the terminal BL.

<Circuit Operation>

The circuits illustrated in FIGS. 27A to 27C and FIG. 28A can function as memory devices.

The operation of the circuit in FIG. 27B will be described.

The circuit in FIG. 27B has a feature that the potential of the gate of the transistor 491 can be retained, and thus enables writing, retaining, and reading of data as follows.

Writing and retaining of data are described. First, the potential of a terminal WWL is set to a potential at which the transistor 490 is on, so that the transistor 490 is turned on. Accordingly, the potential of a terminal BL is supplied to the node FN where the gate of the transistor 491 and the one electrode of the capacitor 150 are electrically connected to each other. That is, a predetermined charge is supplied to the gate of the transistor 491 (writing). Here, one of two kinds of charges providing different potential levels (hereinafter referred to as a low-level charge and a high-level charge) is supplied. After that, the potential of the terminal WWL is set to a potential at which the transistor 490 is off. Thus, the charge is held at the node FN (retaining).

By using an oxide semiconductor as a semiconductor layer, the transistor 490 can have a low off-state current, whereby the charge of the node FN is retained for a long time.

Next, reading of data is described. An appropriate potential (a reading potential) is supplied to the terminal CL while a predetermined potential (a constant potential) is supplied to the terminal BL, whereby the potential of the terminal SL changes in accordance with the amount of charge retained in the node FN. This is because in the case of using an n-channel transistor as the transistor 491, an apparent threshold voltage $V_{th\_H}$ at the time when the high-level charge is given to the gate of the transistor 491 is lower than an apparent threshold voltage $V_{th\_L}$ at the time when the low-level charge is given to the gate of the transistor 491. Here, an apparent threshold voltage refers to the potential of the terminal CL which is needed to make the transistor 491 be in "on state." Thus, the potential of the terminal CL is set to a potential $V_0$ which is between $V_{th\_H}$ and $V_{th\_L}$, whereby charge supplied to the node FN can be determined. For example, in the case where the high-level charge is supplied to the node FN in writing and the potential of the terminal CL is $V_0$ ($>V_{th\_H}$), the transistor 491 is brought into "on state." In the case where the low-level charge is supplied to the node FN in writing, even when the potential of the terminal CL is $V_0$ ($<V_{th\_L}$), the transistor 491 still remains in "off state." Thus, the data retained in the node FN can be read by determining the potential of the terminal SL.

Note that in the case where memory cells are arrayed, it is necessary that data of a desired memory cell be read in read operation. In a memory cell from which data is not read, the terminal CL is supplied with a potential at which the transistor 491 is in an "off state" regardless of the charge supplied to the node FN, that is, a potential lower than $V_{th\_H}$ so that data can be read from a desired memory cell. Alternatively, in a memory cell from which data is not read, the terminal CL is supplied with a potential at which the transistor 491 is brought into an "on state" regardless of the charge supplied to the node FN, that is, a potential higher than $V_{th\_L}$ so that data can be read from a desired memory cell.

In the circuit illustrated in FIG. 27A, writing and retaining of data can be carried out in a manner similar to that in FIG. 27B. In FIG. 27A, the transistor 492 is included. To prevent reading of data from the other memory cells, the transistor 492 may be brought into an "off state". Thus, leakage current from the terminal BL to the terminal SL can be suppressed in some cases. To prevent reading of data from the other memory cells in reading, a potential at which the transistor 492 is in an "off state" may be input to a terminal RWL; it is not necessary in some cases to supply a high potential to the terminal CL.

When including a transistor using an oxide semiconductor and having an extremely low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

The semiconductor device in FIG. 27C is different from the semiconductor device in FIG. 27B in not including the transistor 491. Also in this case, data can be written and retained in a manner similar to that of the semiconductor device in FIG. 27B.

Reading of data in the semiconductor device in FIG. 27C is described. When the transistor 490 is brought into on state, the terminal BL which is in a floating state and the capacitor 150 are brought into conduction, and the charge is redistributed between the terminal BL and the capacitor 150. As a result, the potential of the terminal BL is changed. The amount of change in the potential of the terminal BL varies depending on the potential of the one electrode of the capacitor 150 (or the charge accumulated in the capacitor 150).

For example, the potential of the terminal BL after the charge redistribution is $(C_B \times V_{B0} + C \times V)/(C_B + C)$, where V is the potential of the one electrode of the capacitor 150, C is the capacitance of the capacitor 150, $C_B$ is the capacitance component of the terminal BL, and $V_{B0}$ is the potential of the terminal BL before the charge redistribution. Thus, it can be found that, assuming that the memory cell is in either of two states in which the potential V of the one electrode of the capacitor 150 is $V_1$ and $V_0$ ($V_1 > V_0$), the potential of the terminal BL in the case of retaining the potential $V_1$ ($=(C_B \times V_{B0} + C \times V_1)/(C_B + C)$) is higher than the potential of the terminal BL in the case of retaining the potential $V_0$ ($=(C_B \times V_{B0} + C \times V_0)/(C_B + C)$).

Then, by comparing the potential of the terminal BL with a predetermined potential, data can be read.

In this case, for example, the transistor 493 or the like included in the layer 627 may be used in a peripheral circuit for driving the memory cell.

Figure 28A:
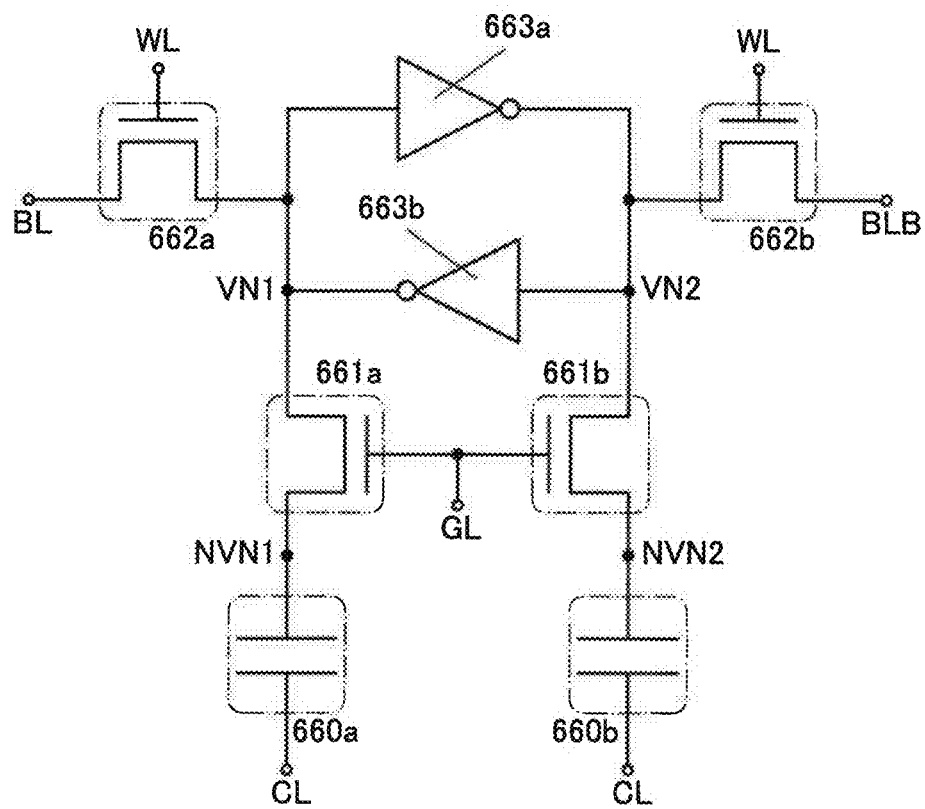
FIGS. 28A to 28C are circuit diagrams of one embodiment of the present invention.
Figure 28B:
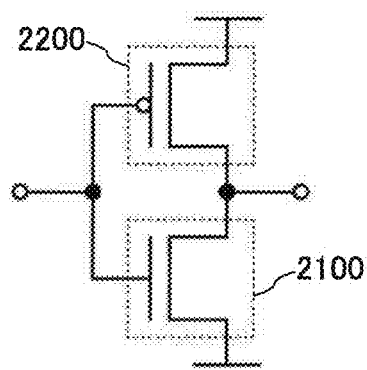

A circuit diagram in FIG. 28B shows a configuration of a CMOS circuit in which a p-channel transistor 2200 and an n-channel transistor 2100 are connected to each other in series and in which gates of them are connected to each other. The semiconductor device 500 illustrated in FIG. 1, FIG. 2, FIGS. 3A and 3B, and FIG. 4 may include the circuit illustrated in FIG. 28B. In such a case, for example, it is preferable to provide the transistor 2200 in the layer 629, provide the transistor 2100 in the layer 627, and use a conductor provided in the layer 628 or the like for the connection of source, drain, and gate electrodes of the transistors.

Figure 28C:
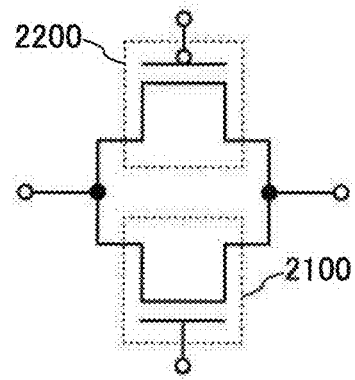

A circuit diagram in FIG. 28C shows a configuration in which sources of the transistors 2100 and 2200 are connected to each other and drains of the transistors 2100 and 2200 are connected to each other. With such a configuration, the transistors can function as an analog switch. The semiconductor device 500 illustrated in FIG. 1, FIG. 2, FIGS. 3A and 3B, and FIG. 4 may include the circuit illustrated in FIG. 28C. In such a case, for example, it is preferable to provide the transistor 2200 in the layer 629, provide the transistor 2100 in the layer 627, and use a conductor provided in the layer 628 or the like for the connection of source, drain, and gate electrodes of the transistors.

FIG. 28A illustrates an example of a circuit that can be used in the device of one embodiment of the present invention.

The circuit in FIG. 28A includes a capacitor 660a, a capacitor 660b, a transistor 661a, a transistor 661b, a transistor 662a, a transistor 662b, an inverter 663a, an inverter 663b, a wiring BL, a wiring BLB, a wiring WL, a wiring CL, and a wiring GL.

The circuit in FIG. 28A is a memory cell in which the inverter 663a and the inverter 663b are connected in a ring to form a flip-flop. A node to which an output signal of the inverter 663b is output is a node VN1, and a node to which an output signal of the inverter 663a is output is a node VN2. The memory cells are provided in a matrix, whereby a memory device (memory cell array) can be formed.

One of a source and a drain of the transistor 662a is electrically connected to the wiring BL, the other of the source and the drain thereof is electrically connected to the node VN1, and a gate thereof is electrically connected to the wiring WL. One of a source and a drain of the transistor 662b is electrically connected to the node VN2, the other of the source and the drain thereof is electrically connected to the wiring BLB, and a gate thereof is electrically connected to the wiring WL.

One of a source and a drain of the transistor 661a is electrically connected to the node VN1, the other of the source and the drain thereof is electrically connected to one of electrodes of the capacitor 660a, and a gate thereof is electrically connected to the wiring GL. A node between the other of the source and the drain of the transistor 661a and the one of electrodes of the capacitor 660a is a node NVN1. One of a source and a drain of the transistor 661b is electrically connected to the node VN2, the other of the source and the drain thereof is electrically connected to one of electrodes of the capacitor 660b, and a gate thereof is electrically connected to the wiring GL. A node between the other of the source and the drain of the transistor 661b and the one of electrodes of the capacitor 660b is a node NVN2.

The other of electrodes of the capacitor 660a is electrically connected to the wiring CL. The other of electrodes of the capacitor 660b is electrically connected to the wiring CL.

Conduction and non-conduction states of the transistor 662a and the transistor 662b can be controlled by a potential supplied to the wiring WL. Conduction and non-conduction states of the transistor 661a and the transistor 661b can be controlled by a potential supplied to the wiring GL.

Writing, retaining, and reading operation of the memory cell illustrated in FIG. 28A will be described below.

In the case where data is written, first, potentials corresponding to data 0 or data 1 are applied to the wiring BL and the wiring BLB.

For example, in the case where data 1 is to be written, a high-level power supply potential (VDD) is applied to the wiring BL and a ground potential is applied to the wiring BLB. Then, a potential (VH) higher than or equal to the sum of VDD and the threshold voltage of the transistors 662a and 662b is applied to the wiring WL.

Next, the potential of the wiring WL is set to be lower than the threshold voltage of the transistors 662a and 662b, whereby the data 1 written to the flip-flop is retained.

In the case where the data is read, first, the wiring BL and the wiring BLB are set to VDD in advance. Then, VH is applied to the wiring WL. Accordingly, the potential of the wiring BL remains VDD, but the potential of the wiring BLB is discharged through the transistor 662a and the inverter 663a to be a ground potential. The potential difference between the wiring BL and the wiring BLB is amplified by a sense amplifier (not illustrated), so that the retained data 1 can be read.

In the case where data 0 is to be written, the wiring BL is set to a ground potential and the wiring BLB is set to VDD; then, VH is applied to the wiring WL. Next, the potential of the wiring WL is set to be lower than the threshold voltage of the transistors 662a and 662b, whereby the data 0 written to the flip-flop is retained. In the case of data reading, the wiring BL and the wiring BLB are set to VDD in advance and VH is applied to the wiring WL, whereby the potential of the wiring BLB remains VDD but the potential of the wiring BL is discharged through the transistor 662b and the inverter 663b to be a ground potential. The potential difference between the wiring BL and the wiring BLB is amplified by the sense amplifier, so that the retained data 0 can be read.

Accordingly, the semiconductor device in FIG. 28A serves as a so-called static random access memory (SRAM). An SRAM does not require refresh operation because the SRAM retains data using a flip-flop. Therefore, power consumption in retaining data can be reduced. In addition, an SRAM does not require a capacitor in a flip-flop and is therefore suitable for applications where high speed operation is required.

In the semiconductor device in FIG. 28A, data of the node VN1 can be written to the node NVN1 through the transistor 661a. Similarly, data of the node VN2 can be written to the node NVN2 through the transistor 661b. The written data is retained by turning off the transistor 661a or the transistor 661b. For example, even in the case where supply of a power supply potential is stopped, data of the node VN1 and the node VN2 can be retained in some cases.

Unlike a conventional SRAM in which data is lost immediately after supply of a power supply potential is stopped, the semiconductor device in FIG. 28A can retain data even after supply of a power supply potential is stopped. Therefore, power consumption of the semiconductor device can be reduced by appropriately supplying or stopping a power supply potential. For example, the semiconductor device in FIG. 28A is used in a memory region of a CPU, whereby power consumption of the CPU can be reduced.

Note that the length of a period during which data is retained in the node NVN1 and the node NVN2 depends on the off-state current of the transistor 661a and the transistor 661b. Therefore, a transistor with small off-state current is preferably used as each of the transistor 661a and the transistor 661b in order to retain data for a long time. Alternatively, the capacitance of the capacitor 660a and the capacitor 660b is preferably increased.

For example, when the transistor 490 and the capacitor 150 are used as the transistor 661a and the capacitor 660a, data can be retained in the node NVN1 for a long time.

Similarly, when the transistor 490 and the capacitor 150 are used as the transistor 661b and the capacitor 660b, data can be retained in the node NVN2 for a long time. Accordingly, the description of the transistor 490 is referred to for the transistor 661a and the transistor 661b. Furthermore, the description of the capacitor 150 is referred to for the capacitor 660a and the capacitor 660b.

The transistor 662a, the transistor 662b, a transistor included in the inverter 663a, and a transistor included in the inverter 663b in FIG. 28A can be formed to overlap with at least part of any of the transistor 661a, the transistor 661b, the capacitor 660a, and the capacitor 660b. Accordingly, the semiconductor device in FIG. 28A can be formed without a significant increase in an occupation area in some cases as compared to a conventional SRAM. The description of the transistor 491 is referred to for the transistor 662a, the transistor 662b, the transistor included in the inverter 663a, and the transistor included in the inverter 663b.

Note that the connection between one of the source electrode and the drain electrode of the transistor 490 and the capacitor 150 in the structures illustrated in FIG. 1, FIG. 2, FIGS. 3A and 3B, FIG. 4, FIGS. 5A and 5B, FIGS. 6A and 6B, FIGS. 7A and 7B, FIG. 8, FIGS. 9A and 9B, FIG. 10, FIG. 11, FIG. 12, FIG. 13, FIG. 14, FIGS. 21A to 21C, FIGS. 22A to 22D, and FIGS. 24A and 24B may be applied to the connection between the one of the source electrode and the drain electrode of the transistor 661a and the capacitor 660a in the circuit illustrated in FIG. 28A. Furthermore, the connection between the other of the source electrode and the drain electrode of the transistor 490 and the one of the source electrode and the drain electrode of the transistor 491 may be applied to the connection between the other of the source electrode and the drain electrode of the transistor 661a and the one of the source electrode and the drain electrode of the transistor 662a in the circuit illustrated in FIG. 28A.

[Semiconductor Layer 406]

The semiconductor layer 406 preferably has a structure in which the oxide layer 406a, the oxide layer 406b, and the oxide layer 406c are stacked.

For the semiconductor layer 406, an oxide semiconductor containing, for example, indium (In) is preferably used. The oxide semiconductor has a high carrier mobility (electron mobility) when containing, for example, indium. In addition, the semiconductor preferably contains an element M The element M is preferably aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M. The element M is an element having a high bonding energy with oxygen, for example. The element M is an element that can increase the energy gap of the oxide semiconductor, for example. Furthermore, an oxide semiconductor preferably contains zinc. When the oxide semiconductor contains zinc, the oxide semiconductor is easily crystallized in some cases.

Note that the semiconductor layer 406 is not limited to the oxide containing indium. The semiconductor layer 406 may be, for example, an oxide that does not contain indium and contains zinc, an oxide that does not contain indium and contains gallium, or an oxide that does not contain indium and contains tin, e.g., a zinc tin oxide, a gallium tin oxide, or a gallium oxide.

For the semiconductor layer 406, an oxide semiconductor with a wide energy gap may be used. For example, the energy gap of the oxide semiconductor used for the semiconductor layer 406 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide semiconductor can be formed by a sputtering method, a chemical vapor deposition (CVD) method (including but not limited to a metal organic chemical vapor deposition (MOCVD) method, an atomic layer deposition (ALD) method, a thermal CVD method, or a plasma enhanced chemical vapor deposition (PECVD) method), a molecular beam epitaxy (MBE) method, or a pulsed laser deposition (PLD) method. By using the PECVD method, a high-quality film can be formed at a relatively low temperature. By using a deposition method that does not use plasma for deposition, such as the MOCVD method, the ALD method, or the thermal CVD method, a film can be formed with few defects because damage is not easily caused on a surface on which the film is deposited.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by a CVD method or an ALD method, a film with a certain composition can be formed depending on a flow rate ratio of the source gases. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the film formation can be reduced because time taken for transfer and pressure adjustment is omitted. Thus, transistors or semiconductor devices can be manufactured with improved productivity.

For example, in the case where an InGaZnO$_X$ film (X>0) is formed by a thermal CVD method as the semiconductor layer 406, trimethylindium (In(CH$_3$)$_3$), trimethylgallium (Ga(CH$_3$)$_3$), and dimethylzinc (Zn(CH$_3$)$_2$) are used. Without limitation to the above combination, triethylgallium (Ga(C$_2$H$_5$)$_3$) can be used instead of trimethylgallium, and diethylzinc (Zn(C$_2$H$_5$)$_2$) can be used instead of dimethylzinc.

For example, in the case where an InGaZnO$_X$ film (X>0) is formed as the semiconductor layer 406 by the ALD method, an In(CH$_3$)$_3$ gas and an O$_3$ gas are sequentially introduced a plurality of times to form an InO$_2$ layer, a Ga(CH$_3$)$_3$ gas and an O$_3$ gas are sequentially introduced a plurality of times to form a GaO layer, and then a Zn(CH$_3$)$_2$ gas and an O$_3$ gas are sequentially introduced a plurality of times to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by using these gases. Note that although an H$_2$O gas that is obtained by bubbling water with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ gas or tris(acetylacetonato)indium may be used. Note that tris (acetylacetonato)indium is also referred to as In(acac)$_3$. Instead of a Ga(CH$_3$)$_3$ gas, a Ga(C$_2$H$_5$)$_3$ gas or tris(acetylacetonato)gallium may be used. Note that tris(acetylacetonato)gallium is also referred to as Ga(acac)$_3$. Furthermore, a Zn(CH$_3$)$_2$ gas or zinc acetate may be used. However, the deposition gas is not limited to these.

In the case where the oxide layer is formed by a sputtering method, a target containing indium is preferably used in order to reduce the number of particles. In addition, if an oxide target having a high atomic ratio of the element M is used, the conductivity of the target may be decreased. Particularly in the case where a target containing indium is used, the conductivity of the target can be increased and DC discharge or AC discharge is facilitated; thus, deposition over a large substrate can be easily performed. Thus, semiconductor devices can be manufactured with improved productivity.

In the case where the oxide semiconductor is formed by a sputtering method, the atomic ratio of In to M and Zn contained in the target may be 3:1:1, 3:1:2, 3:1:4, 1:1:0.5, 1:1:1, 1:1:2, 1:4:4, or 4:2:4.1, for example.

When the oxide semiconductor is formed by a sputtering method, an oxide semiconductor having an atomic ratio different from the atomic ratio of the target may be deposited. Especially for zinc, the atomic ratio of zinc in the formed oxide semiconductor is smaller than the atomic ratio of the target in some cases. Specifically, the film has an atomic ratio of zinc of 40 atomic % to 90 atomic % of the atomic ratio of zinc in the target.

The oxide layers 406a and 406c are preferably formed using a material including one or more kinds of metal elements, other than oxygen, included in the oxide layer 406b. With the use of such a material, interface states at interfaces between the oxide layers 406a and 406b and between the oxide layers 406c and 406b are less likely to be generated. Accordingly, carriers are not likely to be scattered or captured at the interfaces, which results in an improvement in field-effect mobility of the transistor. Furthermore, variation in threshold voltage of the transistor can be reduced. Thus, a semiconductor device having favorable electrical characteristics can be obtained.

The thicknesses of the oxide layers 406a and 406c are each greater than or equal to 3 nm and less than or equal to 100 nm, preferably greater than or equal to 3 nm and less than or equal to 50 nm. The thickness of the oxide layer 406b is greater than or equal to 3 nm and less than or equal to 200 nm, preferably greater than or equal to 3 nm and less than or equal to 100 nm, further preferably greater than or equal to 3 nm and less than or equal to 50 nm.

When the oxide layer 406b is an In-M-Zn oxide containing In, the element M, and Zn at an atomic ratio of $x_2:y_2:z_2$ and each of the oxide layers 406a and 406c is an In-M-Zn oxide containing In, M, and Zn at an atomic ratio of $x_1:y_1:z_1$, $y_1/x_1$ needs to be larger than $y_2/x_2$. Preferably, the oxide layers 406a, 406c, and 406b in which $y_1/x_1$ is 1.5 or more times as large as $y_2/x_2$ are selected. Still further preferably, the oxide layers 406a, 406c, and 406b in which $y_1/x_1$ is 2 or more times as large as $y_2/x_2$ are selected. Still further preferably, the oxide layers 406a, 406c, and 406b in which $y_1/x_1$ is 3 or more times as large as $y_2/x_2$ are selected. In the oxide layer 406b at this time, $y_2$ is preferably larger than or equal to $x_2$ because the transistor can have stable electrical characteristics. However, when $y_2$ is three or more times as large as $x_2$, the field-effect mobility of the transistor is reduced; accordingly, $y_2$ is preferably smaller than three times $x_2$. When the oxide layers 406a and 406c each have the above structure, each of the oxide layers 406a and 406c can be a layer in which oxygen vacancy is less likely to occur than in the oxide layer 406b.

In the case of using an In-M-Zn oxide as the oxide layer 406a, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. In the case of using an In-M-Zn oxide as the oxide layer 406b, when the summation of In and M is assumed to be 100 atomic %, the proportions of In and M are preferably set to be greater than 25 atomic % and less than 75 atomic %, respectively, more preferably greater than 34 atomic % and less than 66 atomic %, respectively. In the case of using an In-M-Zn oxide as the oxide layer 406c, when the summation of In and M is assumed to be 100 atomic %, the proportions of In and M are preferably set to be less than 50 atomic % and greater than 50 atomic %, respectively, more preferably less than 25 atomic % and greater than 75 atomic %, respectively. Note that the oxide layer 406c and the oxide layer 406a may be formed using the same type of oxide.

For example, an In—Ga—Zn oxide that is formed using a target having an atomic ratio of In:Ga:Zn=1:3:2, 1:3:4, 1:3:6, 1:6:4, or 1:9:6 or an In—Ga oxide that is formed using a target having an atomic ratio of In:Ga=1:9 or 7:93 can be used for each of the oxide layers 406a and 406c containing In or Ga. Furthermore, an In—Ga—Zn oxide that is formed using a target having an atomic ratio of In:Ga:Zn=1:1:1 or 3:1:2 can be used for the oxide layer 406b. Note that the atomic ratio of each of the oxide layers 406a and 406b may vary within a range of ±20% of the corresponding atomic ratio as an error.

For the oxide layer 406b, an oxide having an electron affinity higher than that of each of the oxide layers 406a and 406c is used. For example, for the oxide layer 406b, an oxide having an electron affinity higher than that of each of the oxide layers 406a and 406c by 0.07 eV or higher and 1.3 eV or lower, preferably 0.1 eV or higher and 0.7 eV or lower, more preferably 0.15 eV or higher and 0.4 eV or lower is used. Note that the electron affinity refers to an energy difference between the vacuum level and the conduction band minimum.

An indium gallium oxide has a small electron affinity and a high oxygen-blocking property. Therefore, the oxide layer 406c preferably includes an indium gallium oxide. The gallium atomic ratio [Ga/(In+Ga)] is, for example, higher than or equal to 70%, preferably higher than or equal to 80%, more preferably higher than or equal to 90%.

Note that the oxide layer 406a and/or the oxide layer 406c may be gallium oxide. For example, when gallium oxide is used for the oxide layer 406c, a leakage current generated between the conductor 416a and the conductor 404 or between the conductor 416b and the conductor 404 can be reduced. In other words, the off-state current of the transistor 490 can be reduced.

The oxide layers 406a and 406c each have a smaller electron affinity than, for example, the oxide layer 406b and thus is close to an insulator than the oxide layer 406b. Thus, when a gate voltage is applied, a channel is most likely to be formed in the oxide layer 406b among the oxide layers 406a, 406b, and 406c.

In order to give stable electrical characteristics to a transistor in which an oxide semiconductor is used as a semiconductor layer where a channel is formed (also referred to as "OS transistor"), it is preferable that impurities and oxygen vacancies in the oxide semiconductor be reduced to highly purify the oxide semiconductor so that the oxide layer 406b can be regarded as an intrinsic or substantially intrinsic oxide semiconductor. For example, oxygen vacancies can be reduced in some cases by supplying excess oxygen to the oxide layer 406b. Furthermore, it is preferable that at least the channel formation region of the oxide layer 406b be regarded as an intrinsic or substantially intrinsic oxide semiconductor layer.

At least for the oxide layer 406b in the semiconductor layer 406, CAAC-OS is preferably used. Note that CAAC-OS will be described in detail in the following embodiment.

The CAAC-OS has dielectric anisotropy. Specifically, the CAAC-OS has a larger dielectric constant in the c-axis direction than in the a-axis direction and the b-axis direction. In a transistor in which a CAAC-OS is used for a semiconductor film where a channel is formed and a gate electrode is positioned in the c-axis direction, the dielectric constant in the c-axis direction is large; thus, the electric field generated from the gate electrode easily reaches the entire CAAC-OS. The subthreshold swing value (S value) can be made small. In addition, in the transistor in which a CAAC-OS is used for the semiconductor film, an increase in S value due to miniaturization is less likely to occur.

Moreover, since the dielectric constant in the a-axis direction and the b-axis direction of an CAAC-OS is small, an influence of the electric field generated between a source and a drain is reduced. Thus, a channel length modulation effect, a short-channel effect, or the like is less likely to occur, whereby the reliability of the transistor can be increased.

Here, the channel length modulation effect is a phenomenon in which, when the drain voltage is higher than the threshold voltage, a depletion layer expands from the drain side, so that the effective channel length is decreased. The short-channel effect is a phenomenon in which a channel length is reduced, so that a deterioration in electrical characteristics such as a decrease in threshold voltage is caused. The more transistor is miniaturized, the more deterioration in electrical characteristics caused by the phenomena is likely to occur.

[Energy Band Structure of Oxide Semiconductor Film]

Figure 37:
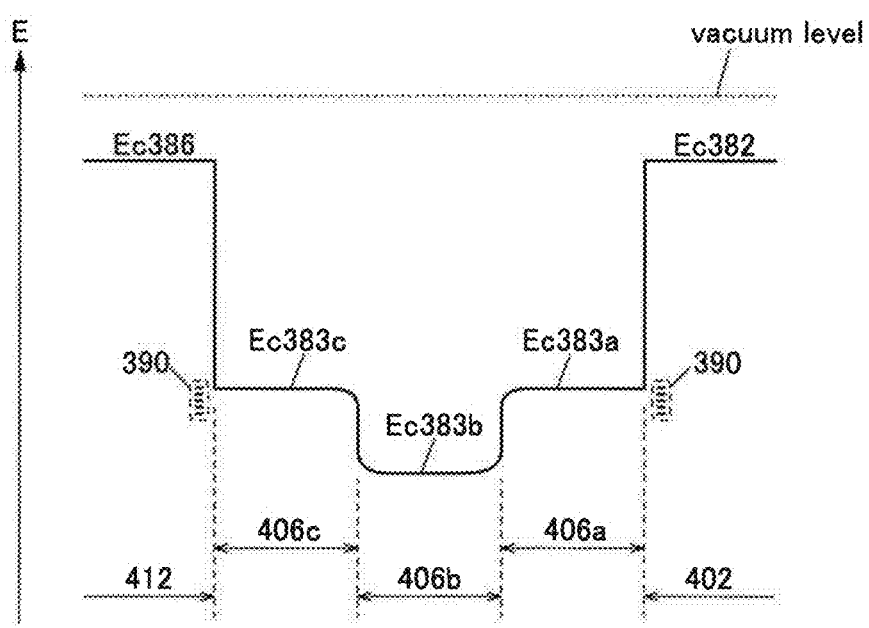
FIG. 37 is a band diagram of a region including an oxide semiconductor of one embodiment of the present invention.

A function and an effect of the semiconductor layer 406 consisting of the oxide layers 406a, 406b, and 406c are described using an energy band structure diagram of FIG. 37. FIG. 37 illustrates the energy band structure of a channel formation region of the transistor 490.

In FIG. 37, Ec382, Ec383a, Ec383b, Ec383c, and Ec386 indicate the energy of the conduction band minimum of the insulator 402, the oxide layer 406a, the oxide layer 406b, the oxide layer 406c, and the insulator 412, respectively.

Here, an electron affinity corresponds to a value obtained by subtracting an energy gap from a difference in energy between the vacuum level and the valence band maximum (the difference is also referred to as "ionization potential"). The energy gap can be measured using a spectroscopic ellipsometer (UT-300 manufactured by HORIBA Jobin Yvon SAS). The energy difference between the vacuum level and the valence band maximum can be measured using an ultraviolet photoelectron spectroscopy (UPS) device (VersaProbe manufactured by ULVAC-PHI, Inc.).

An In—Ga—Zn oxide formed using a target with an atomic ratio of In:Ga:Zn=1:3:2 has an energy gap of approximately 3.5 eV and an electron affinity of approximately 4.5 eV. An In—Ga—Zn oxide formed using a target with an atomic ratio of In:Ga:Zn=1:3:4 has an energy gap of approximately 3.4 eV and an electron affinity of approximately 4.5 eV. An In—Ga—Zn oxide formed using a target with an atomic ratio of In:Ga:Zn=1:3:6 has an energy gap of approximately 3.3 eV and an electron affinity of approximately 4.5 eV. An In—Ga—Zn oxide formed using a target with an atomic ratio of In:Ga:Zn=1:6:2 has an energy gap of approximately 3.9 eV and an electron affinity of approximately 4.3 eV. An In—Ga—Zn oxide formed using a target with an atomic ratio of In:Ga:Zn=1:6:8 has an energy gap of approximately 3.5 eV and an electron affinity of approximately 4.4 eV. An In—Ga—Zn oxide that is formed using a target having an atomic ratio of In:Ga:Zn=1:6:10 has an energy gap of approximately 3.5 eV and an electron affinity of approximately 4.5 eV. An In—Ga—Zn oxide formed using a target with an atomic ratio of In:Ga:Zn=1:1:1 has an energy gap of approximately 3.2 eV and an electron affinity of approximately 4.7 eV. An In—Ga—Zn oxide formed using a target with an atomic ratio of In:Ga:Zn=3:1:2 has an energy gap of approximately 2.8 eV and an electron affinity of approximately 5.0 eV.

Since the insulator 402 and 412 are insulators, Ec382 and Ec386 are closer to the vacuum level than (each have a smaller electron affinity than) Ec383a, Ec383b, and Ec383c.

Ec383a is closer to the vacuum level than Ec383b. Specifically, Ec383a is preferably located closer to the vacuum level than Ec383b by greater than or equal to 0.07 eV and less than or equal to 1.3 eV, more preferably greater than or equal to 0.1 eV and less than or equal to 0.7 eV, further preferably greater than or equal to 0.15 eV and less than or equal to 0.4 eV.

Ec383c is closer to the vacuum level than Ec383b. Specifically, Ec383c is preferably located closer to the vacuum level than Ec383b by greater than or equal to 0.07 eV and less than or equal to 1.3 eV, more preferably greater than or equal to 0.1 eV and less than or equal to 0.7 eV, further preferably greater than or equal to 0.15 eV and less than or equal to 0.4 eV.

Here, a mixed region of the oxide layers 406a and 406b might exist between the oxide layers 406a and 406b. A mixed region of the oxide layers 406b and 406c might exist between the oxide layers 406b and 406c. The mixed region has a low density of interface states. For that reason, the stack including the oxide layers 406a, 406b, and 406c has a band structure where energy at each interface and in the vicinity of the interface is changed continuously (continuous junction).

At this time, electrons move mainly in the oxide layer 406b, not in the oxide layers 406a and 406c. As described above, when the interface state density at the interface between the oxide layers 406a and 406b and the interface state density at the interface between the oxide layers 406b and 406c are decreased, electron movement in the oxide layer 406b is less likely to be inhibited and the on-state current of the transistor 490 can be increased.

Although trap states 390 due to impurities or defects might be formed at or near the interface between the oxide layer 406a and the insulator 402 and at or near the interface between the oxide layer 406c and the insulator 412, the oxide layer 406b can be separated from the trap states owing to the existence of the oxide layers 406a and 406c.

In the case where the transistor 490 has an s-channel structure, a channel is formed in the whole of the oxide layer 406b. Therefore, as the oxide layer 406b has a larger thickness, a channel region becomes larger. In other words, the thicker the oxide layer 406b is, the larger the on-state current of the transistor 490 is. For example, the oxide layer 406b has a region with a thickness of greater than or equal to 20 nm, preferably greater than or equal to 40 nm, more preferably greater than or equal to 60 nm, still more preferably greater than or equal to 100 nm. Note that the oxide layer 406b has a region with a thickness of, for example, less than or equal to 300 nm, preferably less than or equal to 200 nm, more preferably less than or equal to 150 nm, otherwise the productivity of a semiconductor device including the transistor 490 might be decreased.

Moreover, the thickness of the oxide layer 406c is preferably as small as possible to increase the on-state current of the transistor 490. For example, the oxide layer 406c has a region with a thickness of less than 10 nm, preferably less than or equal to 5 nm, more preferably less than or equal to 3 nm. Meanwhile, the oxide layer 406c has a function of blocking entry of elements other than oxygen (such as hydrogen and silicon) included in the adjacent insulator into the oxide layer 406b where a channel is formed. For this reason, it is preferable that the oxide layer 406c have a certain thickness. For example, the oxide layer 406c may have a region with a thickness of greater than or equal to 0.3 nm, preferably greater than or equal to 1 nm, more preferably greater than or equal to 2 nm.

To improve reliability, preferably, the thickness of the oxide layer 406a is large and the thickness of the oxide layer 406c is small. For example, the oxide layer 406a has a region with a thickness of greater than or equal to 10 nm, preferably greater than or equal to 20 nm, more preferably greater than or equal to 40 nm, still more preferably greater than or equal to 60 nm. When the thickness of the oxide layer 406a is made large, the distance from an interface between the adjacent insulator and the oxide layer 406a to the oxide layer 406b in which a channel is formed can be large. However, to prevent the productivity of the semiconductor device including the transistor 490 from being decreased, the oxide layer 406a has a region with a thickness of, for example, less than or equal to 200 nm, preferably less than or equal to 120 nm, more preferably less than or equal to 80 nm.

Note that silicon contained in the oxide semiconductor might serve as a carrier trap or a carrier generation source. Therefore, the silicon concentration of the oxide layer 406b is preferably as low as possible. For example, a region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ that is measured by secondary ion mass spectrometry (SIMS) is provided between the oxide layers 406b and 406a. A region with a silicon concentration of lower than $1\times10^{19}$ atoms/cm$^3$, preferably lower than $5\times10^{18}$ atoms/cm$^3$, more preferably lower than $2\times10^{18}$ atoms/cm$^3$ that is measured by SIMS is provided between the oxide layers 406b and 406c.

It is preferable to reduce the concentration of hydrogen in the oxide layers 406a and 406c in order to reduce the concentration of hydrogen in the oxide layer 406b. The oxide layers 406a and 406c each have a region in which the concentration of hydrogen measured by SIMS is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. It is preferable to reduce the concentration of nitrogen in the oxide layers 406a and 406c in order to reduce the concentration of nitrogen in the oxide layer 406b. The oxide layers 406a and 406c each have a region in which the concentration of nitrogen measured by SIMS is lower than $5\times10^{19}$ atoms/cm$^3$, preferably lower than or equal to $5\times10^{18}$ atoms/cm$^3$, more preferably lower than or equal to 1×10$^{18}$ atoms/cm$^3$, still more preferably lower than or equal to 5×10$^{17}$ atoms/cm$^3$.

Note that when copper enters the oxide semiconductor, an electron trap might be generated. The electron trap might shift the threshold voltage of the transistor in the positive direction. Therefore, the copper concentration at the surface of or in the oxide layer 406*b* is preferably as low as possible. For example, the oxide layer 406*b* preferably has a region in which the copper concentration is lower than or equal to 1×10$^{19}$ atoms/cm$^3$, lower than or equal to 5×10$^{18}$ atoms/cm$^3$, or lower than or equal to 1×10$^{18}$ atoms/cm$^3$.

The above three-layer structure is an example. For example, a two-layer structure without the oxide layer 406*a* or the oxide layer 406*c* may be employed. A four-layer structure in which any one of the semiconductors described as examples of the oxide layer 406*a*, the oxide layer 406*b*, and the oxide layer 406*c* is provided under or over the oxide layer 406*a* or under or over the oxide layer 406*c* may be employed. An n-layer structure (n is an integer of 5 or more) in which any one of the semiconductors described as examples of the oxide layer 406*a*, the oxide layer 406*b*, and the oxide layer 406*c* is provided at two or more of the following positions: over the oxide layer 406*a*, under the oxide layer 406*a*, over the oxide layer 406*c*, and under the oxide layer 406*c* may be employed.

In the transistor 490 described in this embodiment, in the channel width direction, the top surface and side surfaces of the oxide layer 406*b* are in contact with the oxide layer 406*c*, and the bottom surface of the oxide layer 406*b* is in contact with the oxide layer 406*a* (see FIG. 5B). Surrounding the oxide layer 406*b* with the oxide layers 406*a* and 406*c* in this manner can further reduce the influence of the trap states.

The band gap of each of the oxide layers 406*a* and 406*c* is preferably wider than that of the oxide layer 406*b*.

With one embodiment of the present invention, a transistor with a small variation in electrical characteristics can be provided. Accordingly, a semiconductor device with a small variation in electrical characteristics can be provided. With one embodiment of the present invention, a transistor with high reliability can be provided. Accordingly, a semiconductor device with high reliability can be provided.

An oxide semiconductor has a band gap of 2 eV or more; therefore, a transistor including an oxide semiconductor in a semiconductor film in which a channel is formed has an extremely low off-state current. Specifically, the off-state current per micrometer in channel width at room temperature (25° C.) and at a source-drain voltage of 3.5 V can be lower than 1×10$^{-20}$ A, lower than 1×10$^{-22}$ A, or lower than 1×10$^{-24}$ A. That is, the on/off ratio of the transistor can be greater than or equal to 20 digits and less than or equal to 150 digits.

With one embodiment of the present invention, a transistor with low power consumption can be provided. Accordingly, a semiconductor device with low power consumption can be provided.

(Embodiment 2)

In this embodiment, the structure of an oxide semiconductor will be described.

<Structure of Oxide Semiconductor>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.

<CAAC-OS>

First, a CAAC-OS will be described.

The CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 45A:
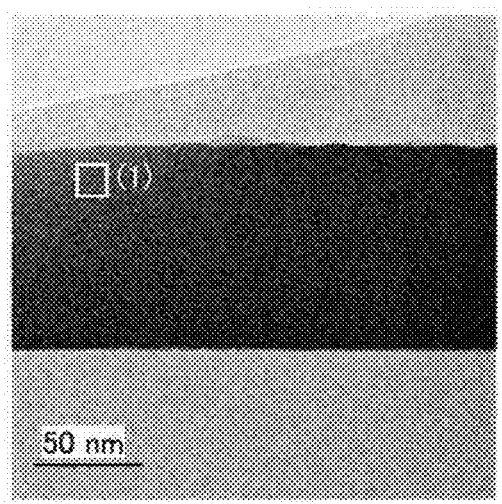
FIGS. 45A to 45D are Cs-corrected high-resolution TEM images of a cross section of a CAAC-OS and a schematic cross-sectional view of a CAAC-OS.

A CAAC-OS observed with TEM will be described below. FIG. 45A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 45B:
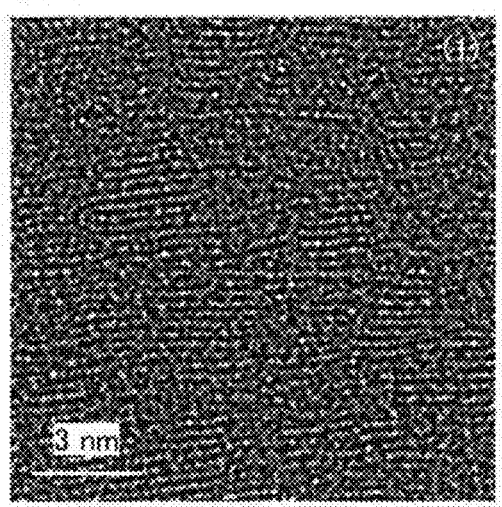

FIG. 45B is an enlarged Cs-corrected high-resolution TEM image of a region (1) in FIG. 45A. FIG. 45B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 45C:
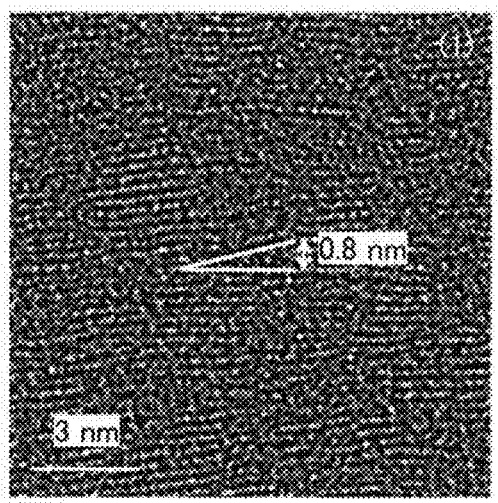

As shown in FIG. 45B, the CAAC-OS has a characteristic atomic arrangement. The characteristic atomic arrangement is denoted by an auxiliary line in FIG. 45C. FIGS. 45B and 45C prove that the size of a pellet is greater than or equal to 1 nm or greater than or equal to 3 nm, and the size of a space caused by tilt of the pellets is approximately 0.8 nm. Therefore, the pellet can also be referred to as a nanocrystal (nc). Furthermore, the CAAC-OS can also be referred to as an oxide semiconductor including c-axis aligned nanocrystals (CANC).

Figure 45D:
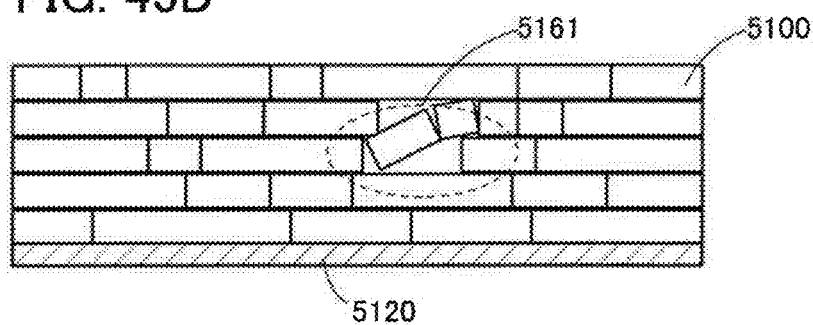

Here, according to the Cs-corrected high-resolution TEM images, the schematic arrangement of pellets 5100 of a CAAC-OS over a substrate 5120 is illustrated by such a structure in which bricks or blocks are stacked (see FIG. 45D). The part in which the pellets are tilted as observed in FIG. 45C corresponds to a region 5161 shown in FIG. 45D.

FIG. 46A shows a Cs-corrected high-resolution TEM image of a plane of the CAAC-OS observed from a direction substantially perpendicular to the sample surface. FIGS. 46B, 46C, and 46D are enlarged Cs-corrected high-resolution TEM images of regions (1), (2), and (3) in FIG. 46A, respectively. FIGS. 46B, 46C, and 46D indicate that metal atoms are arranged in a triangular, quadrangular, or hexagonal configuration in a pellet. However, there is no regularity of arrangement of metal atoms between different pellets.

Figure 47A:
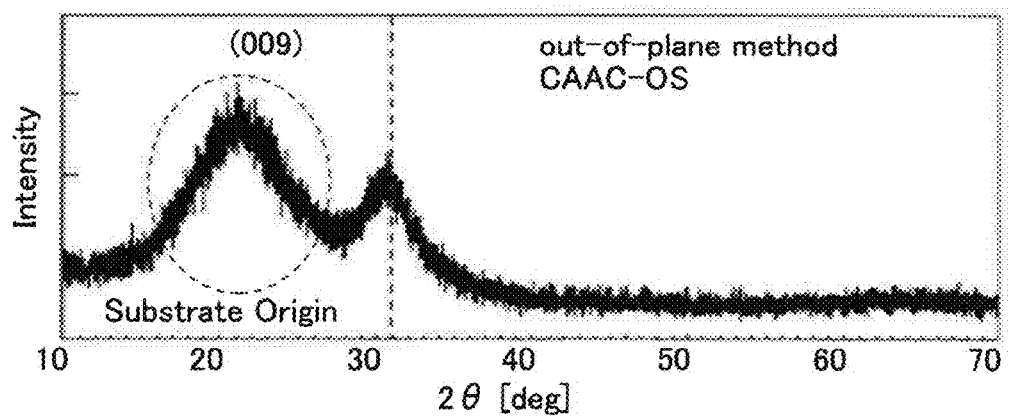
FIGS. 47A to 47C show structural analysis of a CAAC-OS and a single crystal oxide semiconductor by XRD.

Next, a CAAC-OS analyzed by X-ray diffraction (XRD) will be described. For example, when the structure of a CAAC-OS including an InGaZnO$_4$ crystal is analyzed by an out-of-plane method, a peak appears at a diffraction angle (2θ) of around 31° as shown in FIG. 47A. This peak is attributed to the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 47B:
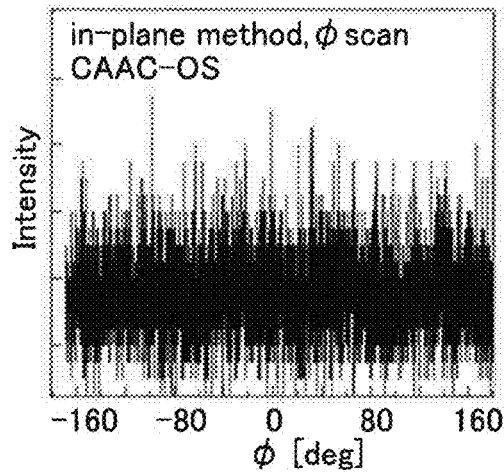
Figure 47C:
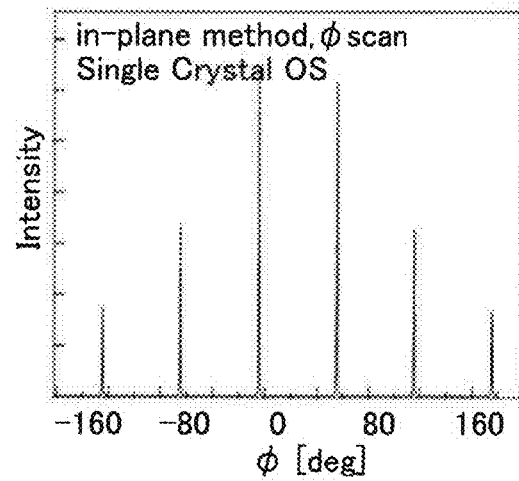

On the other hand, in structural analysis of the CAAC-OS by an in-plane method in which an X-ray beam is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 47B, a peak is not clearly observed. In contrast, in the case of a single crystal oxide semiconductor of InGaZnO$_4$, when φ scan is performed with 2θ fixed at around 56°, as shown in FIG. 47C, six peaks which are attributed to crystal planes equivalent to the (110) plane are observed. Accordingly, the structural analysis using XRD shows that the directions of a-axes and b-axes are irregularly oriented in the CAAC-OS.

Figure 48A:
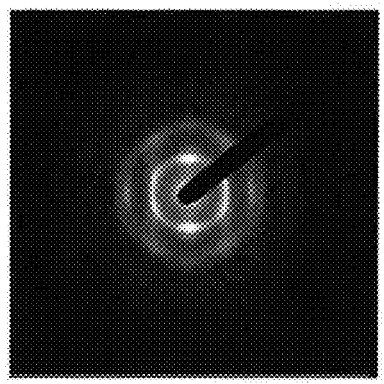
FIGS. 48A and 48B show electron diffraction patterns of a CAAC-OS.
Figure 48B:
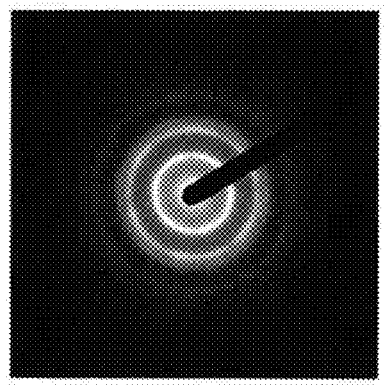

Next, a CAAC-OS analyzed by electron diffraction will be described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 48A can be obtained. In this diffraction pattern, spots attributed to the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 48B shows a diffraction pattern obtained in such a manner that an electron beam with a probe diameter of 300 nm is incident on the same sample in a direction perpendicular to the sample surface. As shown in FIG. 48B, a ring-like diffraction pattern is observed. Thus, the electron diffraction also indicates that the a-axes and b-axes of the pellets included in the CAAC-OS do not have regular alignment. The first ring in FIG. 48B is considered to be attributed to the (010) plane, the (100) plane, and the like of the InGaZnO$_4$ crystal. The second ring in FIG. 48B is considered to be attributed to the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. Furthermore, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density. Specifically, an oxide semiconductor with a carrier density of lower than $8 \times 10^{11}/cm^3$, preferably lower than $1 \times 10^{11}/cm^3$, further preferably lower than $1 \times 10^{10}/cm^3$, and is higher than or equal to $1 \times 10^{-9}/cm^3$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS will be described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, bright regions in a circular (ring) pattern are shown in some cases. Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 49:
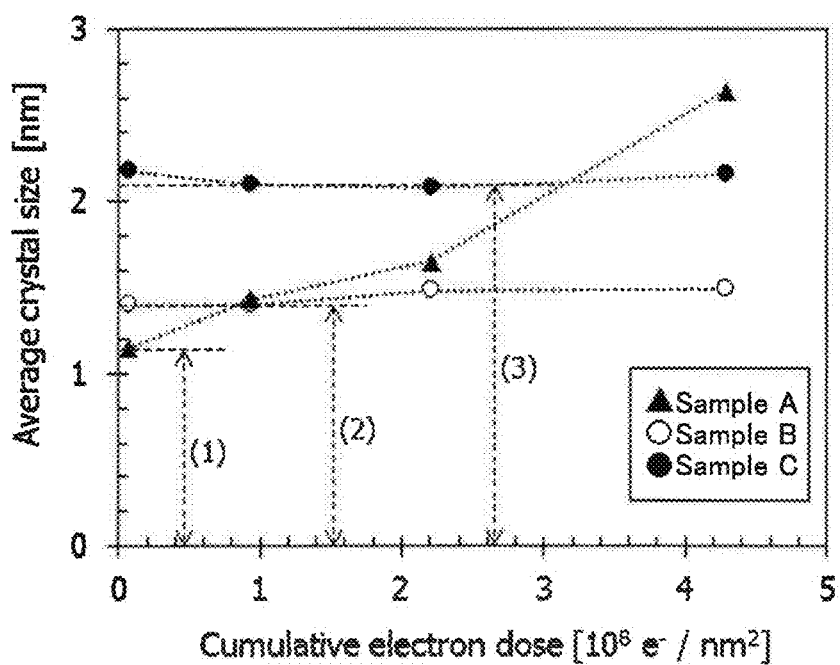
FIG. 49 shows a change in crystal part of an In—Ga—Zn oxide induced by electron irradiation.

FIG. 49 shows change in the average size of crystal parts (at 22 points to 45 points) in each sample. Note that the crystal part size corresponds to the length of a lattice fringe. FIG. 49 indicates that the crystal part size in the a-like OS increases with an increase in the cumulative electron dose. Specifically, as shown by (1) in FIG. 49, a crystal part of approximately 1.2 nm (also referred to as an initial nucleus) at the start of TEM observation grows to a size of approximately 2.6 nm at a cumulative electron dose of $4.2 \times 10^8$ e$^-$/nm$^2$. In contrast, the crystal part size in the nc-OS and the CAAC-OS shows little change from the start of electron irradiation to a cumulative electron dose of $4.2 \times 10^8$ e$^-$/nm$^2$. Specifically, as shown by (2) and (3) in FIG. 49, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor having an atomic ratio of In:Ga:Zn=1:1:1, the density of the a-like OS is higher than or equal to 5.0 g/cm$^3$ and lower than 5.9 g/cm$^3$. For example, in the case of the oxide semiconductor having an atomic ratio of In:Ga:Zn=1:1:1, the density of each of the nc-OS and the CAAC-OS is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

(Embodiment 3)

In this embodiment, a CPU in which at least the transistor described in the above embodiment can be used and the memory device described in the above embodiment is included is described.

Figure 50:
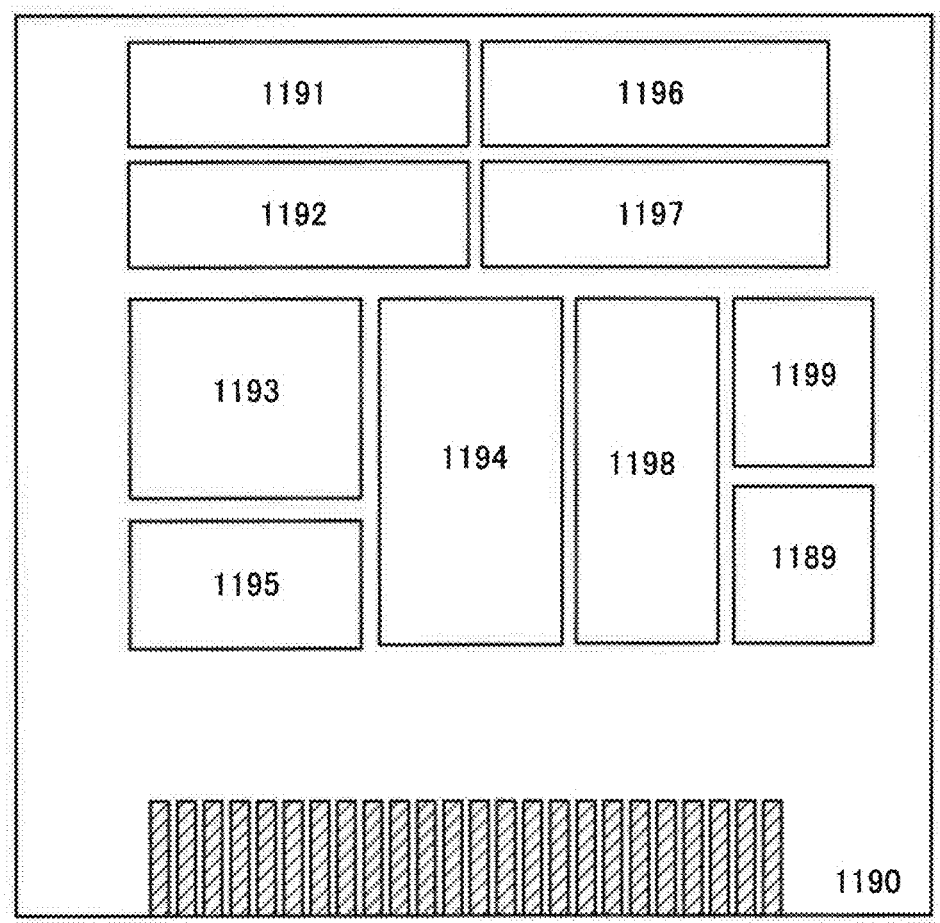
FIG. 50 illustrates a configuration example of a CPU of one embodiment.

FIG. 50 is a block diagram illustrating a configuration example of a CPU at least partly including the memory device described in the above embodiment as a component.

The CPU illustrated in FIG. 50 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 50 is just an example in which the configuration is simplified, and an actual CPU may have a variety of configurations depending on the application. For example, the CPU may have the following configuration: a structure including the CPU illustrated in FIG. 50 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 50, a memory cell is provided in the register 1196.

In the CPU illustrated in FIG. 50, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 51:
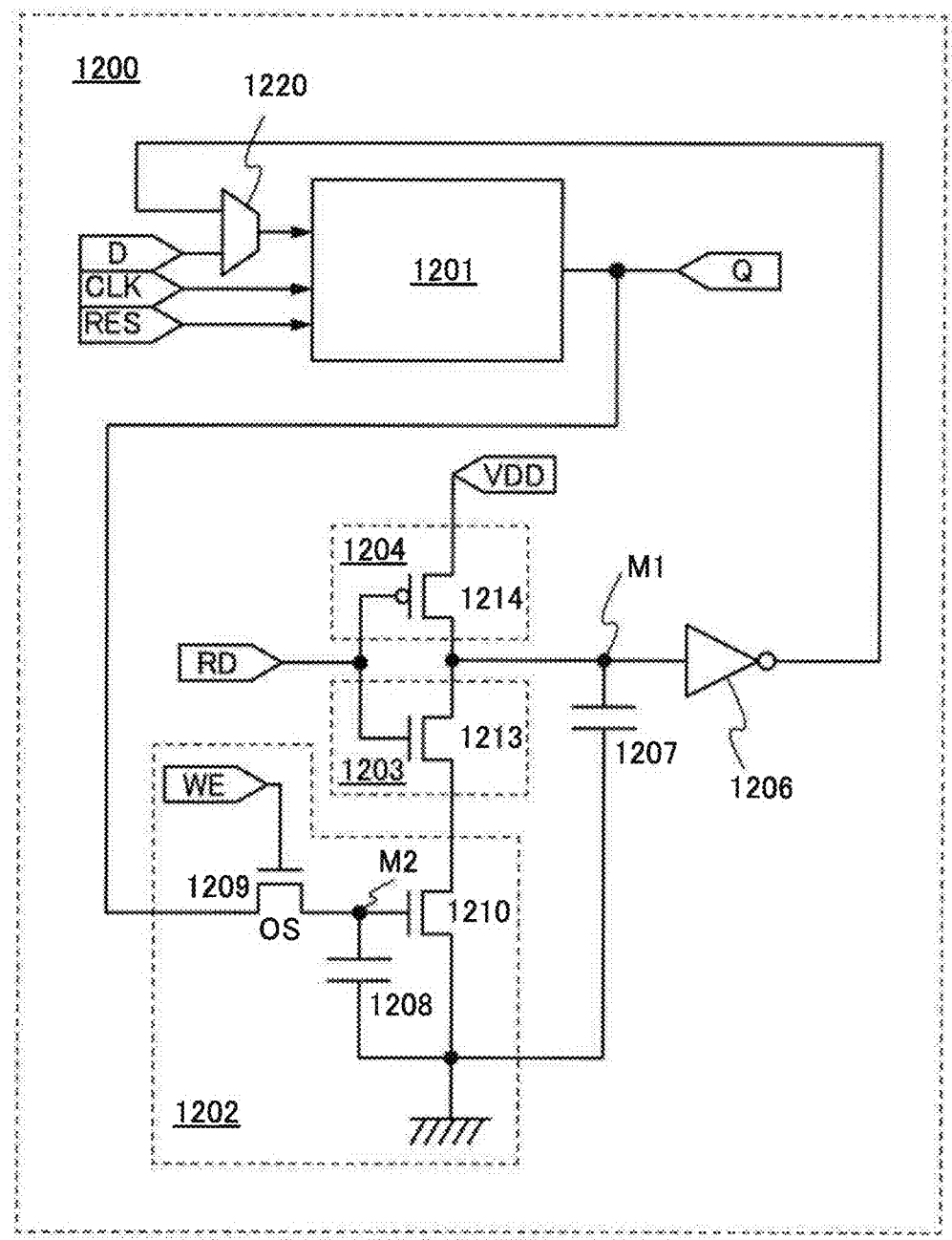
FIG. 51 is a circuit diagram of a memory element of one embodiment.

FIG. 51 is an example of a circuit diagram of a memory device that can be used for the register 1196. A memory device 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory device 1200 may further include another element such as a diode, a resistor, or an inductor, as needed. The transistor 1209 is preferably a transistor in which a channel is formed in an oxide semiconductor layer. For the transistor 1209, the transistor 490 described in the above embodiment can be referred to.

Here, the memory device described in the above embodiment can be used as the circuit 1202. When supply of a power supply voltage to the memory device 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Here, for example, the connection between the one of the source electrode and the drain electrode of the transistor 490 and the capacitor 150 in the structures illustrated in FIG. 1 and the like may be applied to the connection between one of a source electrode and a drain electrode of the transistor 1209 and the capacitor 1208 in the circuit in FIG. 51. Furthermore, the connection between the other of the source electrode and the drain electrode of the transistor 490 and the gate electrode of the transistor 491 may be applied to the connection between the one of the source electrode and the drain electrode of the transistor 1209 and the gate electrode of the transistor 1210 in the circuit in FIG. 51.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 51 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 51, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 51, the transistors included in the memory device 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor layer can be used for all the transistors in the memory device 1200. Further alternatively, in the memory device 1200, a transistor in which a channel is formed in an oxide semiconductor layer can be included besides the transistor 1209, and a transistor in which a channel is formed in a layer formed using a semiconductor other than an oxide semiconductor or the substrate 1190 can be used for the rest of the transistors.

As the circuit 1201 in FIG. 51, for example, a flip-flop circuit can be used. As the logic element 1206, for example, an inverter or a clocked inverter can be used.

In a period during which the memory device 1200 is not supplied with the power supply voltage, the semiconductor device of one embodiment of the present invention can retain data stored in the circuit 1201 by the capacitor 1208 that is provided in the circuit 1202.

The off-state current of a transistor in which a channel is formed in an oxide semiconductor layer is extremely small. For example, the off-state current of a transistor in which a channel is formed in an oxide semiconductor layer is significantly smaller than that of a transistor in which a channel is formed in silicon having crystallinity. Thus, when the transistor is used as the transistor 1209, a signal is retained in the capacitor 1208 for a long time also in a period during which the power supply voltage is not supplied to the memory device 1200. The memory device 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory device 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 changes to some degree.

By using the above-described memory device 1200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory device 1200 is used in a CPU in this embodiment, the memory device 1200 can also be used in an LSI such as a digital signal processor (DSP), a custom LSI, or a programmable logic device (PLD), and a radio frequency identification (RF-ID).

At least part of this embodiment can be implemented in combination with any of the other embodiments described in this specification as appropriate.

(Embodiment 4)

In this embodiment, an RF tag that includes the memory device described in the above embodiment is described with reference to FIG. 52.

The RF tag of this embodiment includes a memory circuit, stores necessary data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have extremely high reliability in order to be used for this purpose.

A configuration of the RF tag will be described with reference to FIG. 52. FIG. 52 is a block diagram illustrating a configuration example of an RF tag.

Figure 52:
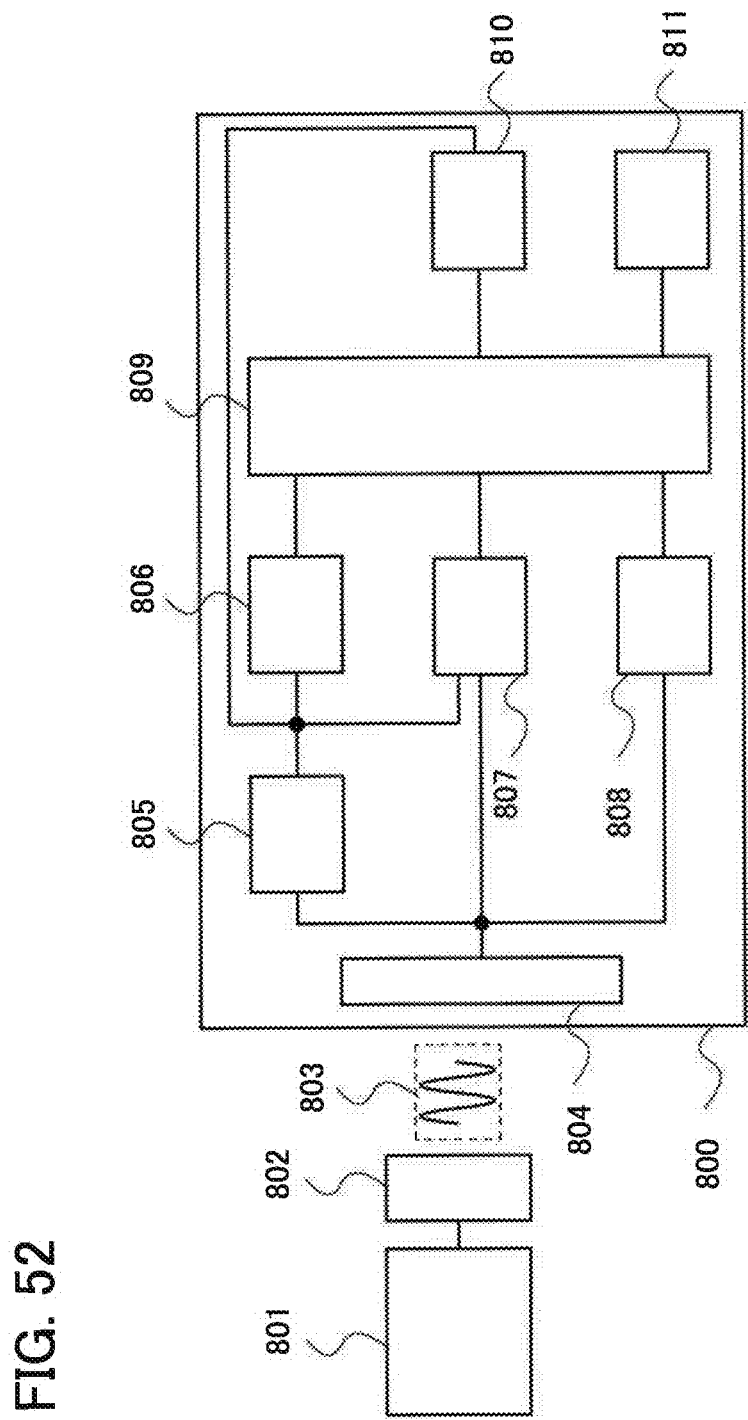
FIG. 52 illustrates a configuration example of an RF tag of one embodiment.
Figure 53A:
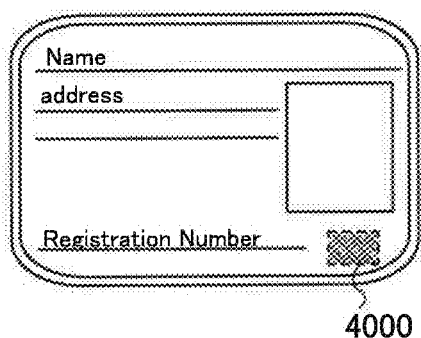
FIGS. 53A to 53F each illustrate an application example of an RF tag of an embodiment.
Figure 53B:
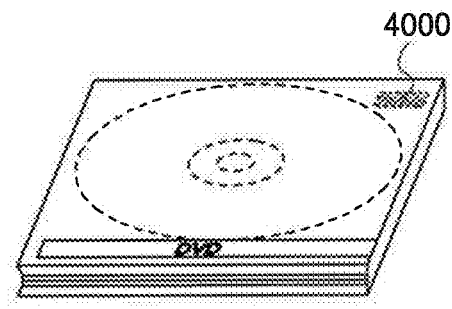
Figure 53C:
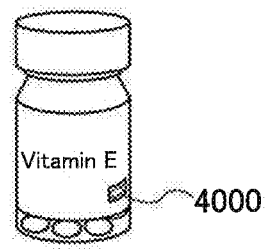
Figure 53D:
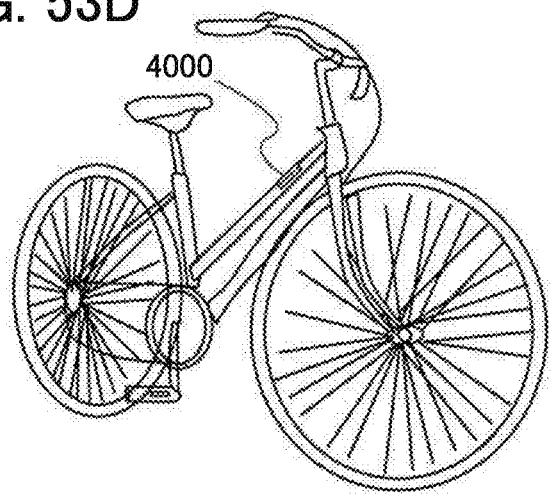
Figure 53E:
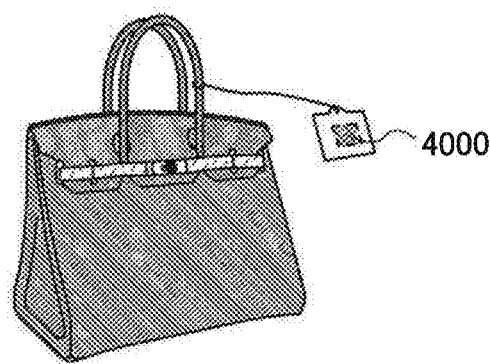
Figure 53F:
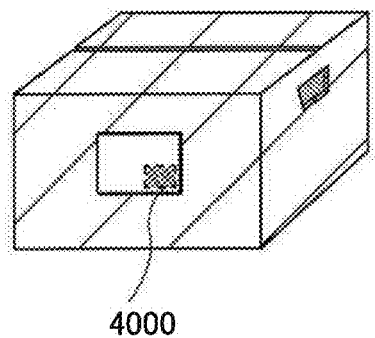

As shown in FIG. 52, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A transistor having a rectifying function included in the demodulation circuit 807 may be formed using a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800 described in this embodiment.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit which generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the memory device described in the above embodiment can be used as the memory circuit 810. When the memory device described in the above embodiment is used as the memory circuit 810, data retention is possible even when power is not supplied; accordingly, the memory circuit can be favorably used for an RF tag. Furthermore, the memory device of one embodiment of the present invention needs power (voltage) for data writing significantly lower than that needed in a conventional nonvolatile memory; thus, it is possible to prevent a difference between the maximum communication range in data reading and that in data writing. In addition, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management for the shipped products is easily performed.

At least part of this embodiment can be implemented in combination with any of the other embodiments described in this specification as appropriate.

(Embodiment 5)

In this embodiment, application examples of an RF tag of one embodiment of the present invention are described with reference to FIGS. 53A to 53F. The RF tag is widely used and can be provided for, for example, products such as bills, coins, securities, bearer bonds, documents (e.g., driver's licenses or residence cards, see FIG. 53A), recording media (e.g., DVDs or video tapes, see FIG. 53B), packaging containers (e.g., wrapping paper or bottles, see FIG. 53C), vehicles (e.g., bicycles, see FIG. 53D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 53E and 53F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RF tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be retained for an extremely long period even in the state where power is not supplied; thus, the RF tag can be preferably used for application in which data is not frequently written or read.

At least part of this embodiment can be implemented in combination with any of the other embodiments described in this specification as appropriate.

(Embodiment 6)

The semiconductor device of one embodiment of the present invention may include a display panel. The semiconductor device of one embodiment of the present invention may be used in a circuit for driving a display portion of a display panel. One embodiment of the present invention may include a display panel and the semiconductor device shown in another embodiment. In this embodiment, a structure example of a display panel is described.

[Structure Example]

Figure 54A:
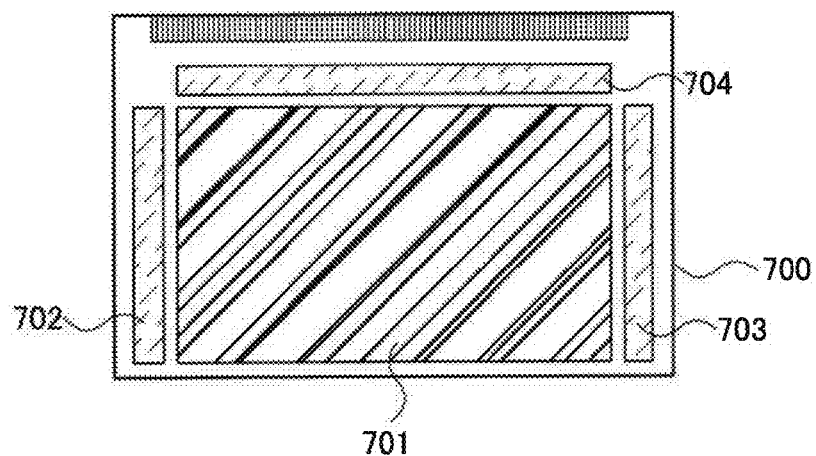
FIGS. 54A to 54C are a top view and circuit diagrams of a display device of one embodiment.
Figure 54B:
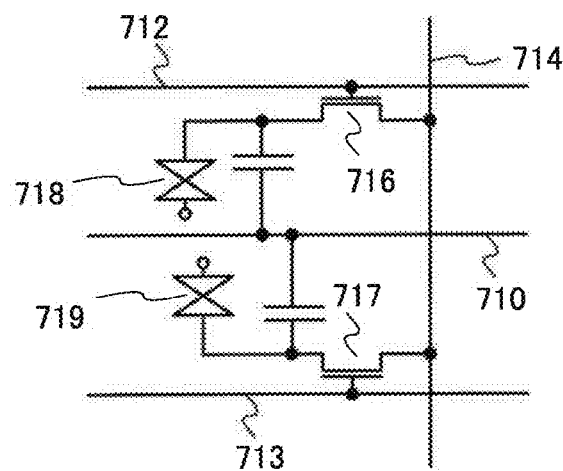
Figure 54C:
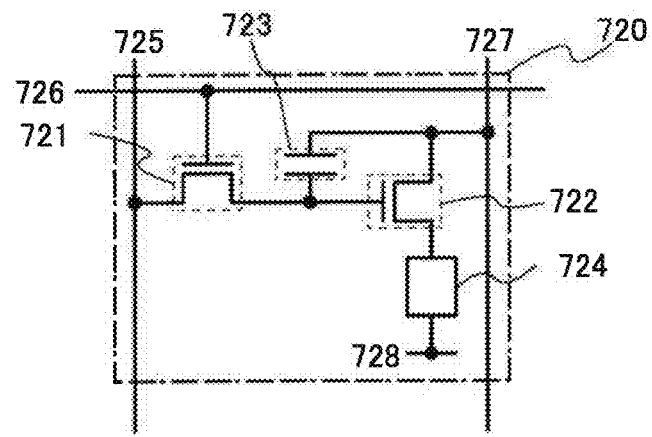

FIG. 54A is a top view of the display panel of one embodiment of the present invention. FIG. 54B is a circuit diagram illustrating a pixel circuit that can be used in the case where a liquid crystal element is used in a pixel in the display panel of one embodiment of the present invention. FIG. 54C is a circuit diagram illustrating a pixel circuit that can be used in the case where an organic EL element is used in a pixel in the display panel of one embodiment of the present invention.

The transistor in the pixel portion can be formed in accordance with the above embodiment. For example, the transistor 490 described in the above embodiment can be referred to. The transistor can be easily formed as an n-channel transistor, and thus part of a driver circuit that can be formed using an n-channel transistor can be formed over the same substrate as the transistor of the pixel portion. With the use of any of the transistors described in the above embodiment for the pixel portion or the driver circuit in this manner, a highly reliable display device can be provided.

The transistor in the pixel portion of the display panel and part of a driver circuit that can be formed using an n-channel transistor are preferably provided in the layer 629 described in the above embodiment. In that case, for example, some transistors in the driver circuit may be provided in the layer 627 described in the above embodiment. Furthermore, for example, the driver circuit portion and the pixel portion may be electrically connected to each other through a wiring provided in the layer 628 described in the above embodiment.

FIG. 54A illustrates an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels that include display elements are provided in a matrix in respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 54A, the first scan line driver circuit 702, the second scan line driver circuit 703, and the signal line driver circuit 704 are formed over the substrate 700 where the pixel portion 701 is formed. Consequently, the number of components provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of wiring connections can be reduced. Consequently, an improvement in reliability or yield can be achieved.

[Liquid Crystal Panel]

FIG. 54B illustrates an example of a circuit configuration of the pixel. Here, a pixel circuit that can be used in a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 that functions as a data line is shared by the transistors 716 and 717. The transistor 490 described the above embodiment can be used as appropriate as each of the transistors 716 and 717. Thus, a highly reliable liquid crystal display panel can be provided.

A first pixel electrode layer is electrically connected to the transistor 716 and a second pixel electrode layer is electrically connected to the transistor 717. The first pixel electrode layer and the second pixel electrode layer are separated. Shapes of the first pixel electrode layer and the second pixel electrode layer are not particularly limited. For example, the first pixel electrode layer may have a V-like shape.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

In addition, a storage capacitor may be formed using a capacitor wiring 710, a gate insulating film functioning as a dielectric, and a capacitor electrode electrically connected to the first pixel electrode layer or the second pixel electrode layer.

The multi-domain structure includes a first liquid crystal element 718 and a second liquid crystal element 719 in one pixel. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit is not limited to that shown in FIG. 54B. For example, a switch, a resistor, a capacitor, a transistor, a sensor, a logic circuit, or the like may be added to the pixel shown in FIG. 54B.

[Organic EL Panel]

FIG. 54C shows another example of a circuit configuration of the pixel. Here, a pixel structure of a display panel using an organic EL element is shown.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. On the basis of such a mechanism, this light-emitting element is referred to as a current-excitation light-emitting element.

FIG. 54C shows an example of a pixel circuit that can be used. In this example, one pixel includes two n-channel transistors. Note that the semiconductor layer of one embodiment of the present invention can be used for channel formation regions of the n-channel transistors. Digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistor 490 described in the above embodiment can be used as appropriate. In this manner, a highly reliable organic EL display panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. A potential difference between the high power supply potential and the low power supply potential is set to be a value greater than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode layer of the driver transistor 722. Note that voltage higher than or equal to voltage that is the sum of power supply line voltage and the threshold voltage $V_{th}$ of the driver transistor 722 is applied to the signal line 725.

In the case of performing analog grayscale driving, voltage greater than or equal to voltage that is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit is not limited to that shown in FIG. 54C. For example, a switch, a resistor, a capacitor, a sensor, a transistor, a logic circuit, or the like may be added to the pixel circuit shown in FIG. 54C.

In the case where any of the transistors described in the above embodiment is used for the circuit shown in FIGS. 54A to 54C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescence (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light depending on current), an electron emitter, a liquid crystal element, electronic ink, an electrophoretic element, a plasma display panel (PDP), a display element using micro electro mechanical systems (MEMS) (e.g., a grating light valve (GLV), a digital micromirror device (DMD), a digital micro shutter (DMS), an interferometric modulator display (IMOD) element, a MEMS shutter display element, an optical-interference-type MEMS display element, and a piezoelectric ceramic display), an electrowetting element, a quantum dot, and a display element including a carbon nanotube. Other than the above, a display medium whose contrast, luminance, reflectance, transmittance, or the like is changed by electrical or magnetic action may be included. Examples of a display device having an EL element include an EL display. Examples of a display device having an electron emitter include a field emission display (FED) and a surface-conduction electron-emitter display (SED)-type flat panel display. Examples of a display device using a quantum dot in each pixel include a quantum dot display. Note that a quantum dot may be provided in part of a backlight instead of as a display element. The usage of the quantum dot leads to display with high color purity. Examples of a display device including a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device including electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption. Note that in the case of using an LED chip, graphene or graphite may be provided under an electrode or a nitride semiconductor of the LED chip. Graphene or graphite may be a multilayer film in which a plurality of layers are stacked. The provision of graphene or graphite enables easy formation of a nitride semiconductor film thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when graphene is provided, the GaN semiconductor layers included in the LED chip can also be formed by a sputtering method. In a display element using MEMS, a drying agent may be provided in a space where the display element is provided (e.g., a space between an element substrate where the display element is provided and a counter substrate positioned on the side opposite to the element substrate). The drying agent can prevent moisture from making operation of the MEMS or the like difficult and from promoting deterioration.

Note that in this specification and the like, a transistor can be formed using any of a variety of substrates, for example. The type of a substrate is not limited to a certain type. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. Examples of a glass substrate include a barium borosilicate glass substrate, an aluminoborosilicate glass substrate, and soda lime glass substrate. Examples of the flexible substrate, the attachment film, the base material film, and the like are substrates of plastics typified by polyethylene terephthalate (PET), polyethylene naphthalate (PEN), and polyether sulfone (PES). Another example is a synthetic resin such as acrylic. Furthermore, polypropylene, polyester, polyvinyl fluoride, and polyvinyl chloride can be given as examples. Furthermore, polyamide, polyimide, aramid, epoxy, an inorganic vapor deposition film, and paper can be given as examples. Specifically, the use of semiconductor substrates, single crystal substrates, SOI substrates, or the like enables the manufacture of small-sized transistors with a small variation in characteristics, size, shape, or the like and with high current capability. A circuit using such transistors achieves lower power consumption of the circuit or higher integration of the circuit.

Alternatively, a flexible substrate may be used as the substrate, and the transistor may be provided directly on the flexible substrate. Alternatively, a separation layer may be provided between the substrate and the transistor. The separation layer can be used when part or the whole of a semiconductor device formed over the separation layer is separated from the substrate and transferred onto another substrate. In such a case, the transistor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

In other words, a transistor may be formed using one substrate, and then transferred to another substrate. Examples of a substrate to which a transistor is transferred include, in addition to the above substrate over which the transistor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, and a rubber substrate. When such a substrate is used, a transistor with excellent properties or a transistor with low power consumption can be formed, a device with high durability, high heat resistance can be provided, or reduction in weight or thickness can be achieved.

At least part of this embodiment can be implemented in combination with any of the other embodiments described in this specification as appropriate.

(Embodiment 7)

Specific examples of the electronic device that uses the semiconductor device of one embodiment of the present invention are as follows: display devices of televisions, monitors, and the like, lighting devices, desktop and laptop personal computers, word processors, image reproduction devices that reproduce still images and moving images stored in recording media such as digital versatile discs (DVDs), portable CD players, radios, tape recorders, headphone stereos, stereos, table clocks, wall clocks, cordless phone handsets, transceivers, car phones, mobile phones, portable information terminals, tablet terminals, portable game machines, stationary game machines such as pachinko machines, calculators, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Further examples include the following industrial equipment: guide lights, traffic lights, belt conveyors, elevators, escalators, industrial robots, power storage systems, and power storage devices for leveling the amount of power supply and smart grid. In addition, moving objects and the like driven by fuel engines and electric motors using power from power storage units, and the like may also be included in the range of electronic devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like.

Figure 55A:
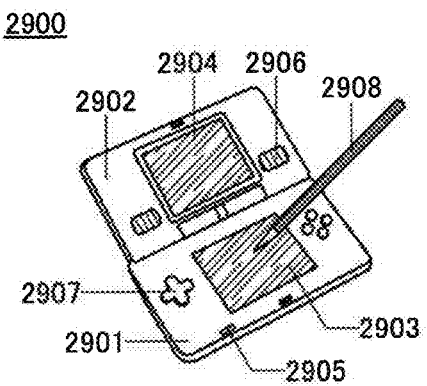
FIGS. 55A to 55H illustrate examples of electronic devices.

A portable game machine 2900 illustrated in FIG. 55A includes a housing 2901, a housing 2902, a display portion 2903, a display portion 2904, a microphone 2905, a speaker 2906, an operation key 2907, and the like. Although the portable game machine in FIG. 55A has the two display portions 2903 and 2904, the number of display portions is not limited to this. The display portion 2903 is provided with a touch screen as an input device, which can be handled with a stylus 2908 or the like.

Figure 55B:
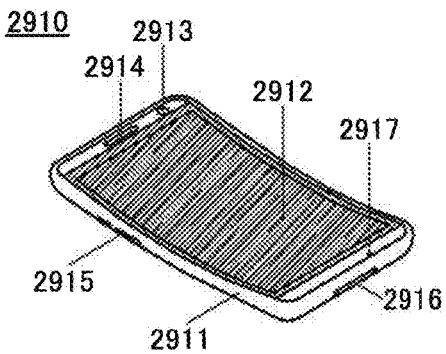

An information terminal 2910 illustrated in FIG. 55B includes a housing 2911, a display portion 2912, a microphone 2917, a speaker portion 2914, a camera 2913, an external connection portion 2916, an operation button 2915, and the like. A display panel that uses a flexible substrate and a touch screen are provided in the display portion 2912. The information terminal 2910 can be used as, for example, a smartphone, a mobile phone, a tablet information terminal, a tablet personal computer, or an e-book reader.

Figure 55C:
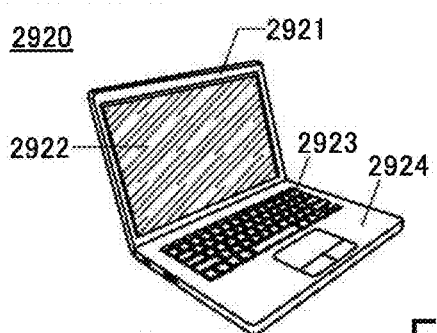

A notebook personal computer 2920 illustrated in FIG. 55C includes a housing 2921, a display portion 2922, a keyboard 2923, a pointing device 2924, and the like.

Figure 55D:
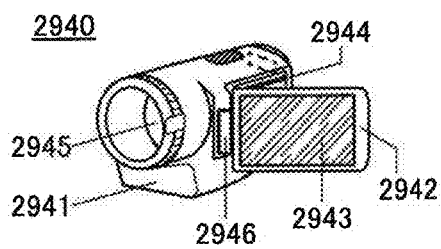

A video camera 2940 illustrated in FIG. 55D includes a housing 2941, a housing 2942, a display portion 2943, operation keys 2944, a lens 2945, a joint 2946, and the like. The operation keys 2944 and the lens 2945 are provided for the housing 2941, and the display portion 2943 is provided for the housing 2942. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image may be switched depending on the angle between the housings 2941 and 2942.

Figure 55E:
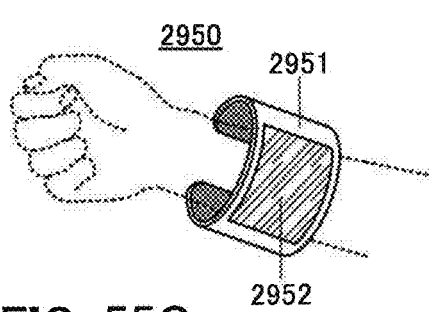

FIG. 55E illustrates an example of a bangle-type information terminal. An information terminal 2950 includes a housing 2951, a display portion 2952, and the like. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 55F:
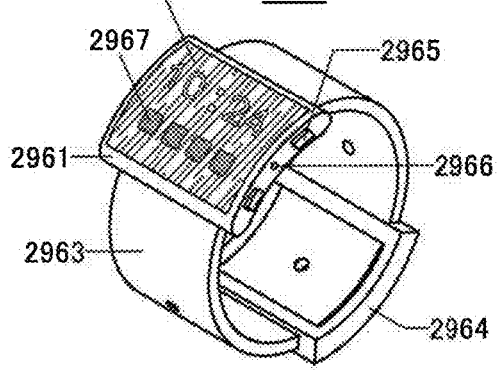

FIG. 55F illustrates an example of a watch-type information terminal. An information terminal 2960 includes a housing 2961, a display portion 2962, a band 2963, a buckle 2964, an operation button 2965, an input/output terminal 2966, and the like. The information terminal 2960 is capable of executing a variety of applications such as mobile phone calls, e-mailing, text viewing and editing, music reproduction, Internet communication, and computer games.

The display surface of the display portion 2962 is bent, and images can be displayed on the bent display surface. Furthermore, the display portion 2962 includes a touch sensor, and operation can be performed by touching the screen with a finger, a stylus, or the like. For example, an application can be started by touching an icon 2967 displayed on the display portion 2962. With the operation button 2965, a variety of functions such as time setting, ON/OFF of the power, ON/OFF of wireless communication, setting and cancellation of a silent mode, and setting and cancellation of a power saving mode can be performed. For example, the functions of the operation button 2965 can be set by setting the operating system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

Figure 55G:
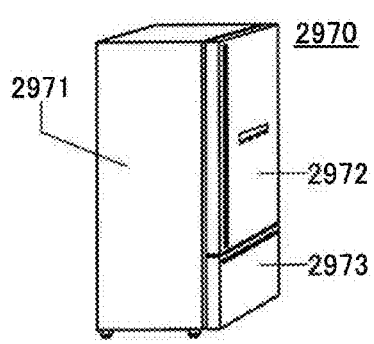

FIG. 55G illustrates an electric refrigerator-freezer as an example of a home electric appliance. An electric refrigerator-freezer 2970 includes a housing 2971, a refrigerator door 2972, a freezer door 2973, and the like.

Figure 55H:
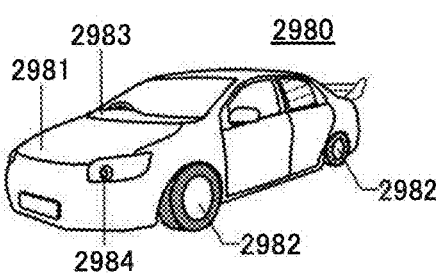

FIG. 55H is an external view illustrating an example of a car. A car 2980 includes a car body 2981, wheels 2982, a dashboard 2983, lights 2984, and the like.

The electronic devices described in this embodiment include any of the above-described transistors, semiconductor devices, or the like.

At least part of this embodiment can be implemented in combination with any of the embodiments described in this specification as appropriate. In some cases, the electronic device described in this embodiment that includes the semiconductor device described in the other embodiment can be improved in performance, for example. Alternatively, the power consumption of the electronic device can be reduced in some cases.

(Embodiment 8)
[Imaging Device]

In this embodiment, an imaging device using one embodiment of the present invention is described.

<Configuration Example of Imaging Device 600>

Figure 56A:
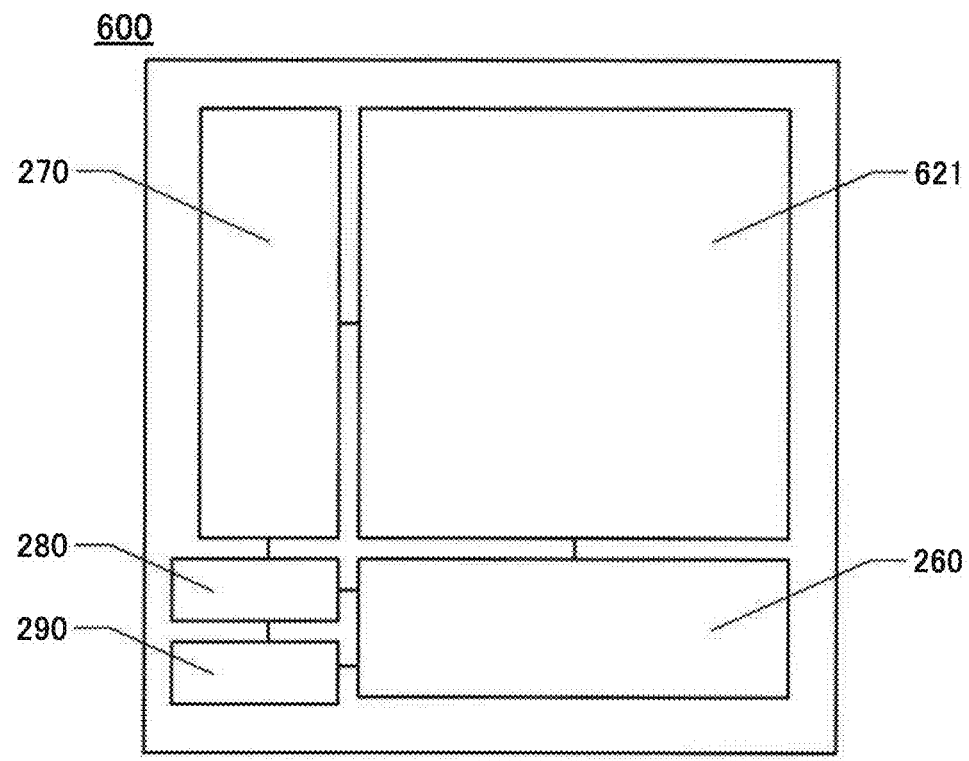
FIGS. 56A and 56B illustrate examples of an imaging device.

FIG. 56A is a plan view illustrating a configuration example of an imaging device 600. The imaging device 600 includes a pixel portion 621, a first circuit 260, a second circuit 270, a third circuit 280, and a fourth circuit 290. In this specification and the like, the first circuit 260 to the fourth circuit 290 and the like may be referred to as "peripheral circuit" or "driving circuit". For example, the first circuit 260 can be regarded as part of the peripheral circuit.

Figure 56B:
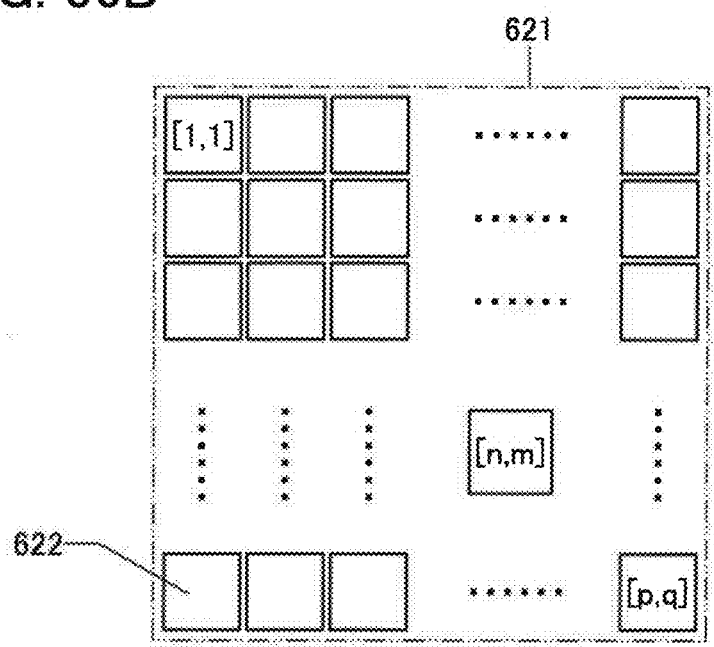

FIG. 56B illustrates a structure example of the pixel portion 621. The pixel portion 621 includes a plurality of pixels 622 (imaging element) arranged in a matrix with p rows and q columns (p and q are each a natural number greater than or equal to 2). Note that in FIG. 56B, n is a natural number of greater than or equal to 1 and smaller than or equal to p, and m is a natural number of greater than or equal to 1 and smaller than or equal to q.

For example, using the pixels 622 arranged in a matrix of 1920×1080, the imaging device 600 can take an image with "full high definition" (also referred to as "2K resolution", "2K1K", "2K", and the like). Using the pixels 622 arranged in a matrix of 4096×2160, the imaging device 600 can take an image with "ultra high definition" (also referred to as "4K resolution", "4K2K", "4K", and the like). Using the pixels 622 arranged in a matrix of 8192×4320, the imaging device 600 can take an image with "super high definition" (also referred to as "8K resolution", "8K4K", "8K", and the like). Using a larger number of display elements, the imaging device 600 can take an image with 16K or 32K resolution.

The first circuit 260 and the second circuit 270 are connected to the plurality of pixels 622 and have a function of supplying signals for driving the plurality of pixels 622. The first circuit 260 may have a function of processing an analog signal output from the pixels 622. The third circuit 280 may have a function of controlling the operation timing of the peripheral circuit. For example, the third circuit 280 may have a function of generating a clock signal. Furthermore, the third circuit 280 may have a function of converting the frequency of a clock signal supplied from the outside. Moreover, the third circuit 280 may have a function of supplying a reference potential signal (e.g., a ramp wave signal).

The peripheral circuit includes at least one of a logic circuit, a switch, a buffer, an amplifier circuit, and a converter circuit. Alternatively, transistors or the like included in the peripheral circuit may be formed using part of a semiconductor that is formed to fabricate an after-mentioned pixel driver circuit 610. Part or the whole of the peripheral circuit may be mounted using a semiconductor device such as an IC chip.

Note that in the peripheral circuit, at least one of the first circuit 260 to the fourth circuit 290 may be omitted. For example, when one of the first circuit 260 and the fourth circuit 290 additionally has a function of the other of the first circuit 260 and the fourth circuit 290, the other of the first circuit 260 and the fourth circuit 290 may be omitted. For another example, when one of the second circuit 270 and the third circuit 280 additionally has a function of the other of the second circuit 270 and the third circuit 280, the other of the second circuit 270 and the third circuit 280 may be omitted. For further another example, a function of another peripheral circuit may be added to one of the first circuit 260 to the fourth circuit 290 to omit that peripheral circuit.

Figure 57:
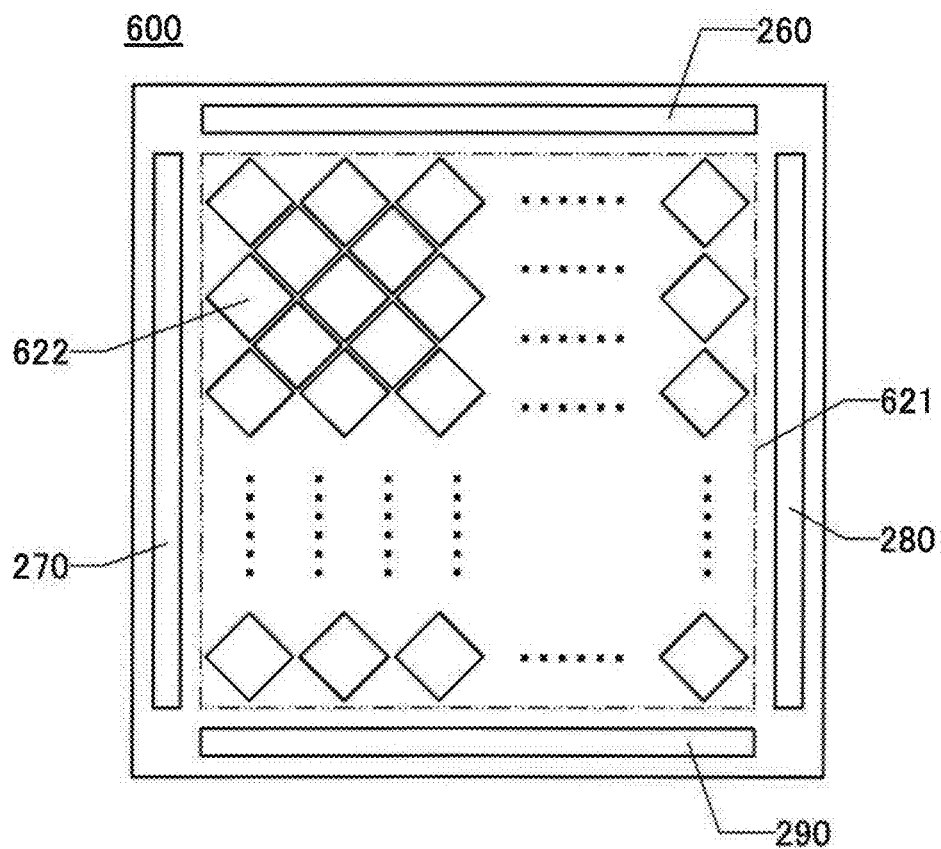
FIG. 57 illustrates an example of an imaging device.

As illustrated in FIG. 57, the first circuit 260 to the fourth circuit 290 may be provided along the periphery of the pixel portion 621. In the pixel portion 621 included in the imaging device 600, the pixels 622 may be obliquely arranged. When the pixels 622 are obliquely arranged, the distance between pixels (pitch) can be shortened in the row direction and the column direction. Accordingly, the quality of an image taken with the imaging device 600 can be improved.

Figure 58A:
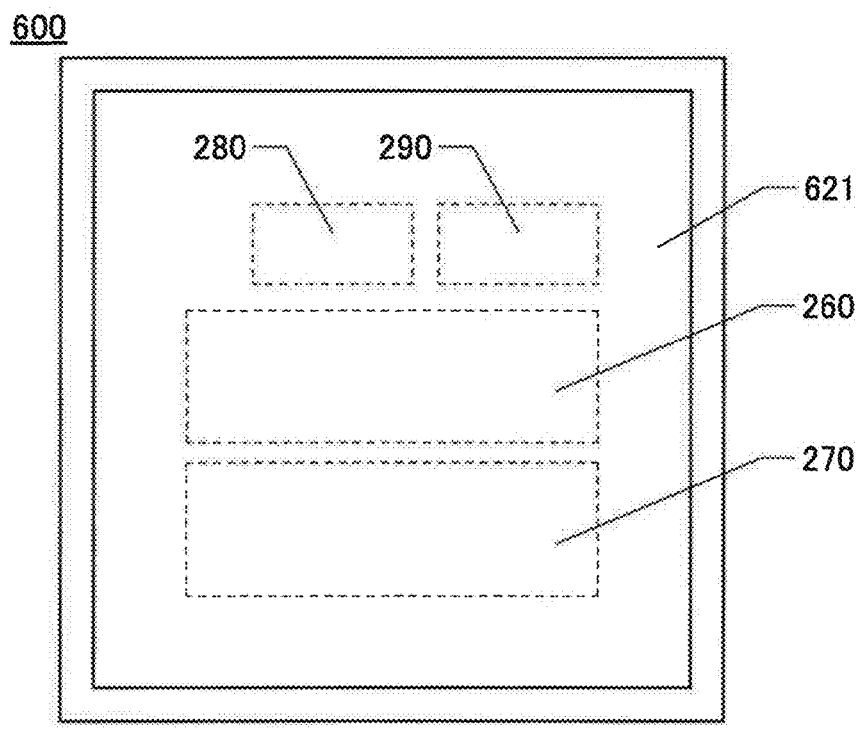
FIGS. 58A and 58B illustrate an example of an imaging device.
Figure 58B:
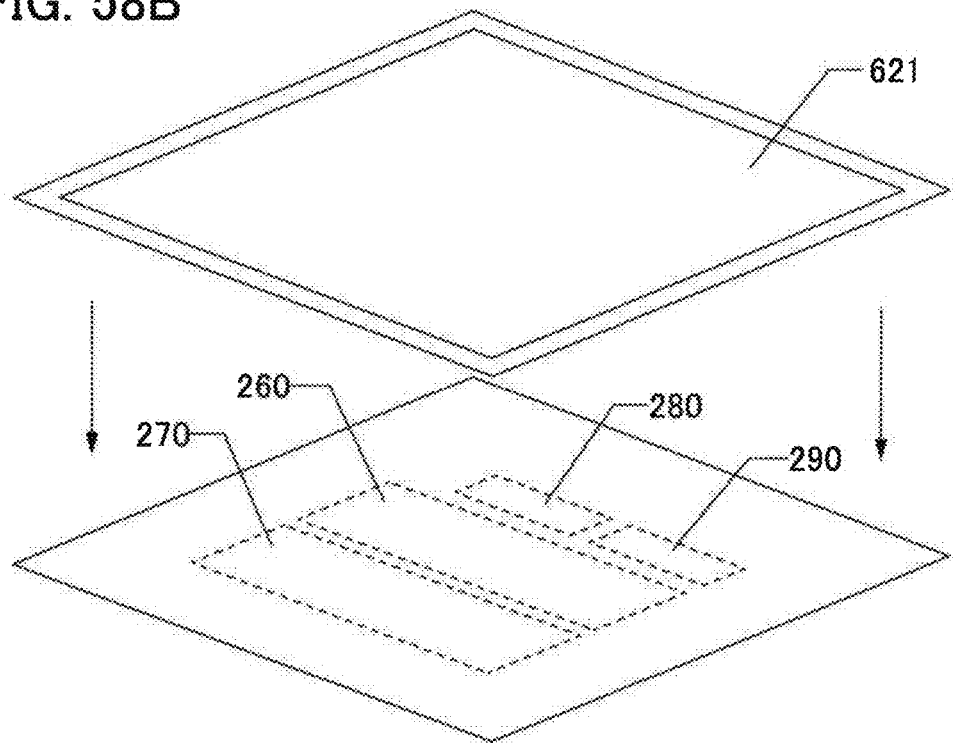

As illustrated in FIGS. 58A and 58B, the pixel portion 621 may be provided over the first circuit 260 to the fourth circuit 290 to overlap with the first circuit 260 to the fourth circuit 290. FIG. 58A is a top view of the imaging device 600 in which the pixel portion 621 is provided over the first circuit 260 to the fourth circuit 290 to overlap with the first circuit 260 to the fourth circuit 290. FIG. 58B is a perspective view illustrating the structure of the imaging device 600 illustrated in FIG. 58A.

The provision of the pixel portion 621 over the first circuit 260 to the fourth circuit 290 to overlap with the first circuit 260 to the fourth circuit 290 can increase the area occupied by the pixel portion 621 for the imaging device 600. Accordingly, the light sensitivity, the dynamic range, the resolution, the reproducibility of a taken image, or the integration degree of the imaging device 600 can be increased.

[Color Filter and the Like]

The pixels 622 included in the imaging device 600 are used as subpixels, and each of the plurality of pixels 622 is provided with a filter that transmits light in a different wavelength range (color filter), whereby data for achieving color image display can be obtained.

Figure 59A:
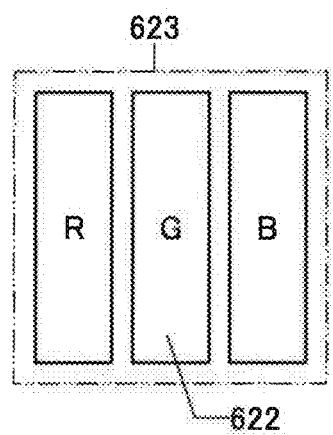
FIGS. 59A to 59D illustrate pixel configuration examples.

FIG. 59A is a plan view showing an example of a pixel 623 with which a color image is obtained. In FIG. 59A, the pixel 622 provided with a color filter that transmits light in a red (R) wavelength range (also referred to as "pixel 622R"), the pixel 622 provided with a color filter that transmits light in a green (G) wavelength range (also referred to as "pixel 622G"), and the pixel 622 provided with a color filter that transmits light in a blue (B) wavelength range (also referred to as "pixel 622B") are provided. The pixel 622R, the pixel 622G, and the pixel 622B collectively function as one pixel 623.

The color filter used in the pixel 623 is not limited to red (R), green (G), and blue (B) color filters, and color filters that transmit light of cyan (C), yellow (Y), and magenta (M) may be used. The pixels 622 that sense light in at least three different wavelength ranges are provided in one pixel 623, whereby a full-color image can be obtained.

Figure 59B:
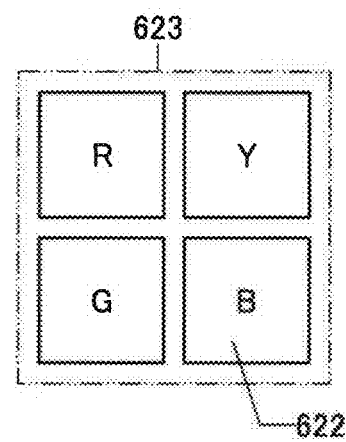
Figure 59C:
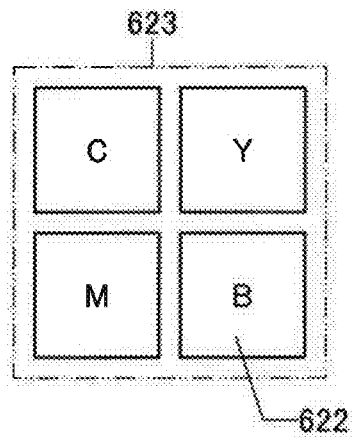

FIG. 59B illustrates the pixel 623 including the pixel 622 provided with a color filter that transmits yellow (Y) light, in addition to the pixels 622 provided with the color filters that transmit red (R), green (G), and blue (B) light. FIG. 59C illustrates the pixel 623 including the pixel 622 provided with a color filter that transmits blue (B) light, in addition to the pixels 622 provided with the color filters that transmit cyan (C), yellow (Y), and magenta (M) light. When the pixels 622 that sense light in four or more different wavelength ranges are provided in one pixel 623, the reproducibility of colors of an obtained image can be increased.

Figure 59D:
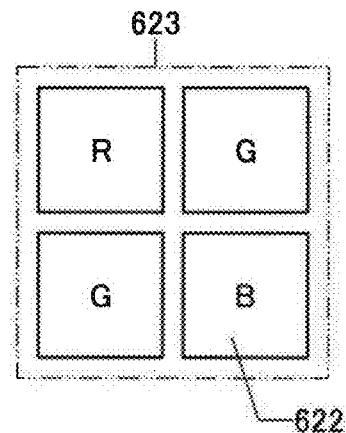

The pixel number ratio (or the ratio of light receiving area) of the pixel 622R to the pixel 622G and the pixel 622B is not necessarily be 1:1:1. The pixel number ratio (the ratio of light receiving area) of red to green and blue may be 1:2:1 (Bayer arrangement), as illustrated in FIG. 59D. Alternatively, the pixel number ratio (the ratio of light receiving area) of red to green and blue may be 1:6:1.

Although the number of pixels 622 used in the pixel 623 may be one, two or more is preferable. For example, when two or more pixels 622 that sense light in the same wavelength range are provided, the redundancy is increased, and the reliability of the imaging device 600 can be increased.

When an infrared (IR) filter that transmits infrared light and absorbs or reflects light in a wavelength shorter than or equal to that of visible light is used as the filter, the imaging device 600 that detects infrared light can be achieved. Alternatively, when an ultra violet (UV) filter that transmits ultraviolet light and absorbs or reflects light in a wavelength longer than or equal to visible light is used as the filter, the imaging device 600 that detects ultraviolet light can be achieved. Alternatively, when a scintillator that turns a radiant ray into ultraviolet light or visible light is used as the filter, the imaging device 600 can be used as a radiation detector that detects an X-ray or a γ-ray.

When a neutral density (ND) filter (dimming filter) is used as the filter, a phenomenon of output saturation, which is caused when an excessive amount of light enters a photoelectric conversion element (light-receiving element), can be prevented. With a combination of ND filters with different dimming capabilities, the dynamic range of the imaging device can be increased.

Figure 60A:
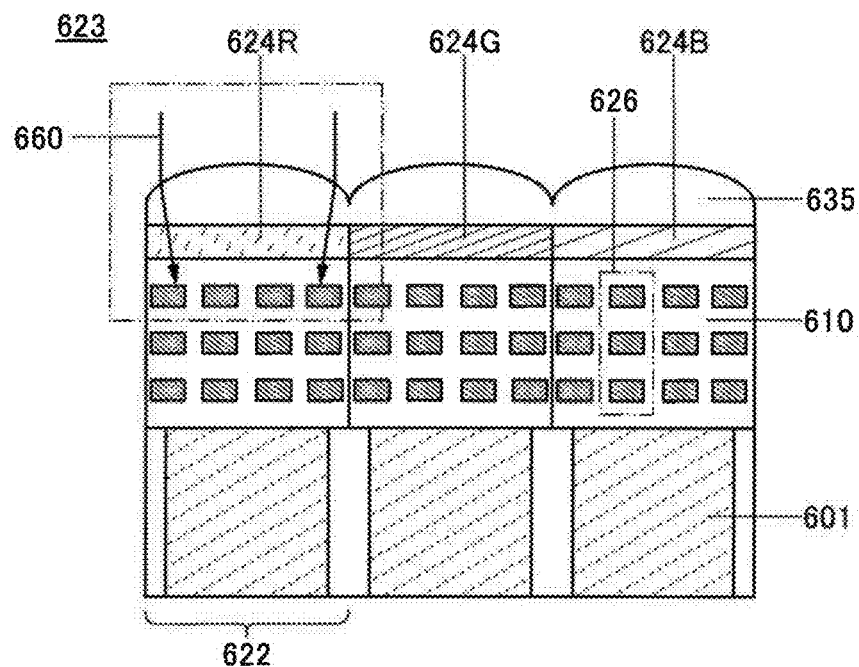
FIGS. 60A and 60B illustrate pixel configuration examples.

Besides the above-described filter, the pixel 622 may be provided with a lens. An arrangement example of the pixel 622, the filter 624, and a lens 635 is described with reference to cross-sectional views in FIGS. 60A and 60B. With the lens 635, incident light can be efficiently received by a photoelectric conversion element. Specifically, as illustrated in FIG. 60A, light 660 enters the photoelectric conversion element 601 through the lens 635, the filter 624 (a filter 624R, a filter 624G, or a filter 624B), a pixel driver circuit 610, and the like formed in the pixel 622.

Figure 60B:
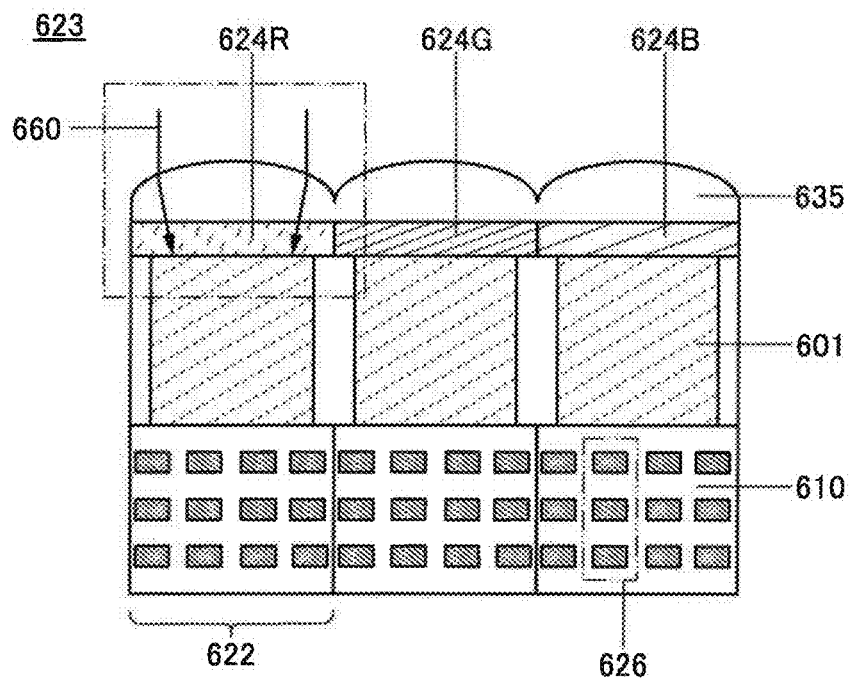

However, as illustrated in a region surrounded by the two-dot chain line, part of light 660 indicated by the arrows may be blocked by part of a wiring group 626, such as a transistor and/or a capacitor. Thus, a structure in which the lens 635 and the filter 624 are provided on the photoelectric conversion element 601 side, as illustrated in FIG. 60B, may be employed such that the incident light is efficiently received by the photoelectric conversion element 601. When the light 660 is incident on the photoelectric conversion element 601 side, the imaging device 600 with high light sensitivity can be provided.

Figure 61A:
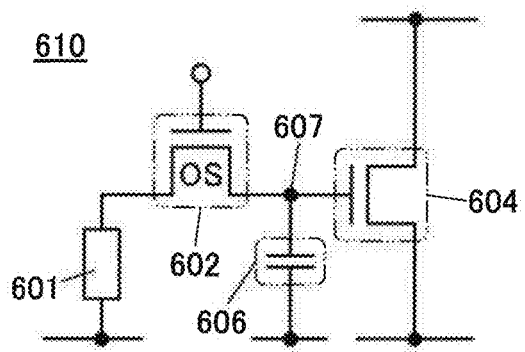
FIGS. 61A to 61C are each a circuit diagram illustrating an example of an imaging device.
Figure 61B:
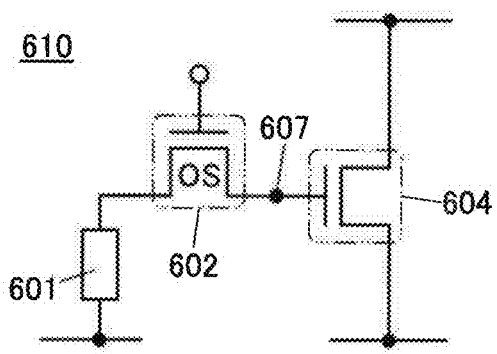
Figure 61C:
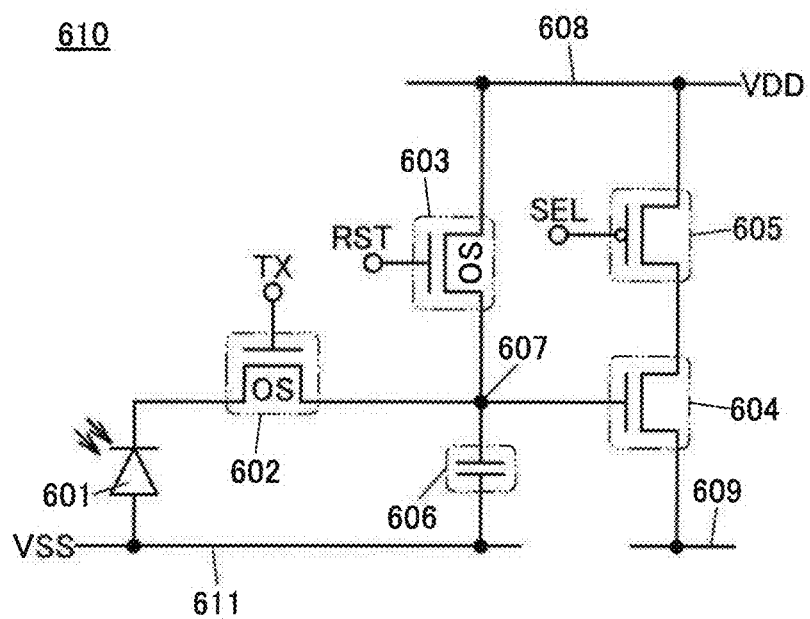

FIGS. 61A to 61C illustrate examples of the pixel driver circuit 610 that can be used for the pixel portion 621. The pixel driver circuit 610 illustrated in FIG. 61A includes a transistor 602, a transistor 604, and a capacitor 606 and is connected to a photoelectric conversion element 601. One of a source and a drain of the transistor 602 is electrically connected to the photoelectric conversion element 601, and the other of the source and the drain of the transistor 602 is electrically connected to a gate of the transistor 604 through a node 607 (a charge accumulation portion).

An OS transistor is preferably used as the transistor 602. Since the off-state current of the OS transistor is extremely low, the capacitor 606 can be small. Alternatively, the capacitor 606 can be omitted as illustrated in FIG. 61B. Furthermore, when the transistor 602 is an OS transistor, the potential of the node 607 is less likely to be changed. Thus, an imaging device that is less likely to be affected by noise can be provided. Note that the transistor 604 may be an OS transistor.

A diode element formed using a silicon substrate with a PN junction or a PIN junction can be used as the photoelectric conversion element 601. Alternatively, a PIN diode element formed using an amorphous silicon film, a microcrystalline silicon film, or the like may be used. Alternatively, a diode-connected transistor may be used. Further alternatively, a variable resistor or the like utilizing a photoelectric effect may be formed using silicon, germanium, selenium, or the like.

The photoelectric conversion element may be formed using a material capable of generating electric charge by absorbing radiation. Examples of the material capable of generating electric charge by absorbing radiation include lead iodide, mercury iodide, gallium arsenide, CdTe, and CdZn.

The pixel driver circuit 610 illustrated in FIG. 61C includes the transistor 602, the transistor 603, the transistor 604, the transistor 605, and the capacitor 606 and is connected to the photoelectric conversion element 601. In the pixel driver circuit 610 illustrated in FIG. 61C, a photodiode is used as the photoelectric conversion element 601. One of the source and the drain of the transistor 602 is electrically connected to a cathode of the photoelectric conversion element 601. The other of the source and the drain of the transistor 602 is electrically connected to the node 607. An anode of the photoelectric conversion element 601 is electrically connected to a wiring 611. One of a source and a drain of the transistor 603 is electrically connected to the node 607. The other of the source and the drain of the transistor 603 is electrically connected to a wiring 608. The gate of the transistor 604 is electrically connected to the node 607. One of a source and a drain of the transistor 604 is electrically connected to a wiring 609. The other of the source and the drain of the transistor 604 is electrically connected to one of a source and a drain of the transistor 605. The other of the source and the drain of the transistor 605 is electrically connected to the wiring 608. One electrode of the capacitor 606 is electrically connected to the node 607. The other electrode of the capacitor 606 is electrically connected to the wiring 611.

The transistor 602 can function as a transfer transistor. A gate of the transistor 602 is supplied with a transfer signal TX. The transistor 603 can function as a reset transistor. A gate of the transistor 603 is supplied with a reset signal RST. The transistor 604 can function as an amplifier transistor. The transistor 605 can function as a selection transistor. A gate of the transistor 605 is supplied with a selection signal SEL. Moreover, VDD is supplied to the wiring 608 and VSS is supplied to the wiring 611.

Next, operations of the pixel driver circuit 610 illustrated in FIG. 61C are described. First, the transistor 603 is turned on so that VDD is supplied to the node 607 (reset operation). Then, the transistor 603 is turned off so that VDD is retained at the node 607. Next, the transistor 602 is turned on so that the potential of the node 607 is changed in accordance with the amount of light received by the photoelectric conversion element 601 (accumulation operation). After that, the transistor 602 is turned off so that the potential of the node 607 is retained. Next, the transistor 605 is turned on so that a potential corresponding to the potential of the node 607 is output to the wiring 609 (selection operation). Measuring the potential of the wiring 609 can determine the amount of light received by the photoelectric conversion element 601.

An OS transistor is preferably used as each of the transistors 602 and 603. Since the off-state current of the OS transistor is extremely low as described above, the capacitor 606 can be small or omitted. Furthermore, when the transistors 602 and 603 are OS transistors, the potential of the node 607 is less likely to be changed. Thus, an imaging device that is less likely to be affected by noise can be provided.

A high-resolution imaging device can be obtained when the pixels 622 including any of the pixel driver circuits 610 illustrated in FIGS. 61A to 61C are arranged in a matrix.

For example, using the pixel driver circuits 610 arranged in a 1920×1080 matrix, an imaging device that can take an image with "full high definition" (also referred to as "2K resolution", "2K1K", "2K", and the like) can be obtained. Using the pixel driver circuits 610 arranged in a 4096×2160 matrix, an imaging device that can take an image with "ultra high definition" (also referred to as "4K resolution", "4K2K", "4K", and the like) can be obtained. Using the pixel driver circuits 610 arranged in a 8192×4320 matrix, an imaging device that can take an image with "super high definition" (also referred to as "8K resolution", "8K4K", "8K", and the like) can be obtained. Using a larger number of pixel driver circuits 610, an imaging device that can take an image with 16K or 32K resolution can be obtained.

Figure 62:
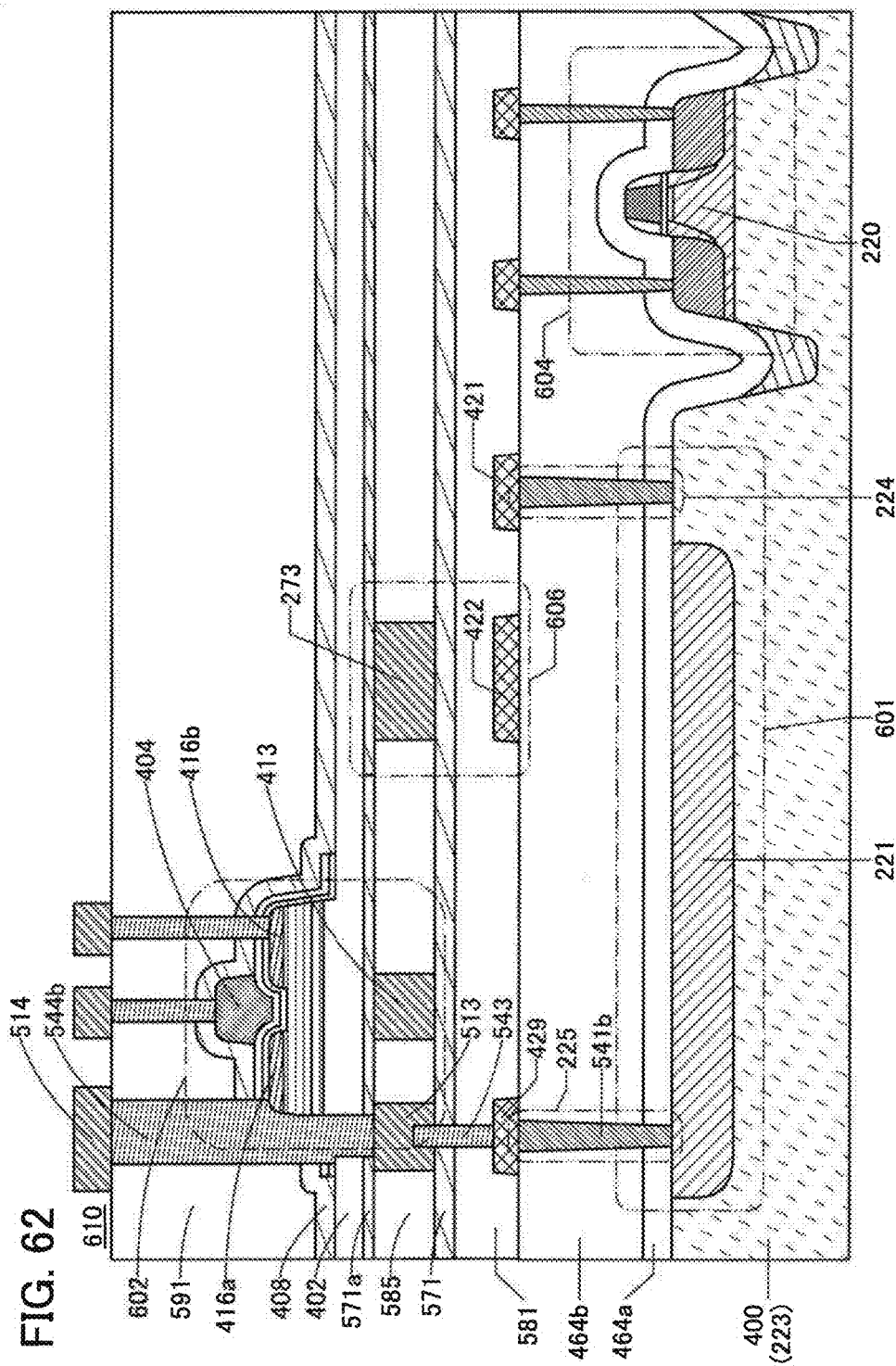
FIG. 62 is a cross-sectional view illustrating a structure example of an imaging device.

FIG. 62 illustrates a structure example of the pixel 622 including any of the above-described transistors. FIG. 62 is a cross-sectional view of part of the pixel 622.

In the pixel 622 illustrated in FIG. 62, an n-type semiconductor is used for the substrate 400. A p-type semiconductor 221 of the photoelectric conversion element 601 is provided in the substrate 400. Part of the substrate 400 functions as an n-type semiconductor 223 of the photoelectric conversion element 601.

The transistor 604 is provided on the substrate 400. The transistor 604 can function as an n-channel transistor. A well 220 of a p-type semiconductor is provided in part of the substrate 400. The well 220 can be provided by a method similar to that for forming the p-type semiconductor 221. The well 220 and the p-type semiconductor 221 can be formed at the same time. Note that the transistor 491 described above can be used as the transistor 604, for example.

The insulator 464a and the insulator 464b are formed over the photoelectric conversion element 601 and the transistor 604. In a region of the insulator 464a and the insulator 464b that overlaps with the substrate 400 (the n-type semiconductor 223), an opening 224 is formed, and in a region of the insulator 464a and the insulator 464b that overlaps with the p-type semiconductor 221, an opening 225 is formed. Plugs 541b are formed in the opening 224 and the opening 225. The plugs 541b can be provided in a manner similar to that of the above-described plug 541. The number of openings (224 and 225) to be formed or their arrangement are not particularly limited. Thus, an imaging device with high layout flexibility can be provided.

A conductor 421, a conductor 422, and a conductor 429 are formed over the insulator 464b. The conductor 421 is electrically connected to the n-type semiconductor 223 (the substrate 400) via the plug 541b provided in the opening 224. The conductor 429 is electrically connected to the p-type semiconductor 221 via the plug 541b provided in the opening 225. The conductor 422 can function as one electrode of the capacitor 606.

The insulator 581 is formed so as to cover the conductor 421, the conductor 429, and the conductor 422. The conductor 421, the conductor 429, and the conductor 422 can be formed using a material and a method that are used for forming the above-described conductor 511 and the like.

The insulator 571 is formed over the insulator 581, and the conductor 513, the conductor 413, and an electrode 273 are formed over the insulator 571. The conductor 513 is electrically connected to the conductor 429 through the plug 543. The conductor 413 can function as a back gate of the transistor 602. The electrode 273 can function as the other electrode of the capacitor 606. As the transistor 602, the transistor 490 described above can be used, for example.

The conductor 416a included in the transistor 602 is electrically connected to the conductor 513 through the plug 544. For the plug 544b shown in FIG. 62, the plug 544b in FIG. 35 can be referred to.

<Modification Example 1>

Figure 63:
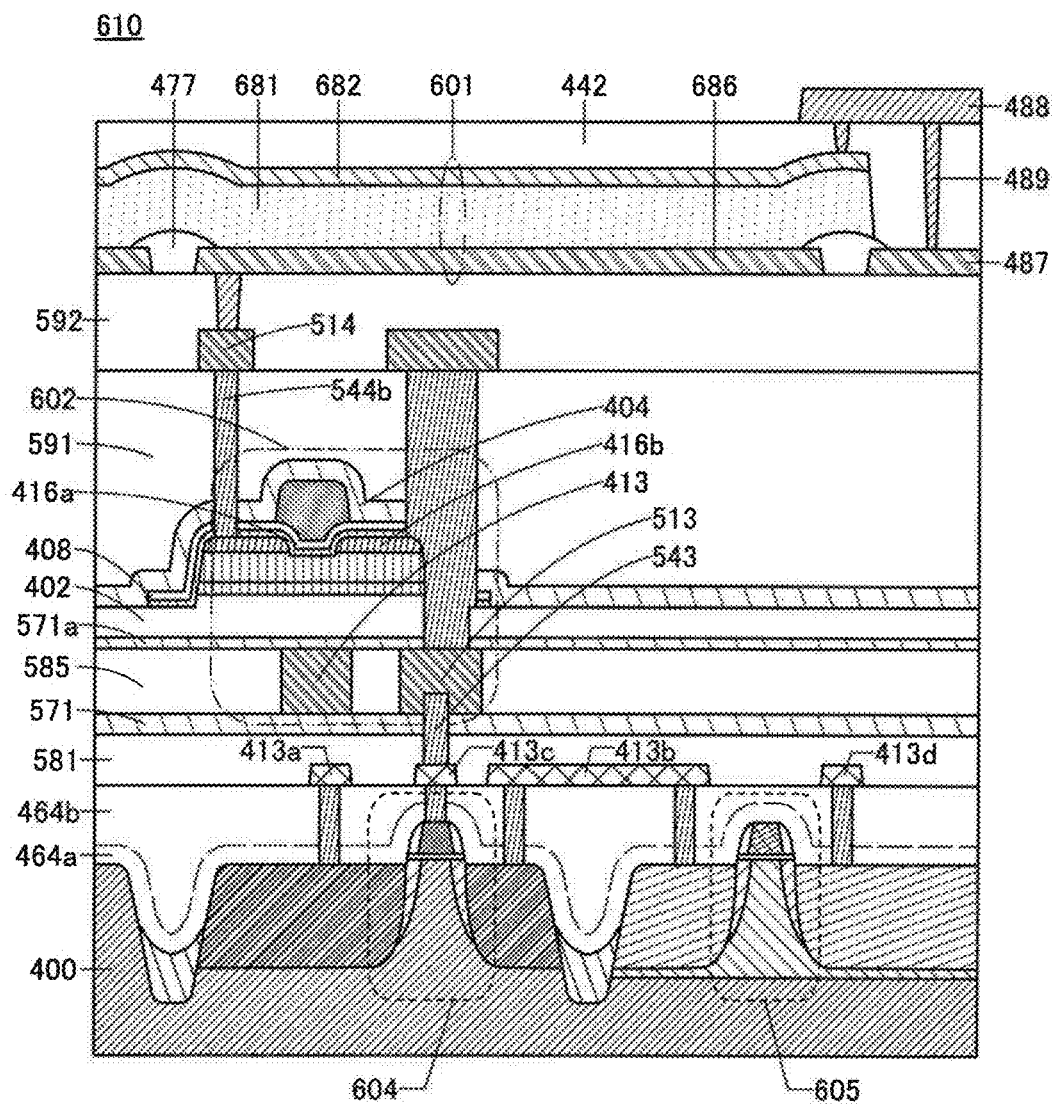
FIG. 63 is a cross-sectional view illustrating a structure example of an imaging device.

FIG. 63 illustrates a structure example of the pixel 622 that is different from that in FIG. 62. FIG. 63 is a cross-sectional view illustrating part of the pixel 622.

In the pixel 622 illustrated in FIG. 63, the transistors 604 and 605 are provided on the substrate 400. The transistor 604 can function as an n-channel transistor. The transistor 605 can function as a p-channel transistor. Note that the transistor 491 described above can be used as the transistor 604, for example. The transistor 494 described above can be used as the transistor 605, for example.

The conductor 413a, the conductor 413b, a conductor 413c, and a conductor 413d are formed over the insulator 464b. The conductor 413a is electrically connected to one of the source and the drain of the transistor 604, and the conductor 413b is electrically connected to the other of the source and the drain of the transistor 604. The conductor 413c is electrically connected to the gate of the transistor 604. The conductor 413b is electrically connected to one of the source and the drain of the transistor 605, and the conductor 413d is electrically connected to the other of the source and the drain of the transistor 605.

The insulator 581 is formed over the insulator 464b. The insulator 571 is formed over the insulator 581. The insulator 585, the conductor 413, and the conductor 513 are formed over the insulator 571. The conductor 513 is connected to the conductor 413c through the plug 543. The plug 543 has a portion projecting above the insulator 571.

The insulator 571a is formed over the conductor 513, the conductor 413, and the insulator 585. The transistor 602 is formed over the insulator 571a. The insulator 408 is formed over the transistor 602, and the insulator 591 is formed over the insulator 408. The conductor 514 and the insulator 592 are formed over the insulator 591.

In the pixel 622 illustrated in FIG. 63, the photoelectric conversion element 601 is provided over the insulator 592. An insulator 442 is provided over the photoelectric conversion element 601, and a conductor 488 is provided over the insulator 442. The insulator 442 can be formed using a material and a method that are similar to those of the insulator 591.

The photoelectric conversion element 601 illustrated in FIG. 63 includes a photoelectric conversion layer 681 between a conductor 686 formed with a metal material or the like and a light-transmitting conductive layer 682. FIG. 63 illustrates the photoelectric conversion element 601 including a selenium-based material for the photoelectric conversion layer 681. The photoelectric conversion element 601 including a selenium-based material has high external quantum efficiency with respect to visible light. The use of the photoelectric conversion element can achieve a highly sensitive sensor in which the amplification of electrons with respect to the amount of incident light is large owing to an avalanche phenomenon. Furthermore, the selenium-based material has a high light-absorption coefficient, which leads to an advantage that the photoelectric conversion layer 681 can be formed thin.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity and light-absorption coefficient than amorphous selenium.

Although the photoelectric conversion layer 681 is illustrated as a single layer, gallium oxide, cerium oxide, or the like as a hole blocking layer may be provided on the light reception side of the selenium-based material, and nickel oxide, antimony sulfide, or the like as an electron blocking layer may be provided on the conductor 686 side.

Furthermore, the photoelectric conversion layer 681 may be a layer including a compound of copper, indium, and selenium (CIS). Alternatively, a layer including a compound of copper, indium, gallium, and selenium (CIGS) may be used. With CIS or CIGS, a photoelectric conversion element that can utilize an avalanche phenomenon as in the case of using a single layer of selenium can be formed.

Furthermore, CIS and CIGS are p-type semiconductors, and an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to cause the avalanche phenomenon. Since the OS transistor has higher drain withstand voltage than a Si transistor, the application of a relatively high voltage to the photoelectric conversion element is easy. Thus, by combination of the OS transistor having high drain withstand voltage and a photoelectric conversion element including the selenium-based material in the photoelectric conversion layer, a highly sensitive and highly reliable imaging device can be obtained.

For the light-transmitting conductive layer 682, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; or the like. The light-transmitting conductive layer 682 is not limited to a single layer, and may be a stacked layer of different films. Although the light-transmitting conductive layer 682 and a wiring 487 are electrically connected to each other through the conductor 488 and a plug 489 in the structure illustrated in FIG. 63, the light-transmitting conductive layer 682 and the wiring 487 may be in direct contact with each other.

The conductor 686, the wiring 487, and the like may each have a structure in which a plurality of conductive layers are stacked. For example, the conductor 686 can be formed of two layers, and the wiring 487 can be formed of two layers. For example, lower layers of the conductors 686 and 487 may be made of a low-resistance metal or the like, and upper layers of the conductors 686 and 487 may be made of a metal or the like that exhibits an excellent contact property with the photoelectric conversion layer 681. Such a structure improves the electrical properties of the photoelectric conversion element. Furthermore, even when the lower layer of the conductor 487a contains a metal that causes electrolytic corrosion, which occurs when some kinds of metal are in contact with the light-transmitting conductive layer 682, electrolytic corrosion can be prevented because the conductor 487b is placed between the conductor 487a and the light-transmitting conductive layer 682.

The upper layers in the conductors 686 and 487 can be formed using, for example, molybdenum, tungsten, or the like. The lower layers in the conductors 686 and 487 can be formed using, for example, aluminum, titanium, or a stack of titanium, aluminum, and titanium that are layered in that order.

The insulator 442 may be a multilayer. Note that a partition wall 477 can be formed using an inorganic insulator, an insulating organic resin, or the like. The partition wall 477 may be colored black or the like in order to shield the transistors and the like from light and/or to determine the area of a light-receiving portion in each pixel.

Alternatively, a PIN diode element or the like formed using an amorphous silicon film, a microcrystalline silicon film, or the like may be used as the photoelectric conversion element 601. In the photodiode, an n-type semiconductor layer, an i-type semiconductor layer, and a p-type semiconductor layer are stacked in that order. The i-type semiconductor layer is preferably formed using amorphous silicon. The p-type semiconductor layer and the n-type semiconductor layer can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

Note that a PN or PIN diode element is preferably provided such that the p-type semiconductor layer serves as a light-receiving surface, in which case the output current of the photoelectric conversion element 601 can be increased.

The photoelectric conversion element 601 formed using the selenium-based material, amorphous silicon, or the like can be formed through general semiconductor manufacturing processes such as a deposition process, a lithography process, and an etching process.

At least part of this embodiment can be implemented in combination with any of the embodiments described in this specification as appropriate.

(Supplementary Notes on the Description in this Specification and the Like)

The following are notes on the description of the above embodiments and structures in the embodiments.

<Notes on One Embodiment of the Present Invention Described in Embodiments>

One embodiment of the present invention can be constituted by appropriately combining the structure described in an embodiment with any of the structures described the other embodiments. In addition, in the case where a plurality of structure examples are described in one embodiment, some of the structure examples can be combined as appropriate.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

In each Embodiment, one embodiment of the present invention has been described; however, one embodiment of the present invention is not limited to the described embodiments. The example where OS transistors are used as transistors having low off-state current is described in Embodiment 1 as one embodiment of the present invention; however, one embodiment of the present invention is not limited to using OS transistors as long as transistors having low off-state current are used. Therefore, depending on conditions, a structure without OS transistors may be one embodiment of the present invention.

<Notes on the Description for Drawings>

In this specification and the like, terms for explaining arrangement, such as "over" and "under", are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "below" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, the segmentation of blocks in the block diagram is not limited by the components described in the specification, and can be differently determined as appropriate depending on situations.

In drawings, the size, the layer thickness, or the region is determined arbitrarily for description convenience. Therefore, the size, the layer thickness, or the region is not limited to the illustrated scale. Note that the drawings are schematically shown for clarity, and embodiments of the present invention are not limited to shapes or values shown in the drawings. For example, the following can be included: variation in signal, voltage, or current due to noise or difference in timing.

In drawings such as plan views (also referred to as layout views) and perspective views, some of components might not be illustrated for clarity of the drawings.

<Notes on Expressions that can be Rephrased>

In this specification or the like, in description of connections of a transistor, description of "one of a source and a drain" (or a first electrode or a first terminal), and "the other of the source and the drain" (or a second electrode or a second terminal) are used. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of the component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground voltage, for example, "voltage" can be replaced with "potential." The ground voltage does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive film" can be changed into the term "conductive layer" in some cases. Also, the term "insulating film" can be changed into the term "insulating layer" in some cases.

<Notes on Definitions of Terms>

The following are definitions of the terms that are not mentioned in the above embodiments.

<<Switch>>

In this specification and the like, a switch is conducting (on state) or not conducting (off state) to determine whether current flows therethrough or not. Alternatively, a switch has a function of selecting and changing a current path.

Examples of a switch are an electrical switch, a mechanical switch, and the like. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source and a drain of the transistor are electrically short-circuited. Furthermore, an "off state" of the transistor refers to a state in which the source and the drain of the transistor are electrically disconnected. In the case where a transistor operates just as a switch, the polarity (conductivity type) of the transistor is not particularly limited to a certain type.

An example of a mechanical switch is a switch formed using a micro electro mechanical systems (MEMS) technology, such as a digital micromirror device (DMD). Such a switch includes an electrode which can be moved mechanically, and operates by controlling conduction and non-conduction in accordance with movement of the electrode.

<<Channel Length>>

In this specification and the like, the channel length refers to, for example, a distance between a source and a drain in a region where a semiconductor (or a portion where a current flows in a semiconductor when a transistor is on) and a gate overlap with each other or a region where a channel is formed in a plan view of the transistor.

In one transistor, channel lengths in all regions are not necessarily the same. In other words, the channel length of one transistor is not fixed to one value in some cases. Therefore, in this specification, the channel length is any one of values, the maximum value, the minimum value, or the average value in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a plan view of the transistor.

In one transistor, channel widths in all regions are not necessarily the same. In other words, the channel width of one transistor is not fixed to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width or an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

<<Connection>>

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y, can be expressed by using any of the following expressions.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive layer, and a layer).

EXAMPLE 1

In this example, the results of evaluating the hydrogen permeability of conductive films by TDS are described.

Samples were each formed as follows. Silicon oxide was formed to a thickness of 100 nm on a silicon substrate by a thermal oxidation method, and then, a silicon nitride oxide film was formed to a thickness of 280 nm with a PECVD apparatus. The silicon nitride oxide film was formed under the following conditions: the pressure was controlled to 160 Pa in an atmosphere including a silane gas at 40 sccm, an ammonia gas at 300 sccm, a dinitrogen monoxide gas at 30 sccm, and a nitrogen gas at 900 sccm; the substrate temperature was 325° C.; the power output was 250 W (frequency of 27.12 MHz); and the distance between an electrode and the substrate was 20 mm. A large amount of hydrogen is included in the silicon nitride oxide film, and the silicon nitride oxide film functions as a film that releases hydrogen.

Then, as a barrier film, a tantalum nitride film or a titanium nitride film was formed over the silicon nitride oxide film with a sputtering apparatus.

The tantalum nitride film was formed under the following conditions: the pressure was controlled to 0.6 Pa in an atmosphere including an argon gas at 50 sccm and a nitrogen gas at 10 sccm; the substrate temperature was room temperature (approximately 25° C.); the power output was 1 kW (DC power source); and the distance between a target and the substrate was 60 mm. The tantalum nitride film had a thickness of 10 nm, 20 nm, or 30 nm. For comparison, a sample without the tantalum nitride film was also prepared.

The titanium nitride film was formed under the following conditions: the pressure was controlled to 0.2 Pa in an atmosphere including a nitrogen gas at 50 sccm; the substrate temperature was room temperature; the power output was 12 kW (DC power source); and the distance between a target and the substrate was 400 mm. The titanium nitride film had a thickness of 10 nm.

Figure 64A:
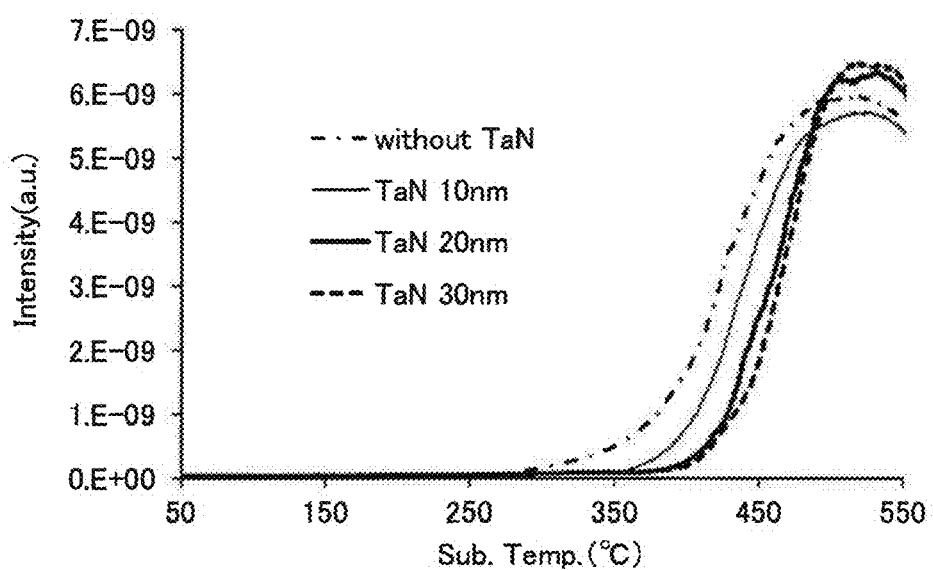
FIGS. 64A and 64B show TDS analysis results.
Figure 64B:
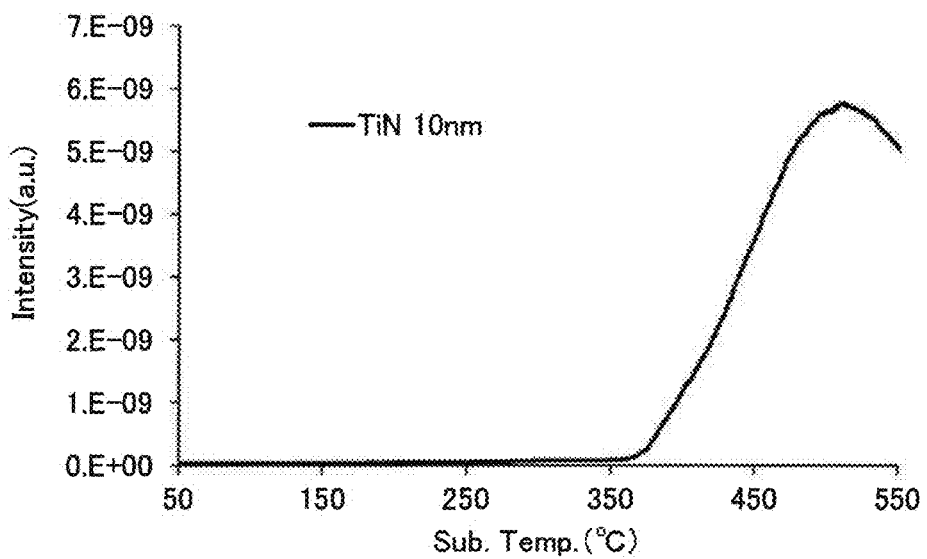

The samples formed in the above manner were subjected to TDS and the results are shown in FIGS. 64A and 64B. In the TDS results shown in FIGS. 64A and 64B, the results of a mass-to-charge ratio m/z of 2 (e.g., $H_2$) are shown. FIG. 64A shows the analysis results of the samples each including the tantalum nitride film formed as a barrier film and the sample without the barrier film. FIG. 64B shows the analysis results of the sample including the titanium nitride film.

As shown in FIGS. 64A and 64B, in the case of using the sample including the tantalum nitride film and the sample including the titanium nitride film, the release of a gas of m/z=2 starts at a higher temperature than the case of the sample without a barrier film over the silicon nitride oxide film. In addition, as the thickness of the tantalum nitride film increases, the release of the gas of m/z=2 starts at a higher temperature. These results show that the tantalum nitride film and the titanium nitride film each have low hydrogen permeability, i.e., a blocking property against hydrogen. Furthermore, in the case where the thickness of the tantalum nitride film was 20 nm or more, the amount of released hydrogen can be kept small even at a temperature of approximately 400° C.

EXAMPLE 2

In this example, the results of evaluating the blocking properties of conductive films against copper by secondary ion mass spectrometry (SIMS) are described. Here, the SIMS was performed from the substrate side.

Samples were each formed as follows. Silicon oxide was formed to a thickness of 400 nm on a silicon substrate by a thermal oxidation method, and then, a titanium nitride film was formed to a thickness of 200 nm with a sputtering apparatus. Then, a barrier film was formed with a sputtering apparatus. Then, a copper film was formed to a thickness of 200 nm with a sputtering apparatus. After a tantalum nitride film was formed to a thickness of 50 nm with a sputtering apparatus, a silicon nitride film was formed to a thickness of 100 nm. After that, heat treatment was performed at 500° C. in a nitrogen atmosphere for 1 hour. Four conditions, conditions 1 to 4, were used as the formation conditions of the barrier film.

As the condition 1, a 40-nm-thick tantalum film was formed. As the condition 2, a 40-nm-thick tantalum nitride film was formed. As the condition 3, a 20-nm-thick tantalum nitride film was formed after a 20-nm-thick tantalum film was formed. As the condition 4, a 20-nm-thick tantalum film was formed after a 20-nm-thick tantalum nitride film was formed. The formation conditions of the tantalum film were as follows: a sputtering method was used; the pressure was controlled to 1.4 Pa in an atmosphere including an argon gas at 100 sccm; the substrate temperature was room temperature (approximately 25° C.); the power output was 2 kW (DC power source); and the distance between a target and the substrate was 60 mm. The formation conditions of the tantalum nitride film were as follows: a sputtering method was used; the pressure was controlled to 0.6 Pa in an atmosphere including an argon gas at 50 sccm and a nitrogen gas at 10 sccm; the substrate temperature was room temperature; the power output was 1 kW (DC power source); and the distance between a target and the substrate was 60 mm.

Figure 65:
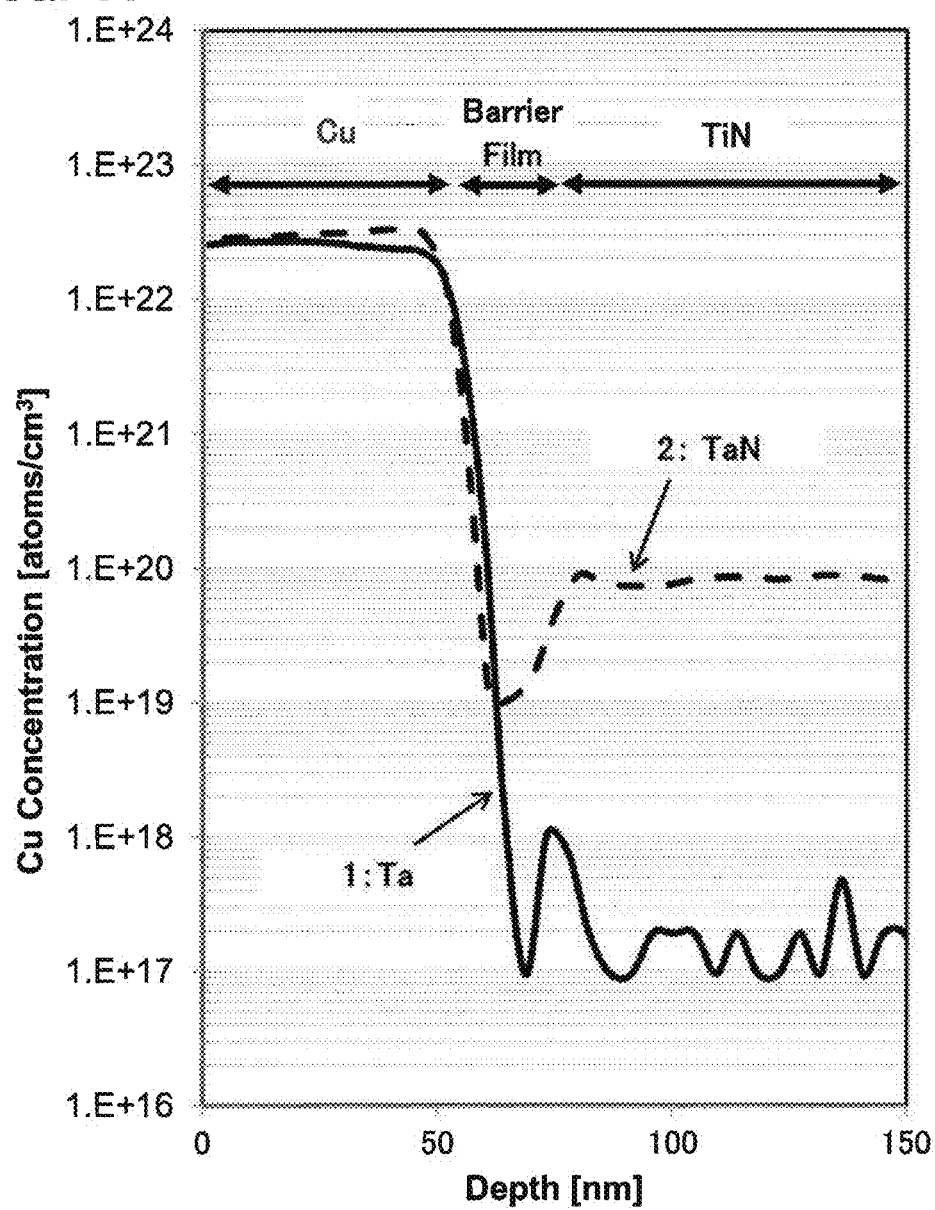
FIG. 65 shows SIMS analysis results.
Figure 66:
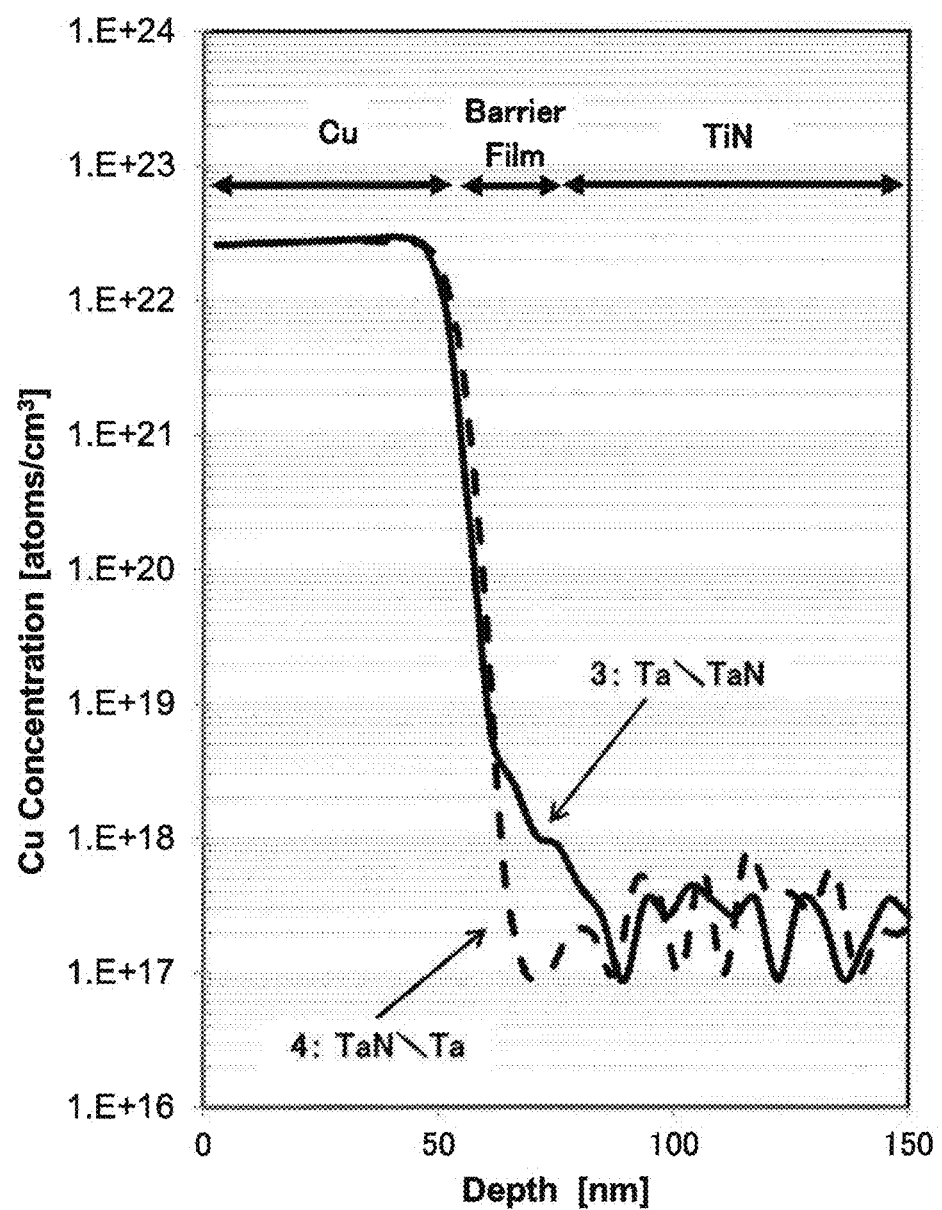
FIG. 66 shows SIMS analysis results.

The samples formed in the above manner were subjected to SIMS and the results are shown in FIG. 65 and FIG. 66. Note that the concentration of copper in the titanium nitride film is shown in FIG. 65 and FIG. 66.

As shown in FIG. 65 and FIG. 66, in the sample including the titanium nitride film as the barrier film (the condition 2), the concentration of copper in the titanium nitride film was approximately $8\times10^{19}$ atoms/cm$^3$. In the sample including the tantalum film as the barrier film (the condition 1), the concentration of copper in the titanium nitride film was approximately $2\times10^{17}$ atoms/cm$^3$. Also in the samples each including a stack of the tantalum film and the tantalum nitride film as the barrier film (the conditions 3 and 4), the concentration of copper in the titanium nitride film was kept low. The above results show that the tantalum film had a high blocking property against copper.

EXAMPLE 3

In this example, design examples of a CPU including the memory device of one embodiment of the present invention are described.

Figure 67A:
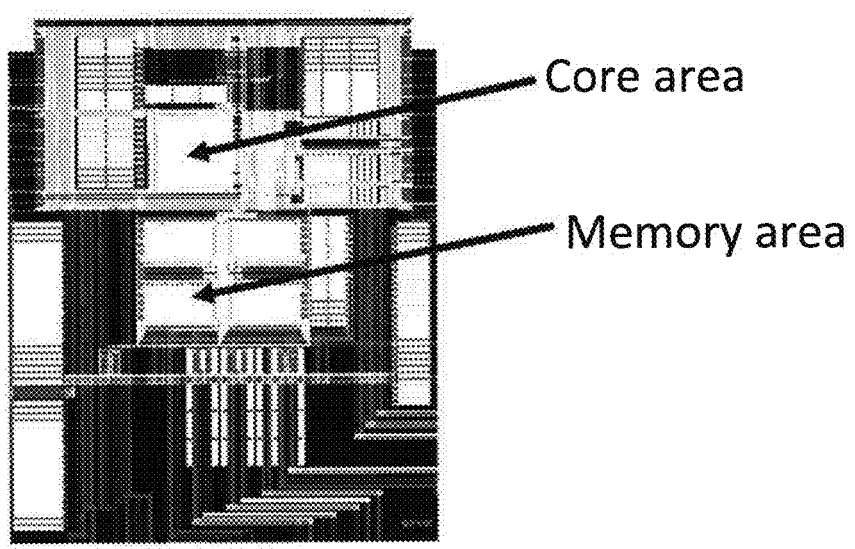
FIGS. 67A and 67B each show an example of a layout of a CPU.
Figure 67B:
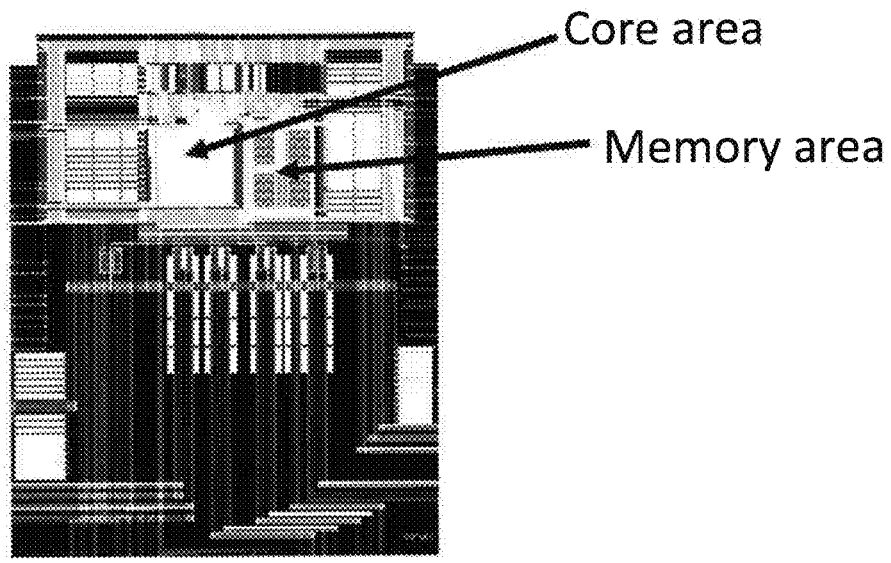

FIGS. 67A and 67B show layouts of CPUs. The CPUs shown in FIGS. 67A and 67B each include a CPU core area and a memory area including an embedded memory device. In each of FIGS. 67A and 67B, the area of the CPU core area was 467 μm×444 μm, and the area of the memory area was 900 μm×636 μm. FIG. 67A shows an example of using the circuit shown in FIG. 27C as the memory area. FIG. 67B shows an example of using the circuit shown in FIG. 27B as the memory area.

The specifications of the CPU shown in FIGS. 67A and 67B are described below.

The chip measures 2.99 mm×2.45 mm. Two voltages, 3.3 V and 1.2 V, were supplied as the supply voltages. An input portion of a gate voltage to the transistor 490 was supplied with a voltage of 3.3 V, and other peripheral circuits including a logic circuit and the like were supplied with a voltage of 1.2 V.

The clock frequency was 50 MHz. The minimum gate size was 65 nm. In the core area, the power consumption in a standby period was estimated to be 16.78 μW at 27° C. and 123.13 μW at 85° C., and the power consumption per frequency in an operating period was estimated to be 22.07 μW/MHz at 27° C.

The CPU includes, as a memory device for data retention, a memory device in which a transistor including an oxide semiconductor and a capacitor are connected to a flip-flop, in addition to the memory device shown in FIG. 27C or FIG. 27B. In the structure where the transistor including an oxide semiconductor and the capacitor are connected to the flip-flop, data is retained even when the power is off. The time elapsing before data is retained to the flip-flop is estimated to be 20 ns in 50 MHz operation, and the time for restoring data retained in the flip-flop is estimated to be 40 ns in 50 MHz operation. The flip-flop can retain data for longer than 1 hour at 85° C.

Figure 68A:
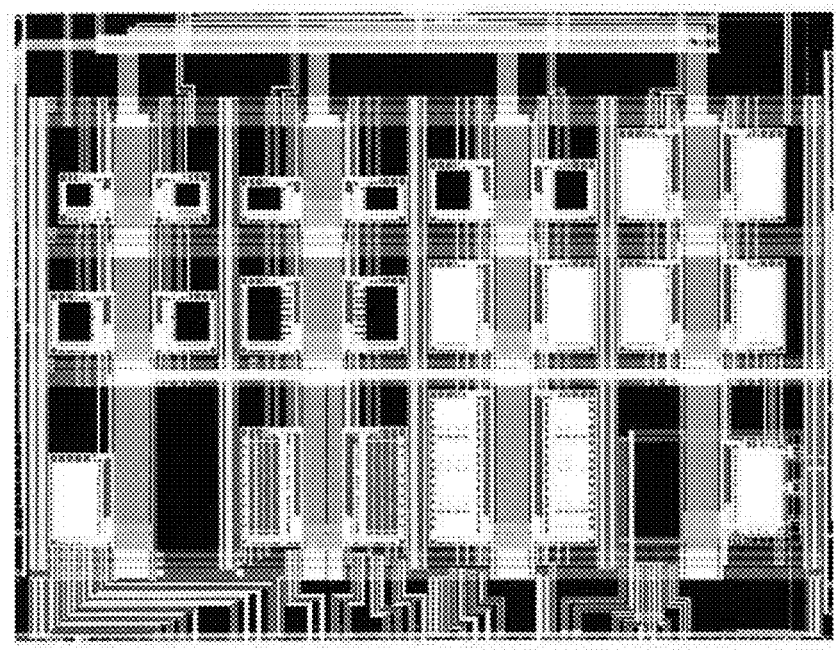
FIGS. 68A and 68B each show an example of a layout of a memory device.

FIG. 68A shows an example of a layout of a memory device that can be used in the memory area shown in FIG. 67A. The capacity was 2 kbyte. The memory device had 16 blocks. The blocks each included 8 word lines and 256 folded digit lines. The maximum frequency was 100 MHz, the power consumption in a standby period was 0.539 μW, the write power was estimated to be 0.646 mW (0.40 pJ/bit) in 50 MHz operation, and the read power was estimated to be 0.521 mW (0.33 pJ/bit) in 50 MHz operation. The data retention time is longer than 1 hour at 85° C. The area of one bit was 2.9 µm² (5.01 µm×0.58 µm). The chip area was 0.083 mm² (0.375 mm×0.22 mm). Here, an effective area corresponds to a memory cell array area in the whole chip.

Figure 68B:
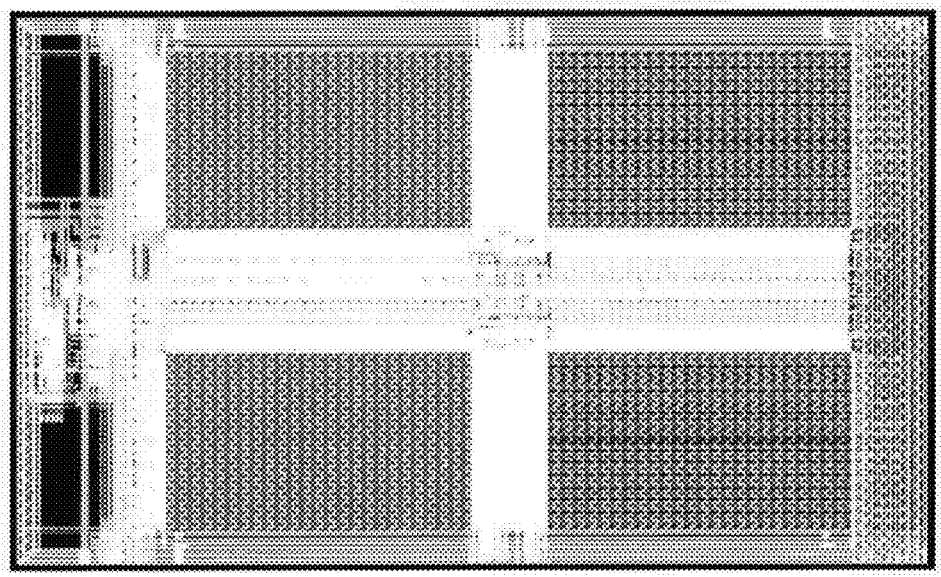

FIG. 68B shows an example of a layout of a memory device that can be used in the memory area shown in FIG. 67B. The memory capacity was 8 kbyte. The memory device had four blocks. The blocks each included 1-bit memory cells arranged in 128 rows and 128 columns. The maximum frequency was 67 MHz, the power consumption in a standby period was 1.1 µW, the write power was estimated to be 2.0 mW (41 pJ) in 50 MHz operation, and the read power was estimated to be 1.7 mW (34 pJ) in 50 MHz operation. The data retention time is longer than 1 hour at 85° C. The area of one bit was 1.12 µm² (1.4 µm×0.8 µm). The chip area was 0.184 mm² (0.549 mm×0.336 mm).

EXAMPLE 4

In this example, a design example of an imaging device using one embodiment of the present invention is described.

Figure 69:
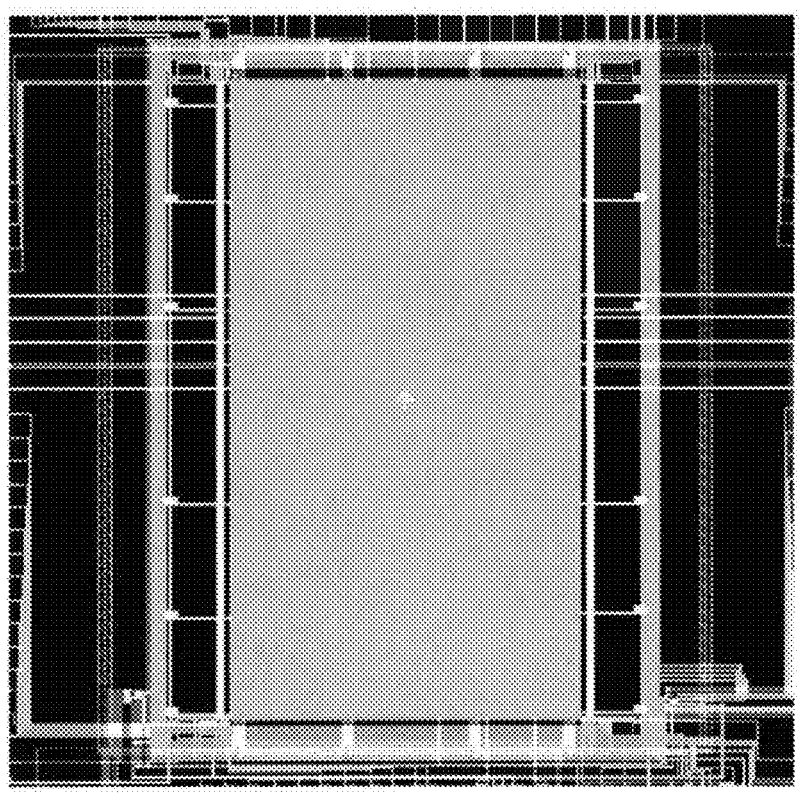
FIG. 69 shows an example of a layout of an imaging device.

FIG. 69 shows an example of a layout of the imaging device. In the imaging device shown in FIG. 69, an OS transistor is used in a pixel portion. For an example of the imaging device including an OS transistor, Embodiment 8 can be referred to, for example.

The specifications of the imaging device shown in FIG. 69 are as follows. The area of a pixel region was 5.2 mm long and 2.8 mm wide. The number of pixels was 1920×1080. One pixel was 2.7 µm long and 2.6 µm wide. A photodiode was used as a photoelectric conversion element, and four OS transistors were used in the pixel portion. A row driver was included as the peripheral circuit. A read circuit included a 12-bit single-slope counter type analog-to-digital converter circuit and a 12-bit correlated double sampling (CDS) circuit.

This application is based on Japanese Patent Application serial no. 2015-055720 filed with Japan Patent Office on Mar. 19, 2015 and Japanese Patent Application serial no. 2015-083272 filed with Japan Patent Office on Apr. 15, 2015, the entire contents of which are hereby incorporated by reference.

What is claimed is:
1. A semiconductor device comprising:
a first transistor including silicon;
a first insulator over the first transistor, the first insulator including silicon;
a second insulator over the first insulator, the second insulator including aluminum oxide;
a plug embedded in the first insulator and the second insulator;
a wiring over the plug; and
a second transistor including an oxide semiconductor over the wiring,
wherein the first transistor and the second transistor are electrically connected to each other through the wiring and the plug, and
wherein the wiring includes at least one of a tantalum nitride layer, a tantalum layer, and a titanium nitride layer.

2. The semiconductor device according to claim 1,
wherein the wiring has a structure in which the tantalum nitride layer and the tantalum layer are stacked or the titanium nitride layer and the tantalum layer are stacked.
3. The semiconductor device according to claim 1,
wherein the plug has a structure in which a second tantalum nitride layer and a second tantalum layer are stacked or a second titanium nitride layer and a third tantalum layer are stacked.
4. The semiconductor device according to claim 1,
wherein the first insulator includes at least one of silicon oxide, silicon oxynitride, silicon nitride oxide, and silicon nitride.
5. The semiconductor device according to claim 1,
wherein the first insulator is in direct contact with the second insulator.
6. A semiconductor device comprising:
a first transistor including silicon;
a first insulator over the first transistor, the first insulator including silicon;
a second insulator over the first insulator, the second insulator including aluminum oxide;
a plug embedded in the first insulator and the second insulator;
a wiring over the plug; and
a second transistor including an oxide semiconductor over the wiring,
wherein the first transistor and the second transistor are electrically connected to each other through the wiring and the plug, and wherein the plug includes at least one of a tantalum nitride layer, a tantalum layer, and a titanium nitride layer.
7. The semiconductor device according to claim 6,
wherein the wiring has a structure in which a second tantalum nitride layer and a second tantalum layer are stacked or a second titanium nitride layer and a third tantalum layer are stacked.
8. The semiconductor device according to claim 6,
wherein the plug has a structure in which the tantalum nitride layer and the tantalum layer are stacked or the titanium nitride layer and the tantalum layer are stacked.
9. The semiconductor device according to claim 6,
wherein the first insulator includes at least one of silicon oxide, silicon oxynitride, silicon nitride oxide, and silicon nitride.
10. The semiconductor device according to claim 6,
wherein the first insulator is in direct contact with the second insulator.
11. A semiconductor device comprising:
a first transistor including silicon;
a first insulator over the first transistor, the first insulator including silicon;
a second insulator on and in contact with the first insulator, the second insulator including aluminum oxide;
a plug embedded in the first insulator and the second insulator;
a conductor over the plug; and
a second transistor including an oxide semiconductor over the conductor,
wherein the first transistor and the second transistor are electrically connected to each other through the conductor and the plug.
12. The semiconductor device according to claim 11,
wherein the conductor has a structure in which a tantalum nitride layer and a tantalum layer are stacked or a titanium nitride layer and a tantalum layer are stacked.

13. The semiconductor device according to claim 11, wherein the plug has a structure in which a tantalum nitride layer and a tantalum layer are stacked or a titanium nitride layer and a tantalum layer are stacked.

14. The semiconductor device according to claim 11, wherein the first insulator includes at least one of silicon oxide, silicon oxynitride, silicon nitride oxide, and silicon nitride.

* * * * *